(12) United States Patent
Or-Bach et al.

(10) Patent No.: US 11,621,249 B2
(45) Date of Patent: Apr. 4, 2023

(54) 3D SEMICONDUCTOR DEVICE AND STRUCTURE

(71) Applicant: Monolithic 3D Inc., Klamath Falls, OR (US)

(72) Inventors: Zvi Or-Bach, Haifa (IL); Jin-Woo Han, San Jose, CA (US); Brian Cronquist, Klamath Falls, OR (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

(21) Appl. No.: 17/396,646

(22) Filed: Aug. 6, 2021

(65) Prior Publication Data

US 2021/0375829 A1 Dec. 2, 2021

Related U.S. Application Data

(63) Continuation-in-part of application No. 16/558,304, filed on Sep. 2, 2019, now Pat. No. 11,121,121.

(60) Provisional application No. 62/824,288, filed on Mar. 26, 2019, provisional application No. 62/770,751, filed on Nov. 22, 2018, provisional application No. 62/767,490, filed on Nov. 14, 2018, provisional application No. 62/733,005, filed on Sep. 18, 2018, provisional application No. 62/726,969, filed on Sep. 4, 2018.

(51) Int. Cl.
| | | |
|---|---|---|
| *H01L 25/065* | (2023.01) | |
| *H01L 25/18* | (2023.01) | |
| *H01L 23/00* | (2006.01) | |
| *H01L 23/473* | (2006.01) | |
| *H01L 23/66* | (2006.01) | |
| *H01L 25/00* | (2006.01) | |

(52) U.S. Cl.
CPC ........ *H01L 25/0657* (2013.01); *H01L 23/473* (2013.01); *H01L 23/66* (2013.01); *H01L 24/08* (2013.01); *H01L 25/18* (2013.01); *H01L 25/50* (2013.01); *H01L 2223/6627* (2013.01); *H01L 2223/6677* (2013.01); *H01L 2224/08145* (2013.01); *H01L 2225/06589* (2013.01); *H01L 2924/1431* (2013.01); *H01L 2924/1436* (2013.01); *H01L 2924/1443* (2013.01)

(58) Field of Classification Search
CPC ..... H01L 25/0657; H01L 25/18; H01L 25/50; H01L 23/473; H01L 23/66; H01L 24/08
See application file for complete search history.

(56) References Cited

U.S. PATENT DOCUMENTS

| | | | |
|---|---|---|---|
| 8,803,206 B1* | 8/2014 | Or-Bach | H01L 23/367 257/278 |
| 2017/0186728 A1* | 6/2017 | Chainer | H01L 23/473 |
| 2017/0303431 A1* | 10/2017 | Kim | H01L 23/473 |
| 2020/0020635 A1* | 1/2020 | Chang | H01L 24/80 |

* cited by examiner

*Primary Examiner* — Christine A Enad
(74) *Attorney, Agent, or Firm* — PatentPC; Bao Tran

(57) ABSTRACT

A 3D semiconductor device, the device including: a first level; and a second level, where the first level includes single crystal silicon and a plurality of logic circuits, where the second level is disposed above the first level and includes a plurality of arrays of memory cells, where the single crystal silicon includes an area, and where the area is greater than 1,000 mm².

19 Claims, 33 Drawing Sheets

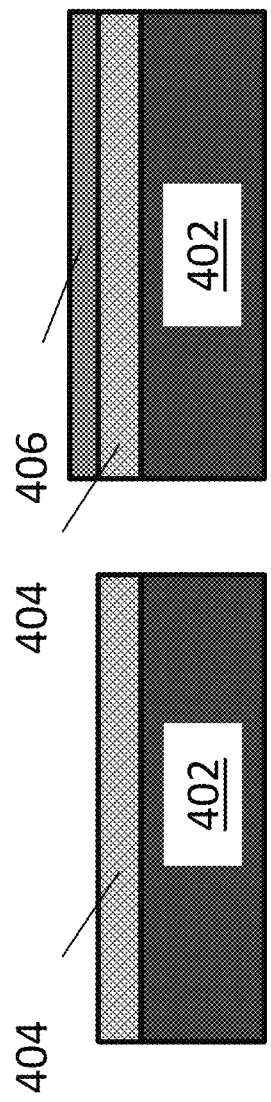
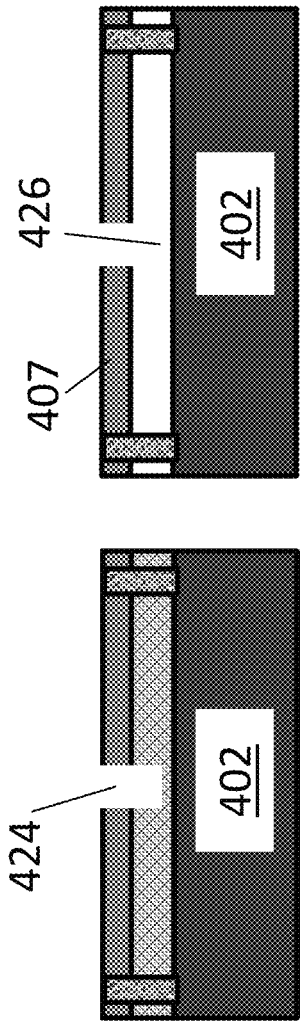
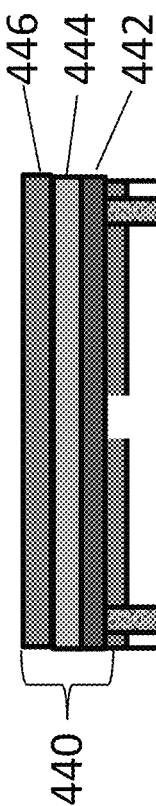
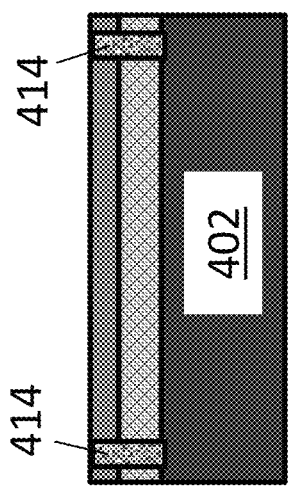
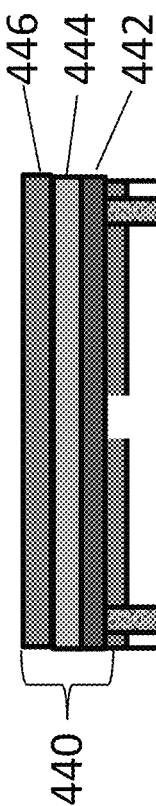
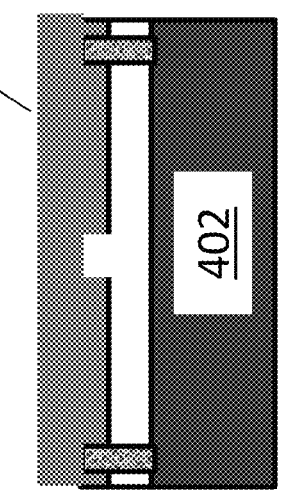
Fig. 4A Fig. 4B Fig. 4C Fig. 4D Fig. 4E Fig. 4F Fig. 4G Fig. 4H

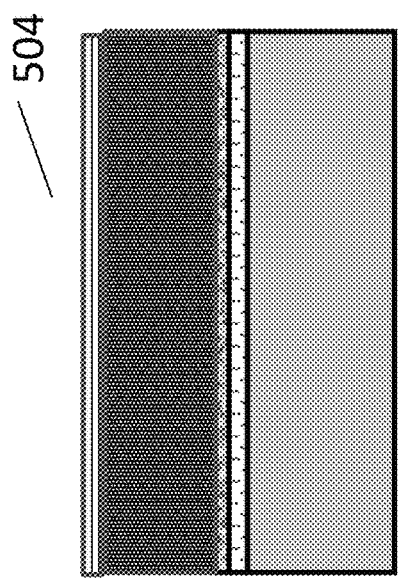
Fig. 5B
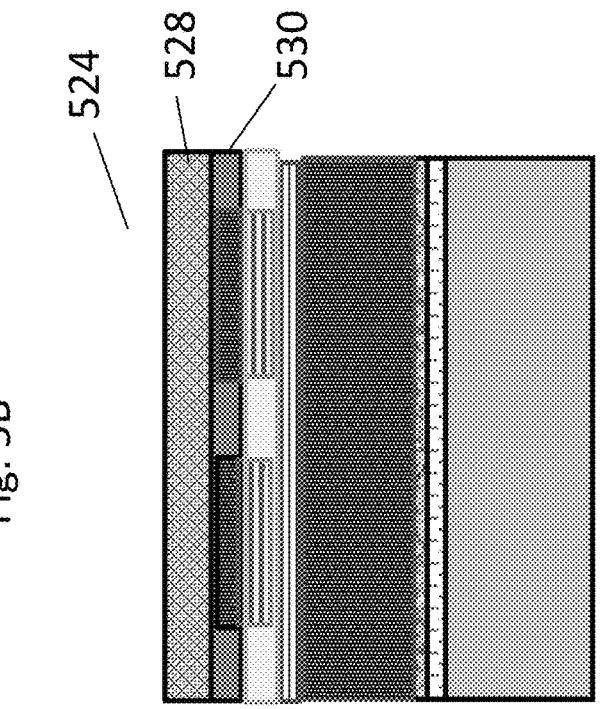
Fig. 5D
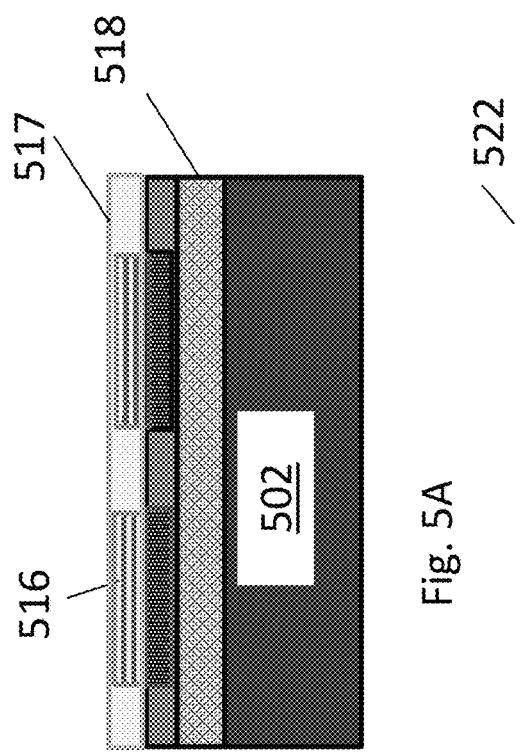
Fig. 5A
Fig. 5C

*Side Cut-Views Y-Z Plane*
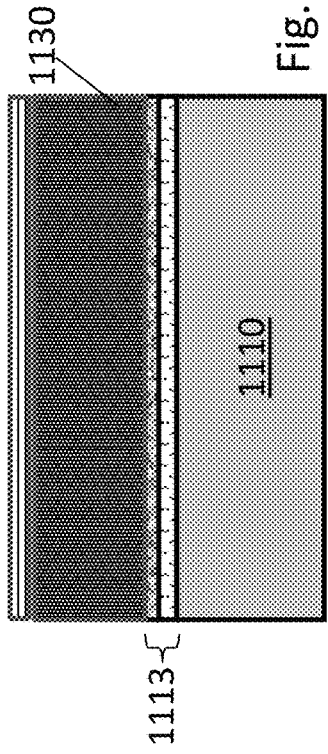
Fig. 7
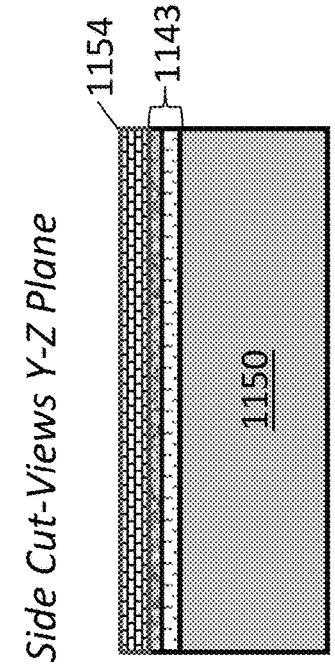
Fig. 9
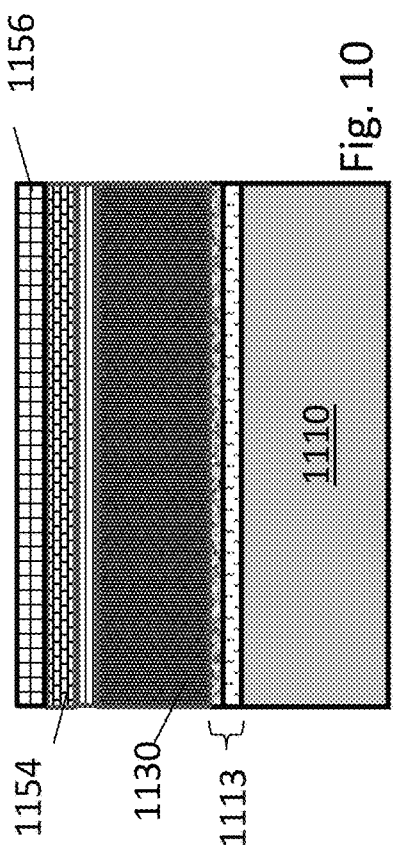
Fig. 8
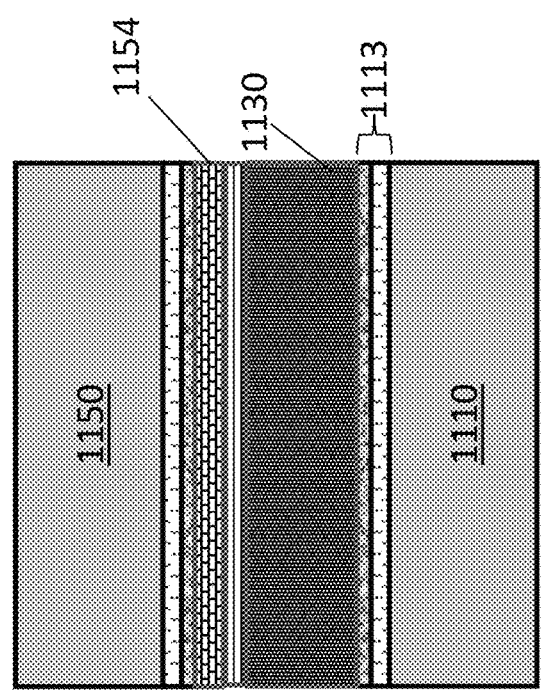
Fig. 10
Fig. 11

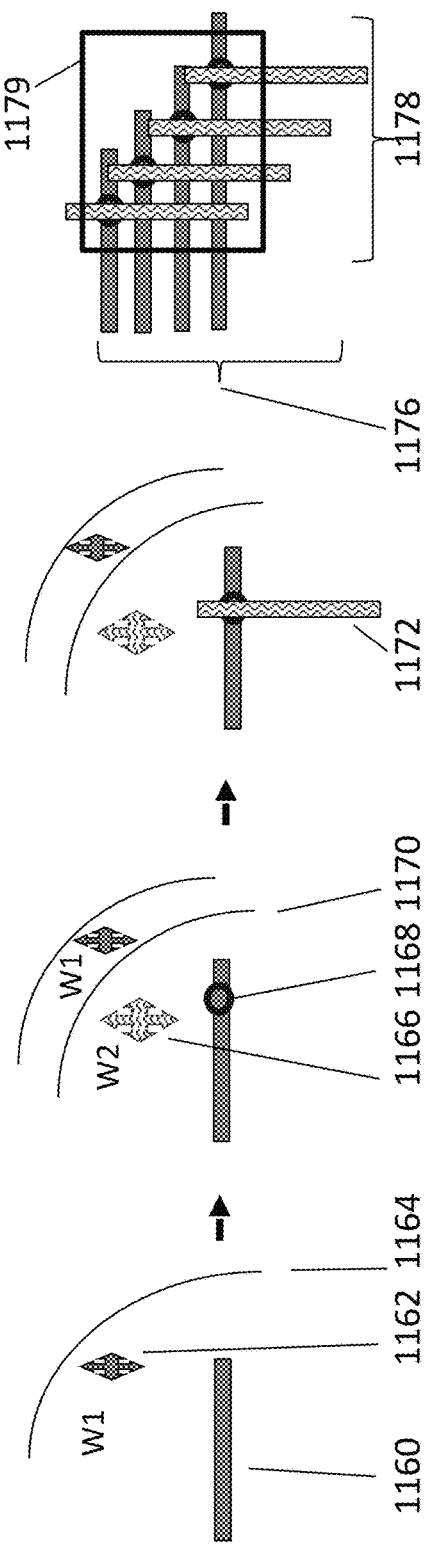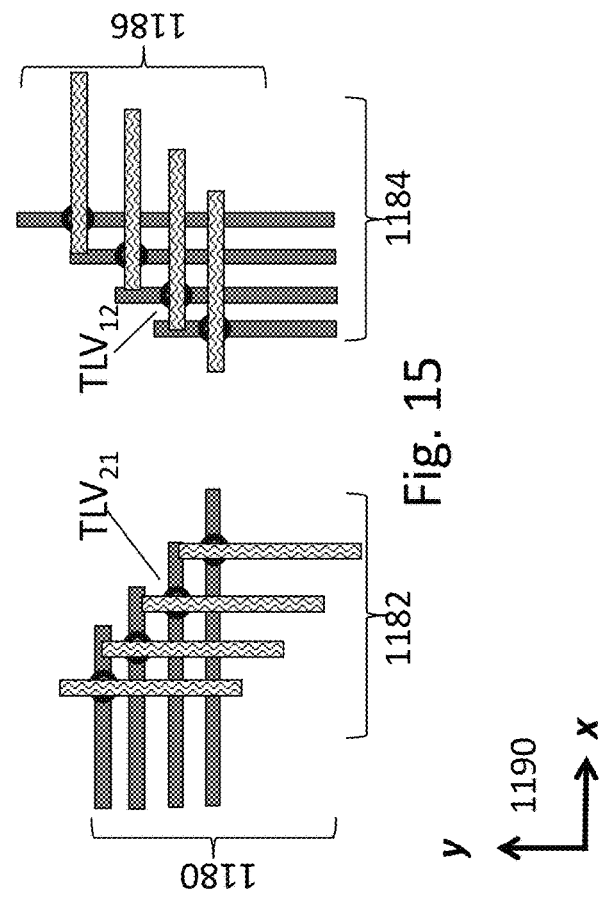

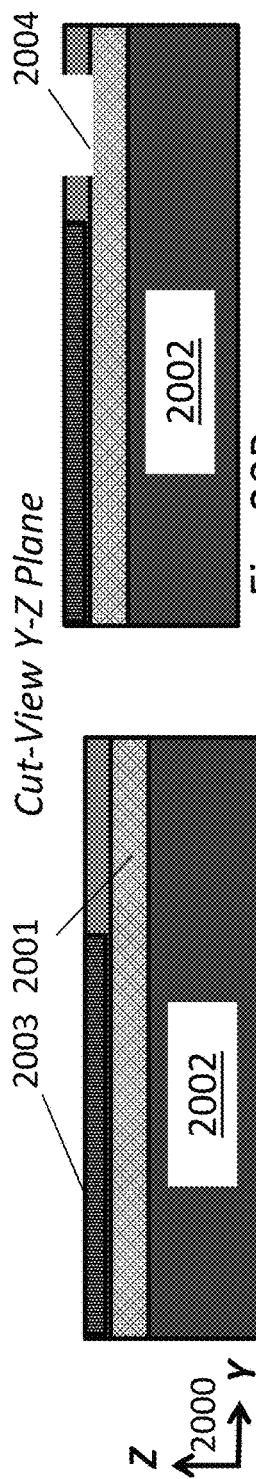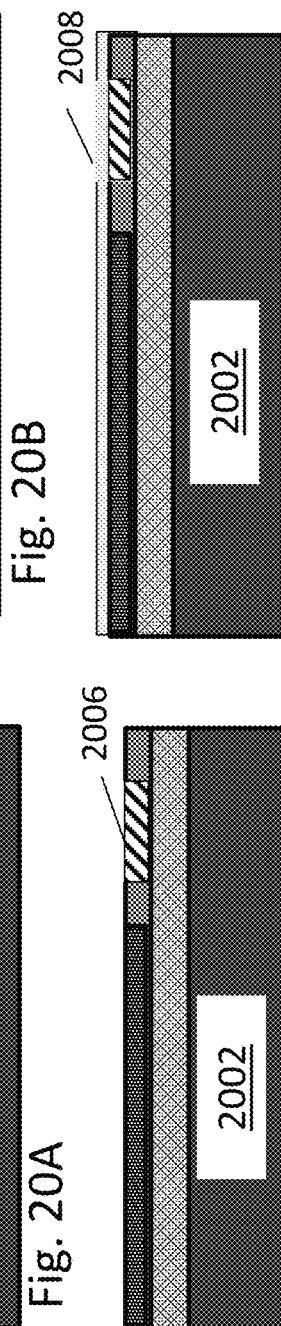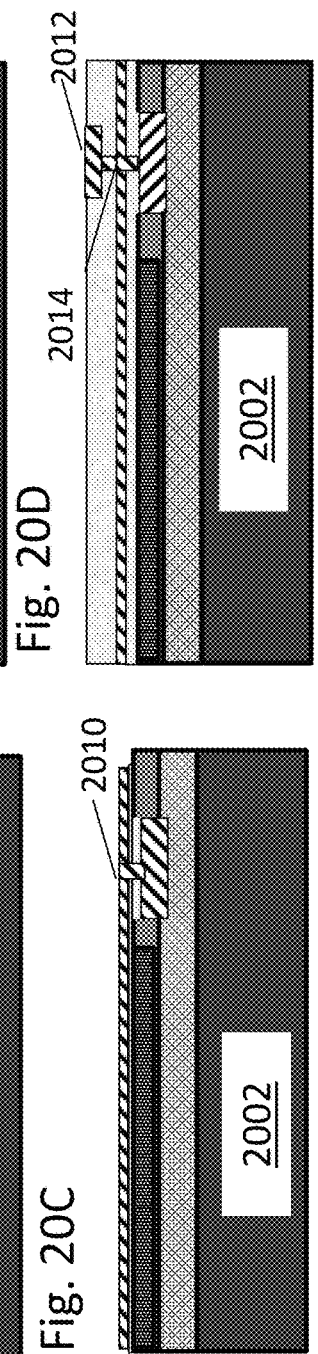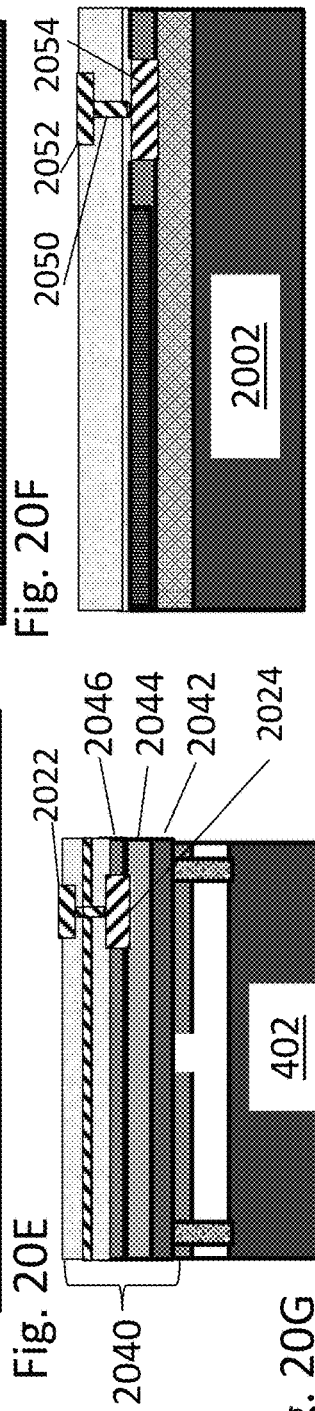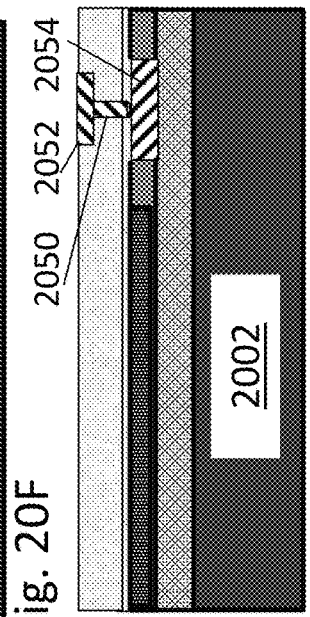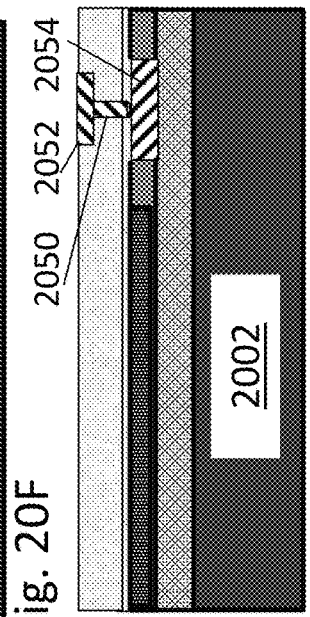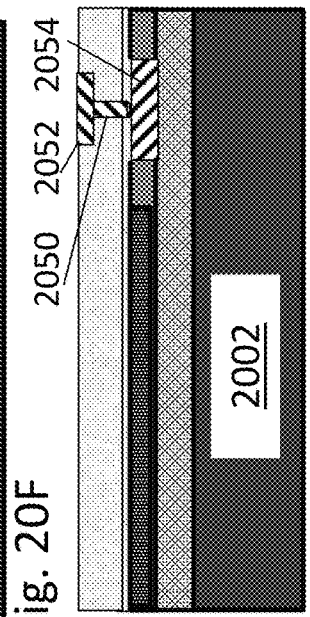

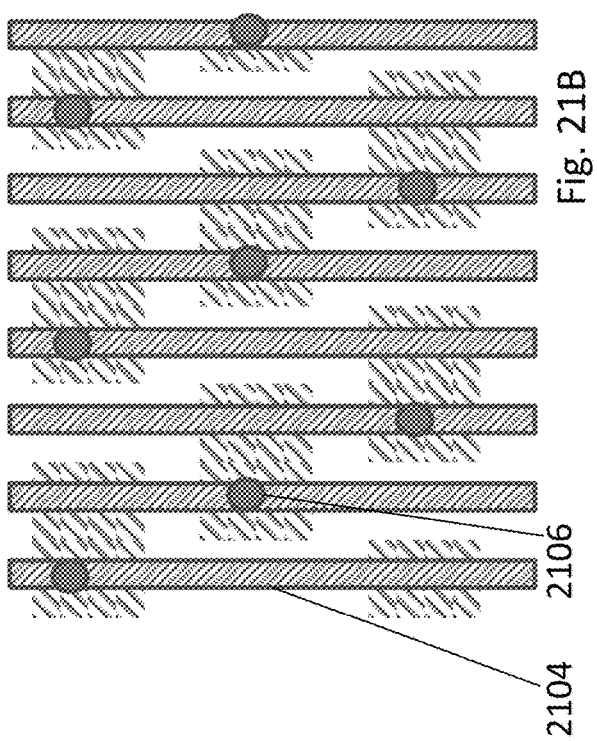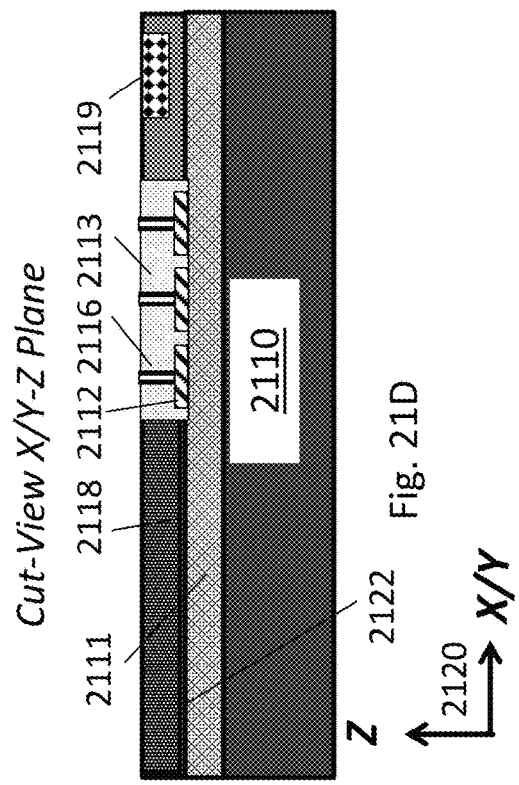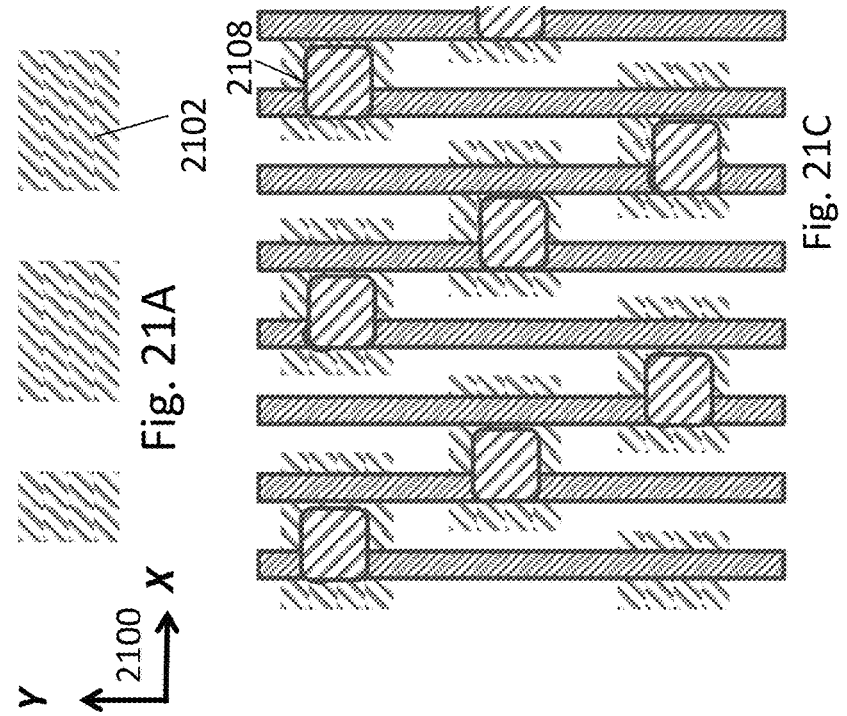

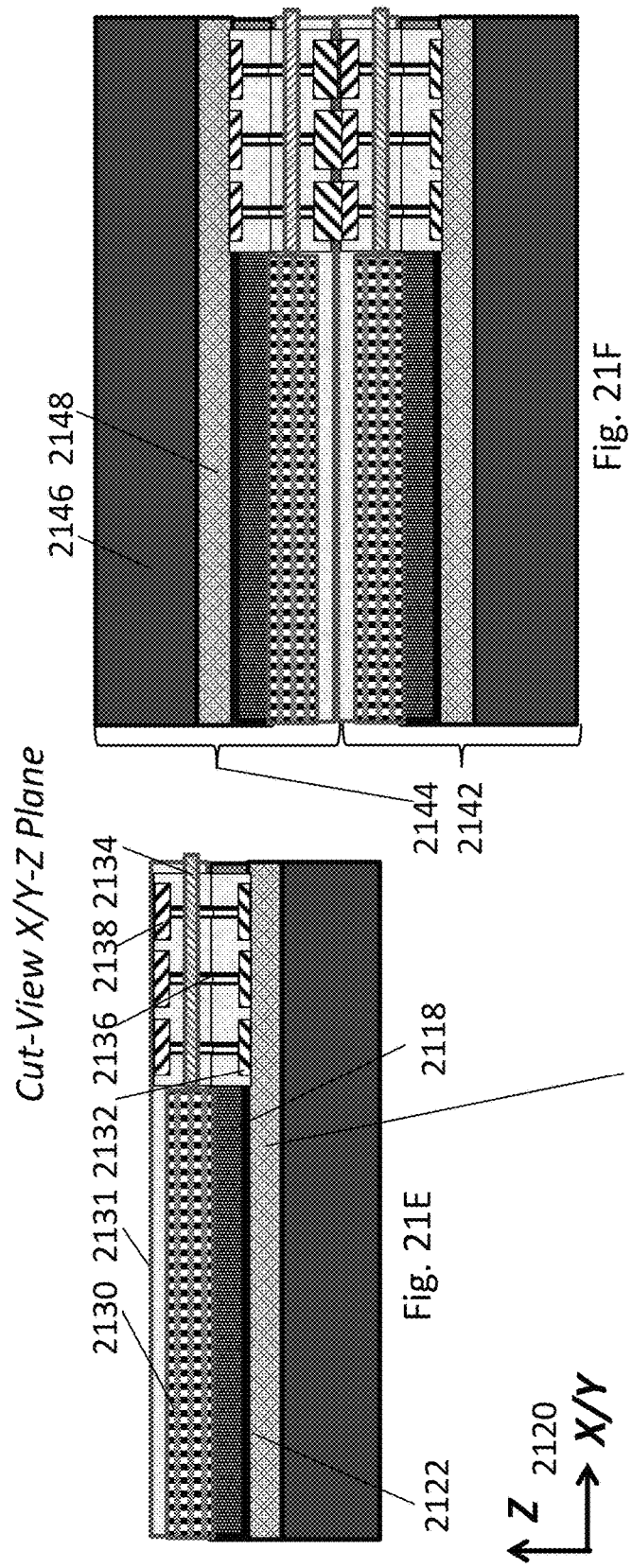
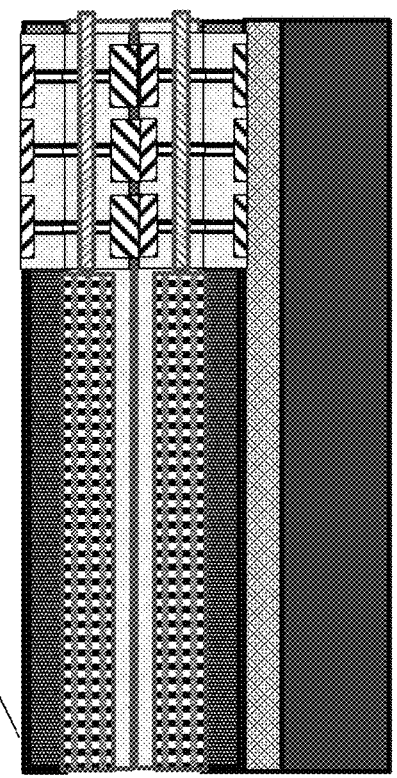
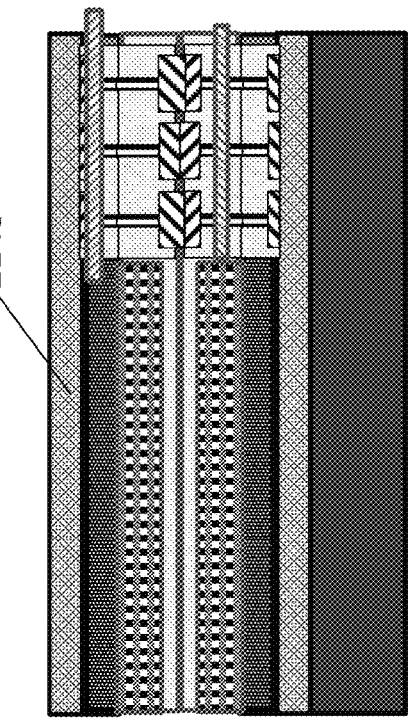
Fig. 21E, Fig. 21F, Fig. 21G, Fig. 21H
Cut-View X/Y-Z Plane

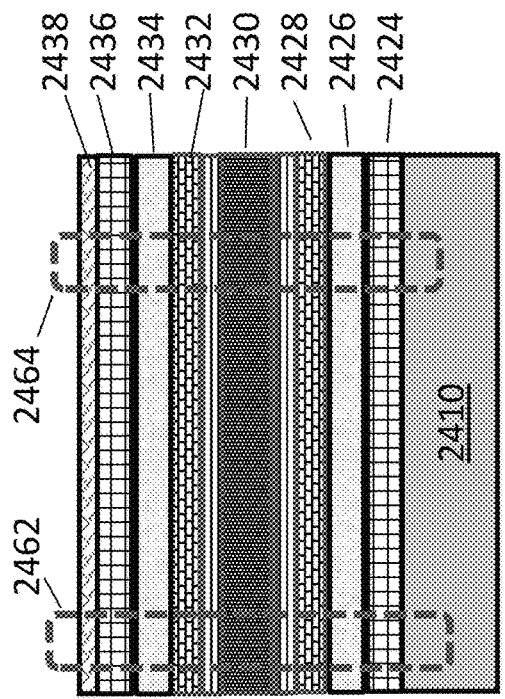
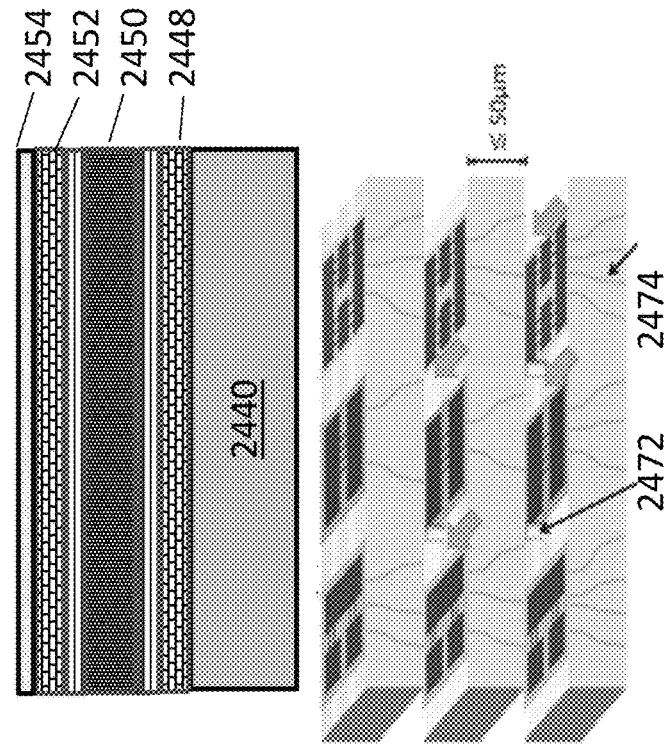
Fig. 24A
Fig. 24B
Fig. 24C
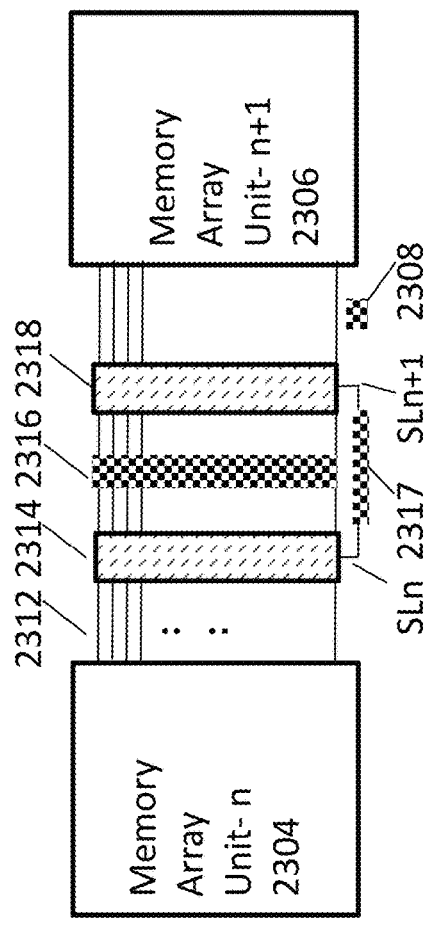
Fig. 23A
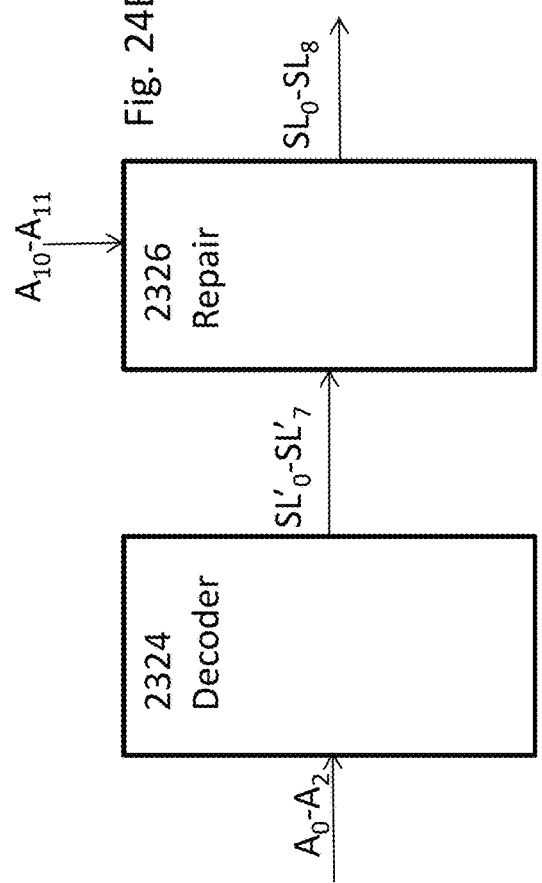
Fig. 23B

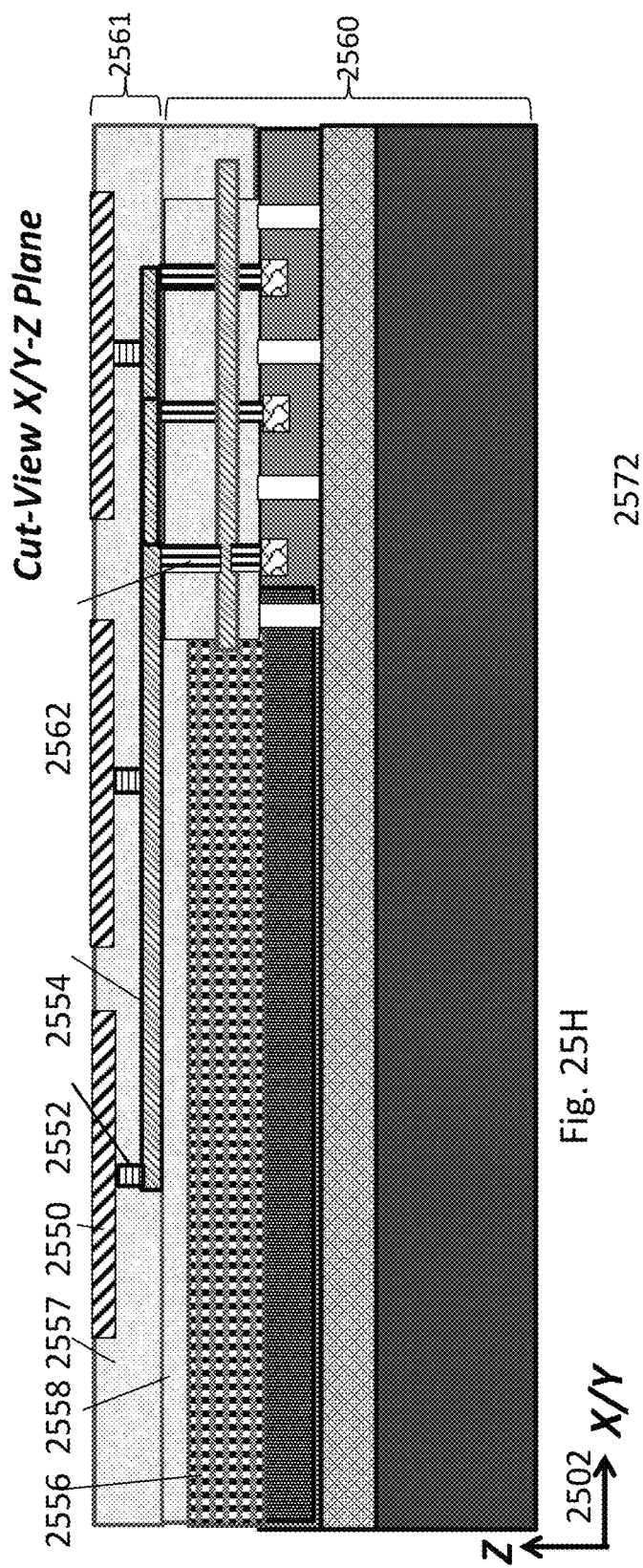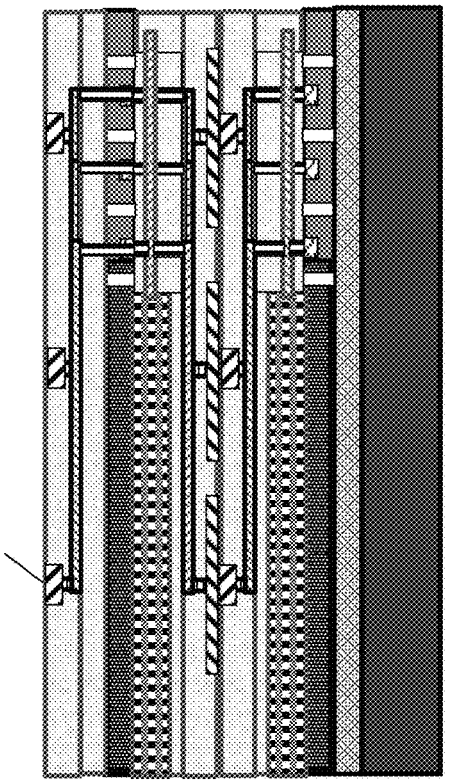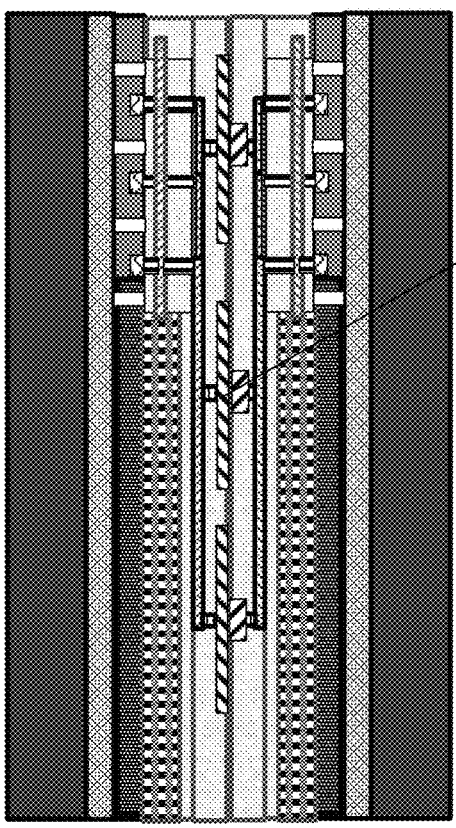
Fig. 25H
Fig. 25J
Fig. 25I

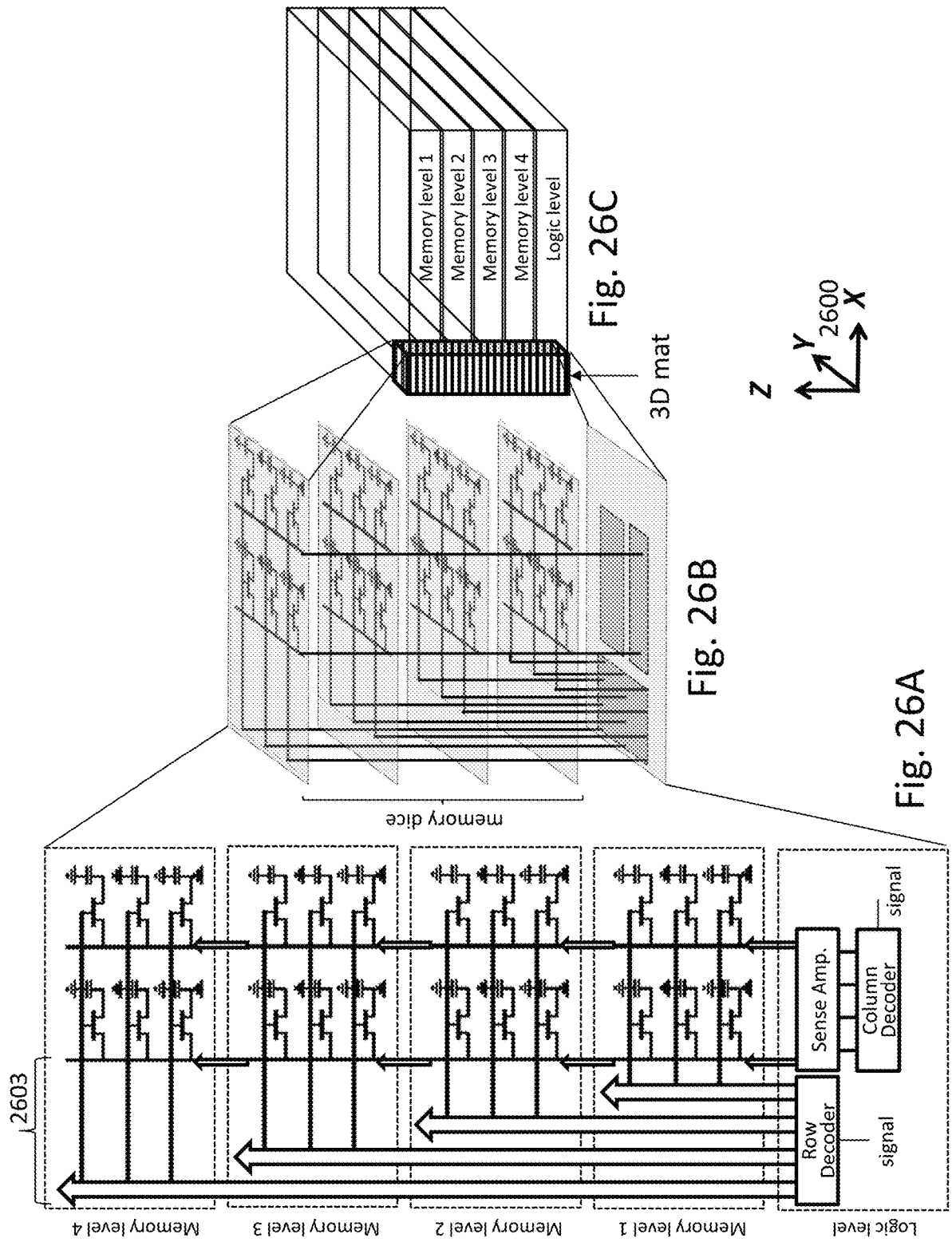

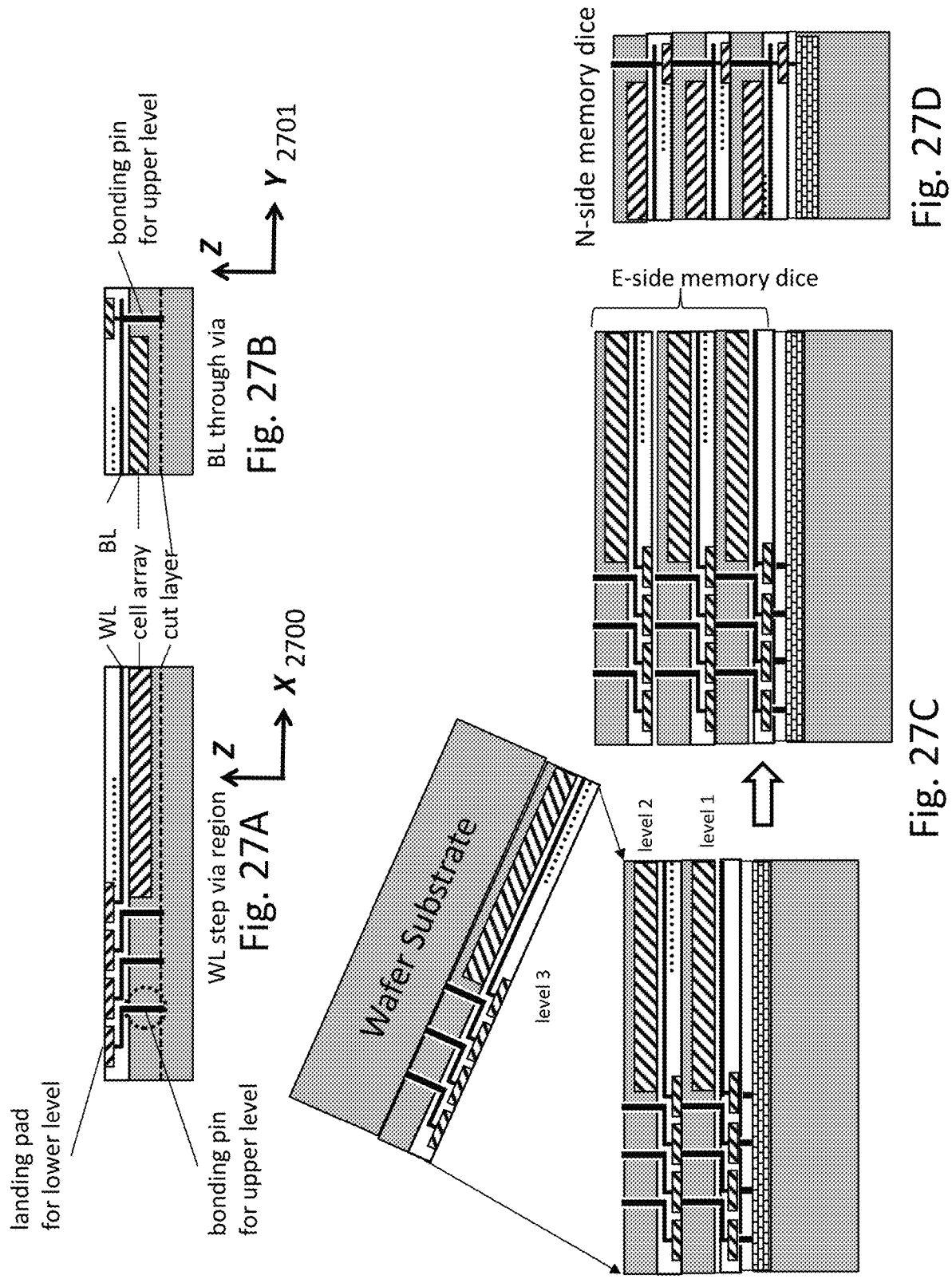

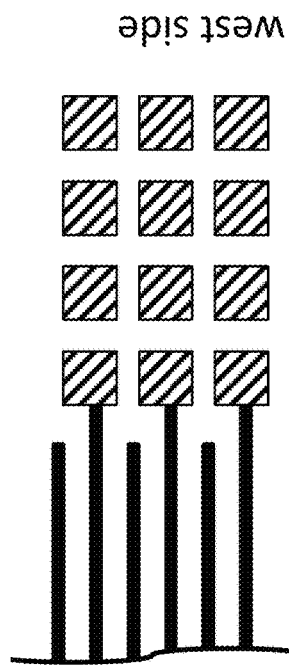
Fig. 28A
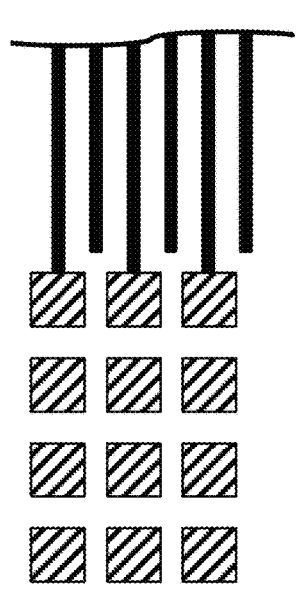
Fig. 28B
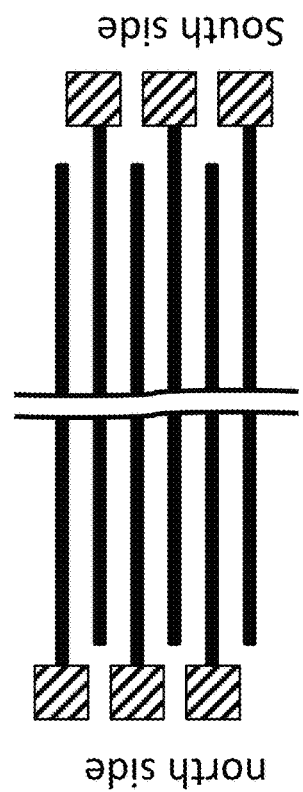
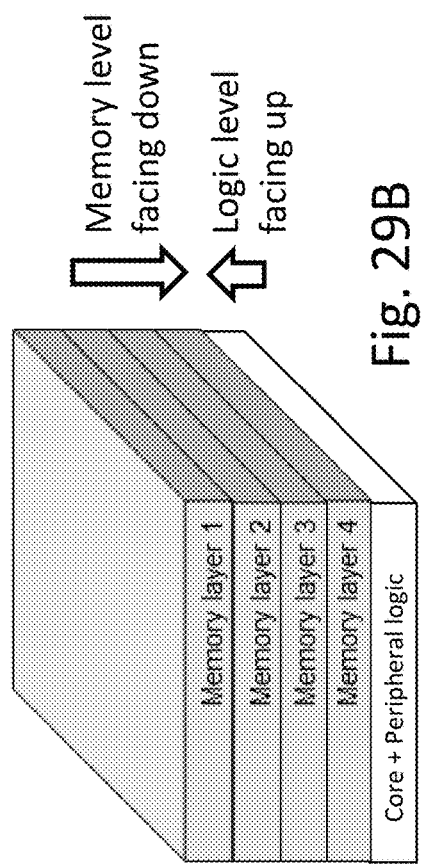
Fig. 29B
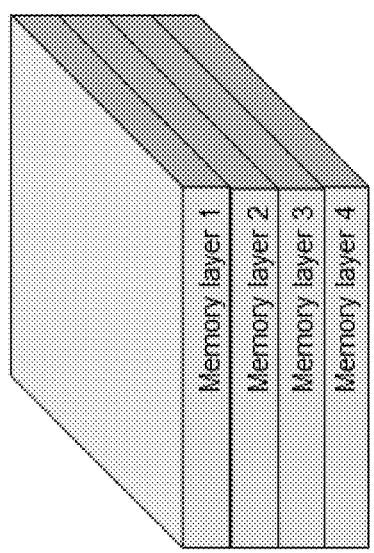
Fig. 29A

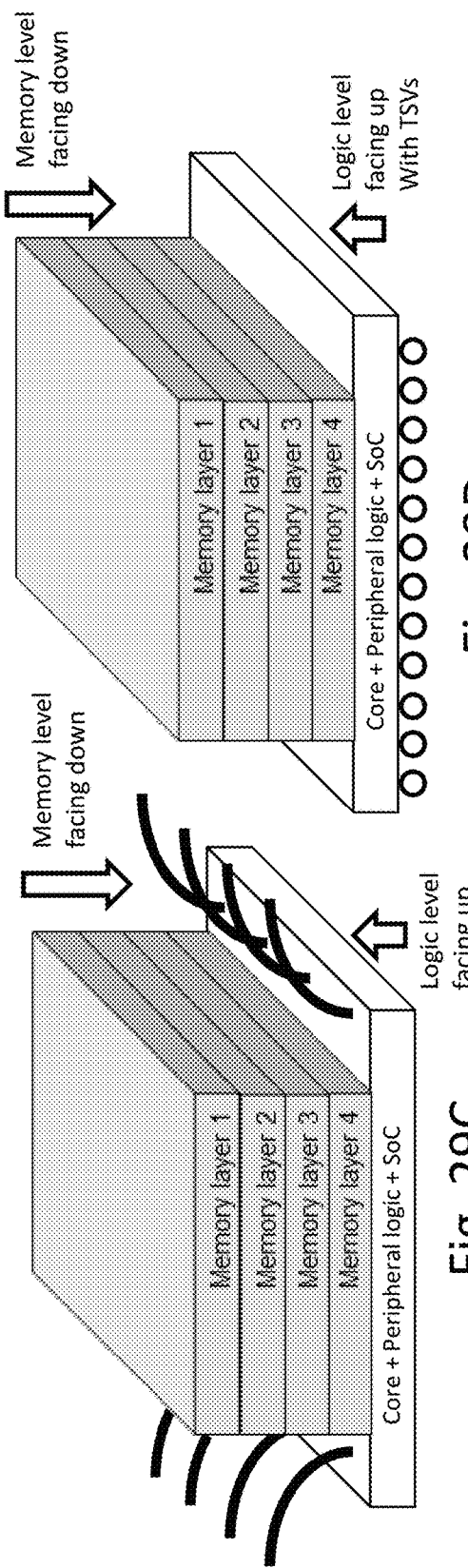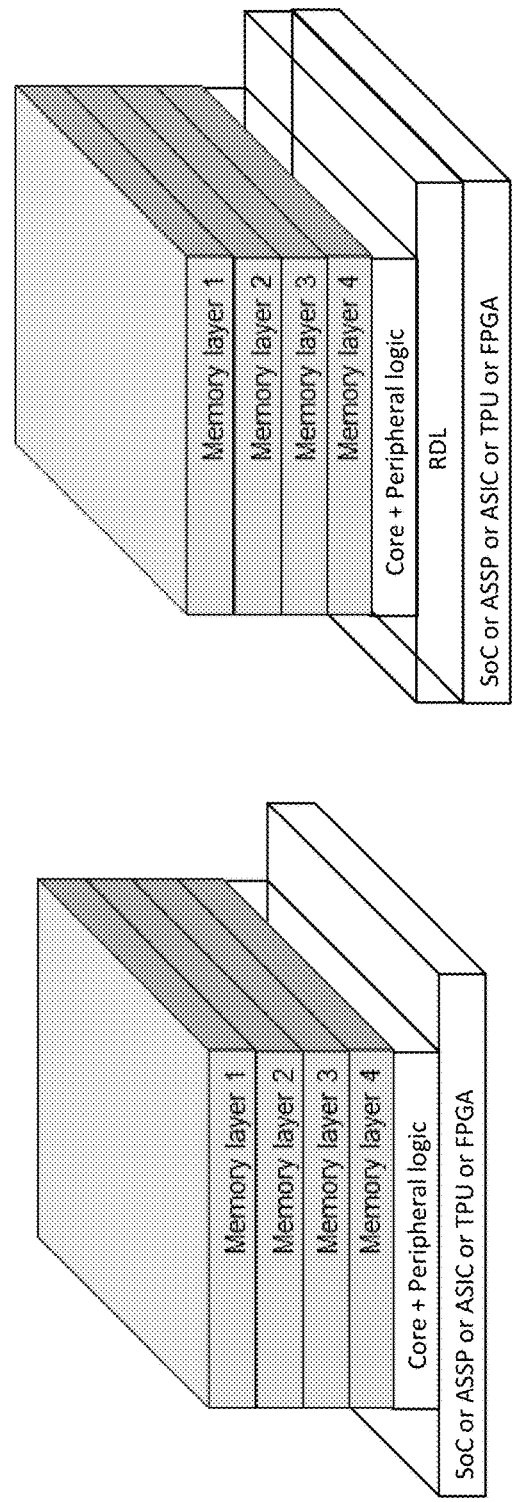

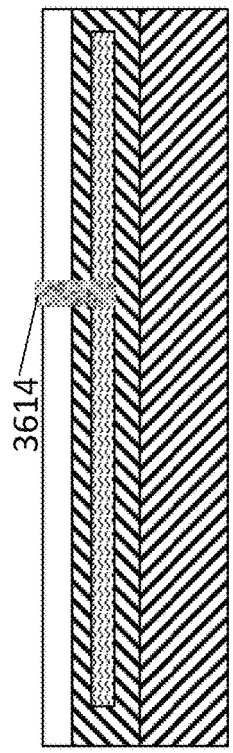
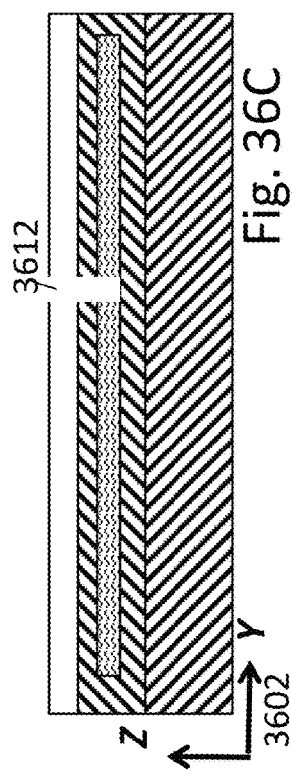
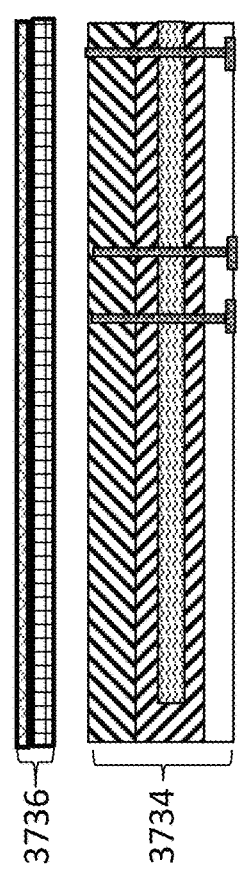
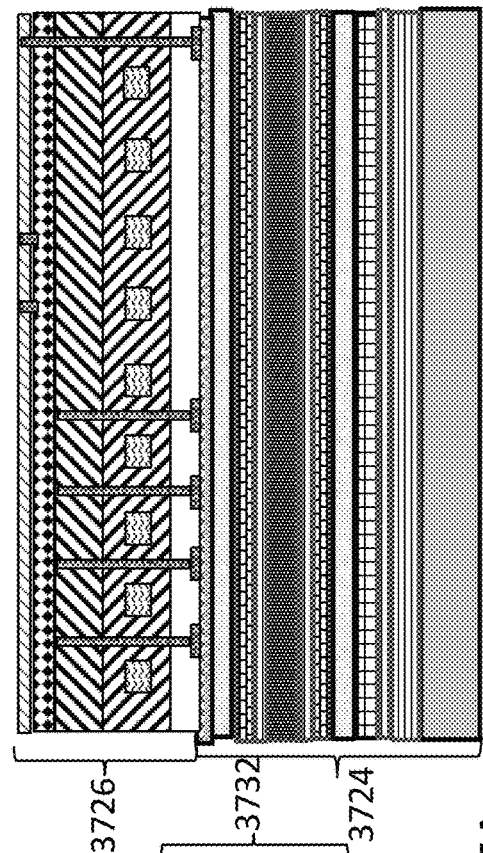

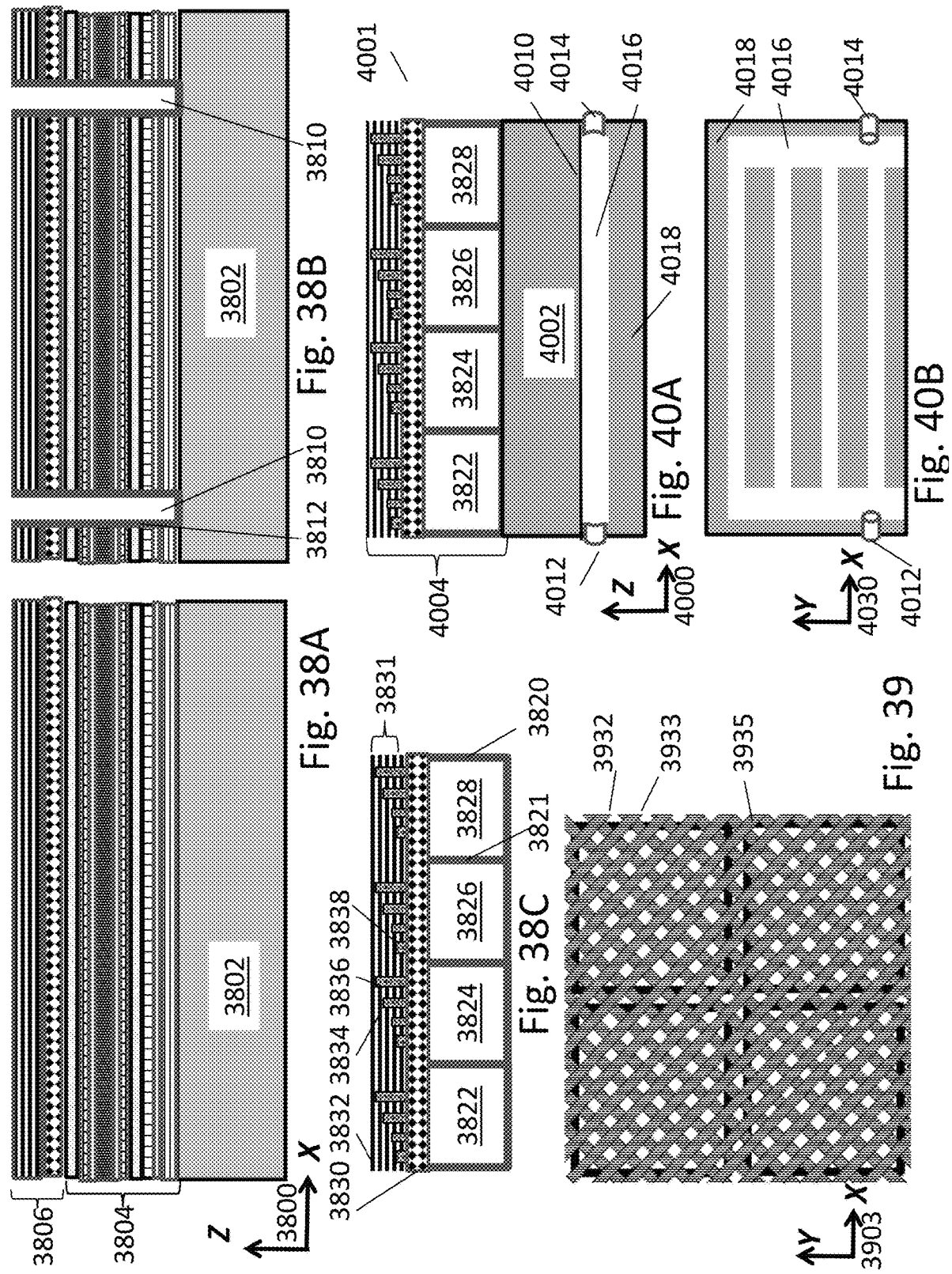

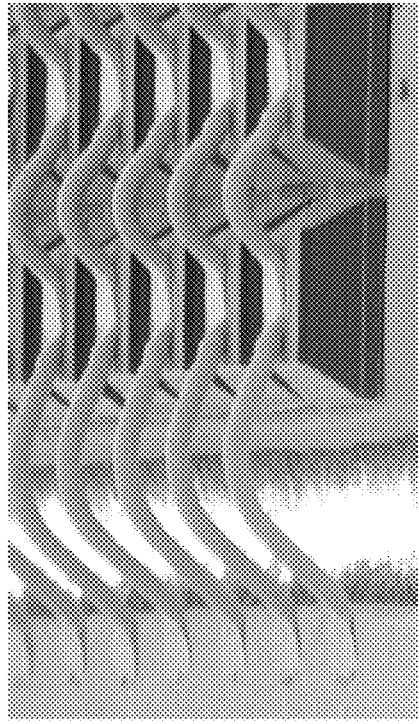
Fig. 41A
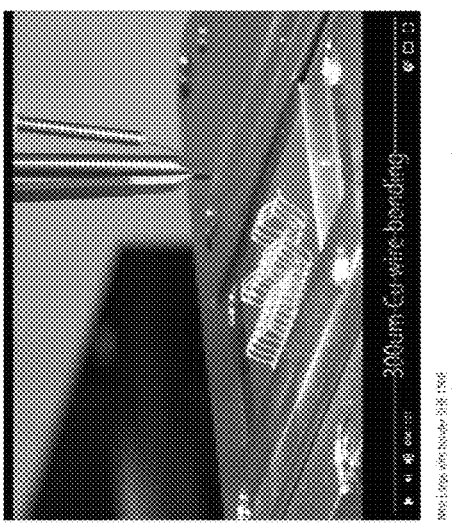
Fig. 41B
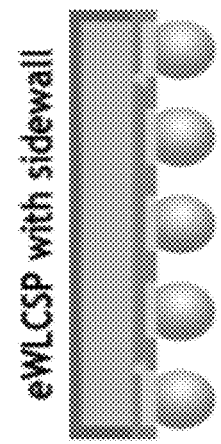
Standard WLCSP
Source: STATS ChipPAC
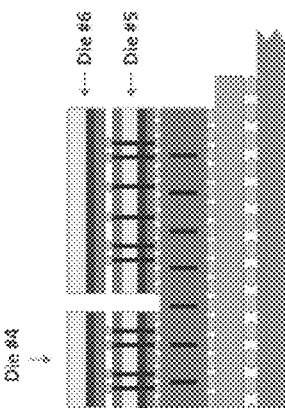
eWLCSP with sidewall
Fig. 41D
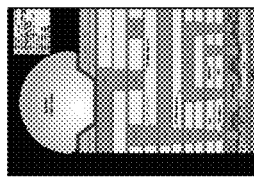
Fig. 41C
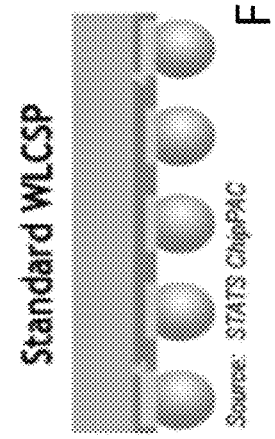
Fig. 41E
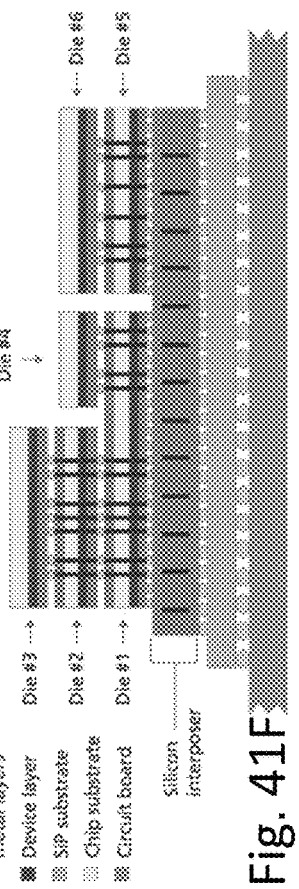
Fig. 41F

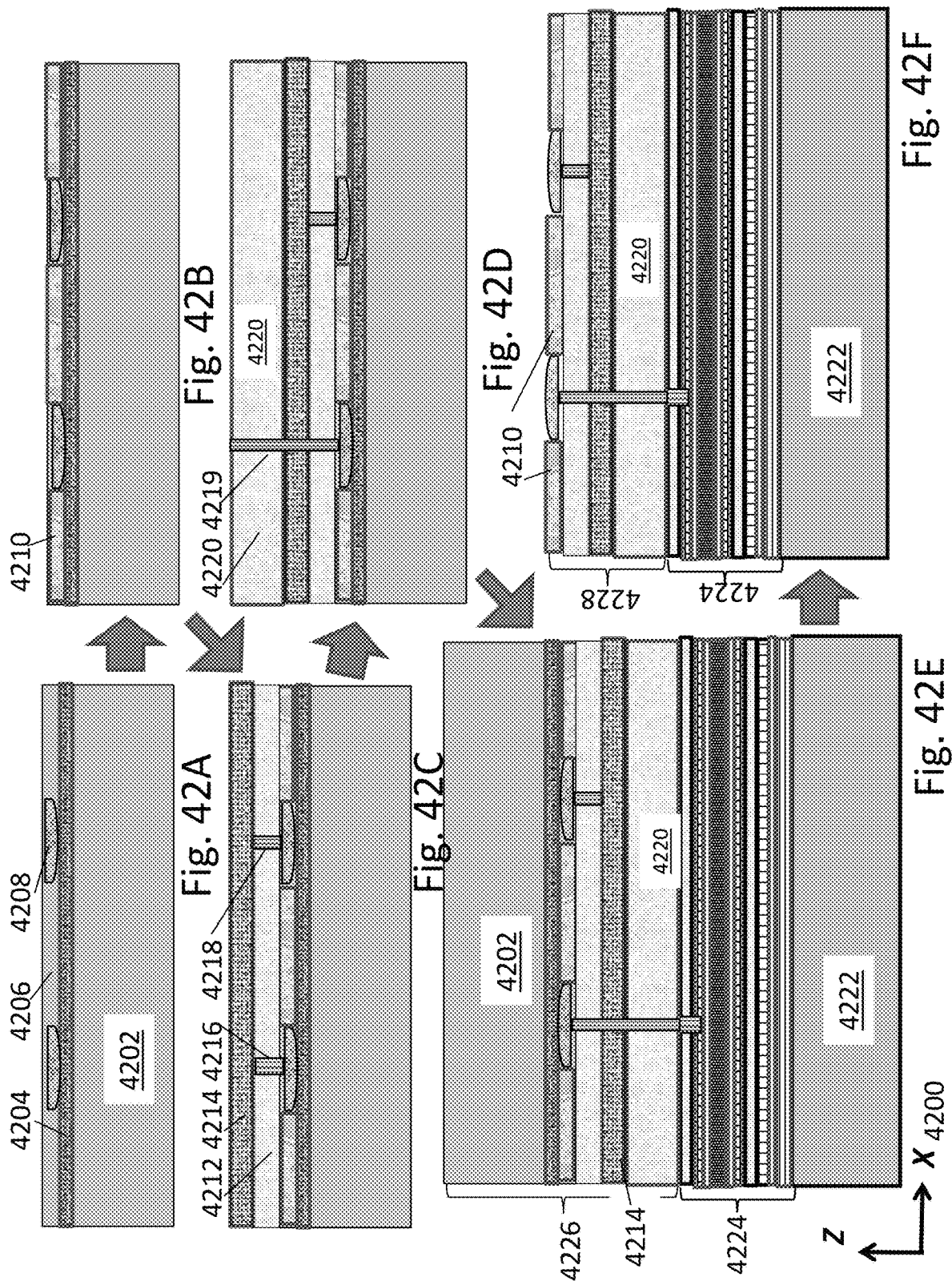

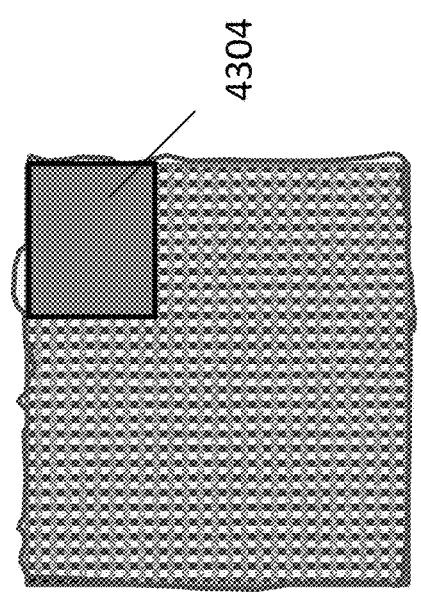
Fig. 43A
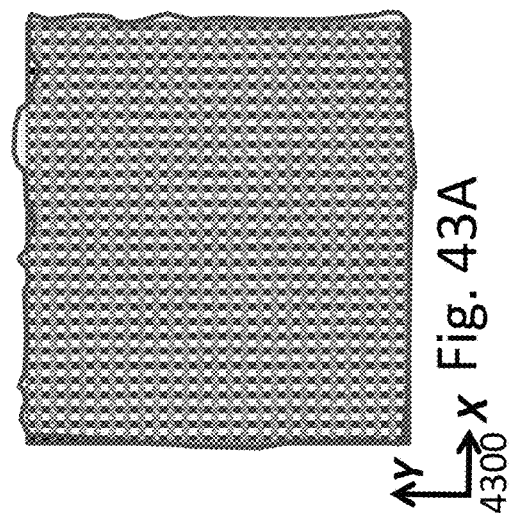
Fig. 43B
Fig. 43C
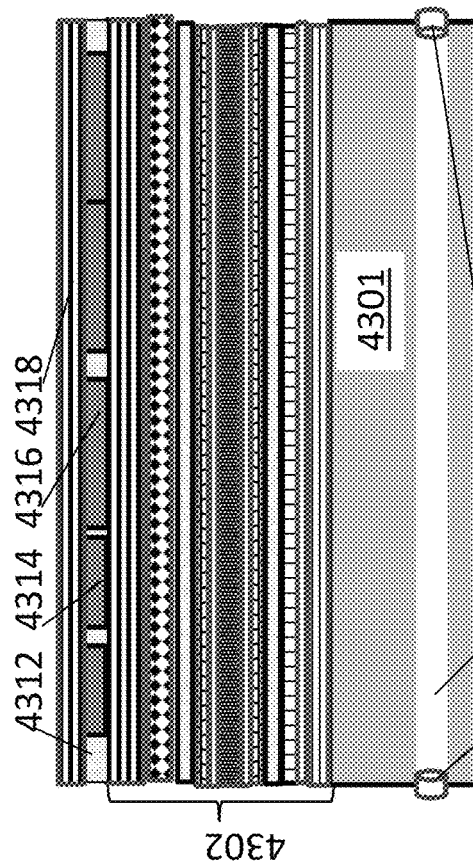
Fig. 43E
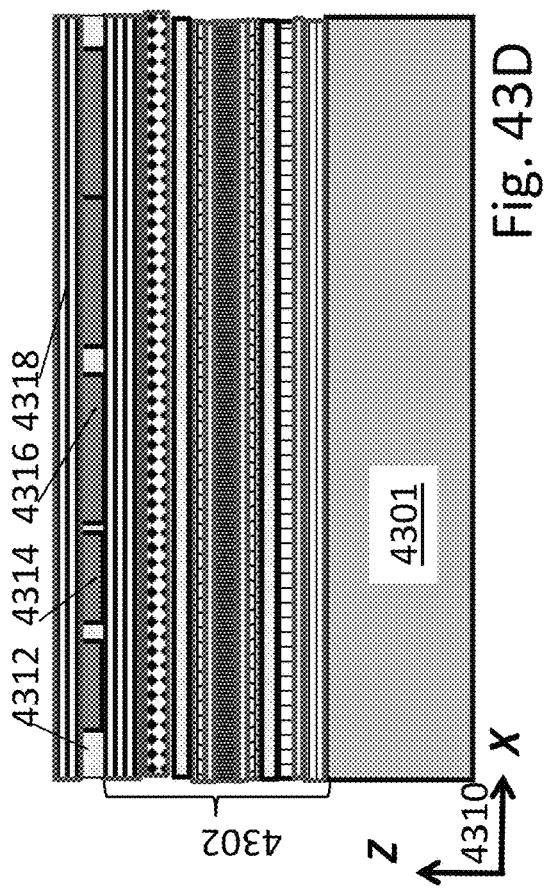
Fig. 43D

3D SEMICONDUCTOR DEVICE AND STRUCTURE

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There am two main classes of components in Complementary Metal Oxide Semiconductor (CMOS) ICs, namely transistors and wires. With "scaling", transistor performance and density typically improve and this has contributed to the previously-mentioned increases in IC performance and functionality.

However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low and wire.

There are many techniques to construct 3D stacked integrated circuits or chips including:

Through-silicon via (TSV) technology: Multiple layers of dice are constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches am described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016; and pending U.S. patent application Publications and applications, Ser. Nos. 14/642,724, 15/150,395, 15/173,686, 16/337,665, 16/558,304, 16/649,660, 16/836,659, 17/151,867, 62/651,722; 62/681,249, 62/713,345, 62/770,751, 62/952,222, 62/824,288, 63/075,067, 63/091,307, 63/115,000, 2020/0013791, 16/558,304; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798). The entire contents of the foregoing patents, publications, and applications am incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, and 10,943,934. The entire contents of the foregoing patents, publications, and applications am incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods.

Important aspects of 3D IC are technologies that allow layer transfer. These technologies include technologies that support reuse of the donor wafer, and technologies that support fabrication of active devices on the transferred layer to be transferred with it.

In one aspect, a 3D semiconductor device, the device including: a first level; and a second level, where the first level includes single crystal silicon and a plurality of logic circuits, where the second level is disposed above the first level and includes a plurality of arrays of memory cells, where the single crystal silicon includes an area, and where the area is greater than 1,000 $mm^2$.

In another aspect, a 3D semiconductor device, the device including: a first level; and a second level, where the first level includes single crystal silicon and a plurality of logic circuits, where the second level is disposed above the first level and includes a plurality of RF circuits, where the single crystal silicon includes an area, and where the area is greater than 1,000 $mm^2$.

In another aspect, a 3D semiconductor device, the device including: a first level; and a second level, where the first level includes single crystal silicon and a plurality of logic circuits, where the second level is disposed above the first level and includes a plurality of transistors, where the single crystal silicon includes channels adapted for fluid cooling, where the single crystal silicon includes an area, and where the area is greater than 1,000 $mm^2$.

BRIEF DESCRIPTION OF THE DRAWINGS

Various embodiments of the invention will be understood and appreciated more fully from at least the following detailed description, taken in conjunction with the drawings in which:

FIGS. 4A-4H are example illustrations of an alternative donor wafer process flow;

FIGS. 5A-5D are example illustrations of an additional alternative donor wafer process flow;

FIGS. 7-10 are example illustrations of a "Lego" scheme with 3DNOR;

FIG. 11 is an example illustration of an isolation structure to keep the logic heat away from the memory array;

FIGS. 12-18 are example illustrations of alignment techniques and structures;

FIGS. 20A-20F are example illustrations of the formation of multiple stratum integrated into a 3D system via 3D integration with minimum per strata processing;

FIG. 20G is an example illustration of a connectivity technique adapted to die level operation;

FIG. 20H is an example illustration of a through strata via structure;

FIGS. 21A-21H are example illustrations of a control line arrangement for memory integration of the 3D system of FIGS. 19 and 20;

FIGS. 23A-23B are example illustrations of two-layer select and select schemes;

FIG. 24A is an example illustration of an alternative 3D computer system;

FIG. 24B is an example illustration of a generic 3D memory structure "G3DM";

FIG. 24C is an example illustration of 3D structure with active thermal cooling;

FIGS. 25H-25J are example illustrations of over the array connectivity structures;

FIGS. 26A-C are example illustrations of 3D memory stacks;

FIGS. 27A-D are additional example illustrations of 3D memory stacks;

FIGS. 28A-B are more additional example illustrations of 3D memory stacks;

FIGS. 29A-F are still more additional example illustrations of 3D memory stacks;

FIGS. 36A-36E are example illustrations of customization of optical waveguides;

FIGS. 37A-37B are example illustrations of an optical interconnect structure prepared for transfer and transferring to a 3D IC;

FIGS. 38A-38C are example illustrations of cut views of a region of a 3D system of a multi-cores continuous wafer fabric;

FIG. 39 is an example illustration of a top view of an interconnect fabric called the X architecture;

FIGS. 40A-40B are example illustrations of microchannel cooling of a 3D IC system;

FIGS. 41A-41B are example illustrations of a device with wire bonding stitching unit's pads with wide wire;

FIGS. 41C-41D are example illustrations of balls for connecting die(s) to an external source;

FIG. 41E is an example illustration of 3D heterogeneous integration;

FIG. 41F is an example illustration of 3D heterogeneous integration in which an end device is constructed by connecting multiple dies of different sizes using 3D integration techniques atop a full wafer;

FIGS. 42A-42F are example illustrations of a process flow overview of one option to reduce the substrate effects on the transmission lines which utilizes layer transfer techniques; and FIGS. 43A-43E are example illustrations of a process flow overview of mixed 3D integration which utilizes layer transfer techniques.

DETAILED DESCRIPTION

Figure 1A:
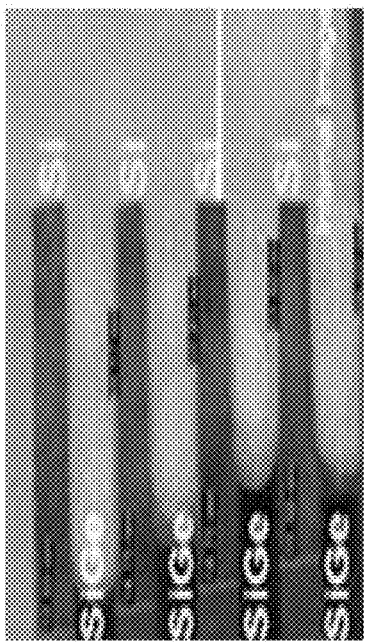
FIG. 1A is an example illustration of selective etch by Applied Material etcher.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by any appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

The use of layer transfer in the construction of a 3D IC based system could enable heterogeneous integration where each of strata may include one or more of MEMS sensor, image sensor, CMOS SoC, volatile memory such as DRAM and SRAM, persistent memory, and non-volatile memory such as flash and OTP. Such could include adding memory control circuits, also known as peripheral circuits, on top or below a memory array. The memory strata may contain only memory cells but not control logic, thus the control logic may be included on a separate stratum. Alternatively, the memory strata may contain memory cells and simple control logic where the control logic on that stratum may include at least one of decoder, buffer memory, sense amplifier. The circuits may include the charge pumps and high voltage transistors, which could be made on a strata using silicon transistors or other transistor types (such as SiGe, Ge, CNT, etc.) using a manufacturing process line that is different than the low voltage control circuit manufacturing process line. The analog circuits, such as for the sense amplifiers, and other sensitive linear circuits could also be processed independently and be transferred over to the 3D fabric. Such 3D construction could include "Smart Alignment" techniques presented in this invention or leverage the repeating nature of the memory array to reduce the impact of the wafer bonder misalignments on the effectiveness of the integration.

In patents such as, for example, U.S. patent application Ser. No. 15/173,395, layer transfer techniques called ELTRAN (epitaxial layer transfer) are presented and may be part of the formation process of a 3DIC. The ELTRAN technique utilizes an epitaxial process or processes over porous layers. Alternatively other epitaxial based structures could be formed to support layer transfer techniques by leveraging the etch selectivity of these epitaxial layers, such as the very high etch selectivity of SiGe vs. Silicon, and variations such as Silicon (single crystal or poly or amorphous), SiGe (mix of silicon and Germanium), P doped silicon, N doped silicon, etc. Alternately, these layer(s) could be combined with types of detachment processes, such as 'cold splitting,' for example the Siltectra stress polymer and low temperature shock treatment, to provide a thin layer transfer process.

Figure 1B:
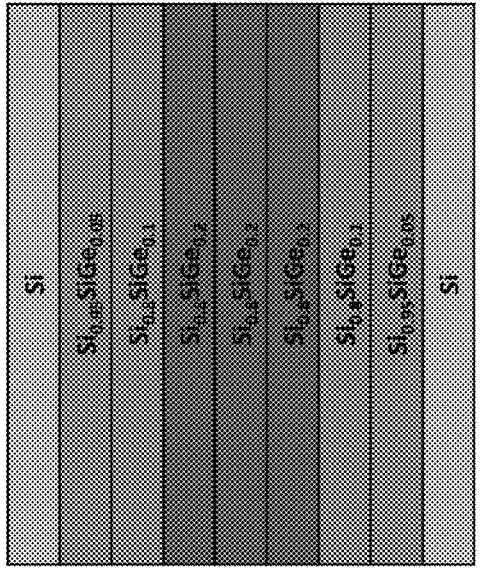
FIG. 1B is an example illustration of alternating Si and SiGe layers.

Recently it become a very attractive concept for processing gate all around horizontal transistors and has become the target flow for next generation devices such as the 5 nm technology node. Some of the work in respect to selective etching of SiGe vs. silicon has been presented in a paper by Jang-Gn Yun et al. titled: "Single-Crystalline Si Stacked Array (STAR) NAND Flash Memory" published in IEEE TRANSACTIONS ON ELECTRON DEVICES, VOL. 58, NO. 4, APRIL 2011, and a more recent work by K. Wostyn et al. titled "Selective Etch of Si and SiGe for Gate All-Around Device Architecture" published in ECS Transactions, 69 (8) 147-152 (2015), and by V. Destefanis et al. titled: "HCl Selective Etching of Si1-xGex versus Si for Silicon On Nothing and Multi Gate Devices" published in ECS Transactions, 16 (10) 427-438 (2008), all of the forgoing incorporated herein by reference. Since the SiGe over Si substrate process is becoming mature, this facilitates using a SiGe layer as a sacrificial layer for production worthy 3D layer transfer. FIG. 1A illustrates the high etch selectivity of SiGe vs. Silicon, which, in this example, could be formed using, for example, the Applied Material Selectra etch system. Alternatively, the selective etch may be made using a wet chemical etch. FIG. 1B illustrates a putative retrograde Ge composition with stack thickness as explained thoroughly later.

Figure 2A:
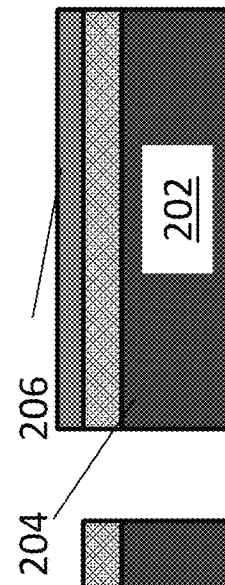
FIGS. 2A-2I are example illustrations of an alternative system process flow.
Figure 2B:
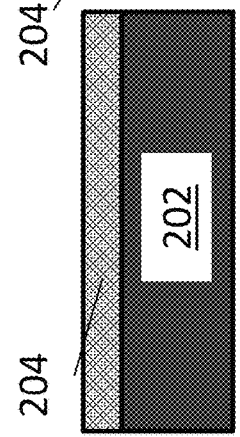

An exemplary layer transfer process could include the steps A-K, referencing the illustrations FIG. 2A-2I and FIG. 3A-3D:

A. As illustrated in FIGS. 2A and 2B, epi (the term 'epi' herein means epitaxial, as often used in the art) layer 204 such as SiGe may be formed on a donor wafer or reusable donor wafer-base substrate 202, for example, by an epitaxy processes. The donor wafer may contain a strata layer over the sacrificial layer, also called herein a 'cut-layer', on the base substrate 202 where the strata layer is subsequently transferred to a receptor wafer. The epitaxy process may utilize but not is limited to vapor-phase epitaxy (VPE), a modification of chemical vapor deposition, molecular-beam and liquid-phase epitaxy (MBE and LPE). If desired so as to at least increase etch selectivity, dopant may be incorporated during the epitaxial growth process by adding impurities to the source gas and/or reaction chamber. The type of epitaxy may be homoepitaxy with the same material grown on the base substrate 202. In the homoepitaxy, the doping type and concentration of the epi layer 204 may be substantially different from those of the base substrate 202 and the subsequently formed silicon layer 206, which could provide sufficient etch selectivity. Alternatively, another type of epitaxy may be heteroepitaxy with different material grown on the substrate. Such examples include SiGe on Si. Epi layer 204 may be formed with a thickness of about 20 nm, 50 nm, 100 nm, or about 200 nm, or about 500 nm, or about 1000 nm or about 2000 nm, depending on process integration, etching throughput, stiction resistance, and other process and device architecture engineering decisions and tradeoffs. The base wafer 202 thickness could be similar to the industry standard for these types of processing such as about 775 microns used for most current silicon fabs. The base wafer 202 may include sizes of about 2 inch, about 4 inch, about 8 inch, or about 12 inch in diameter or about 16 inch in the future (these wafer diameter sizes are often known with the corresponding mm sizes: 50 mm, 100 mm, 150 mm, 200 mm, 300 mm, 450 mm). Heterogeneously grown epi layer 204 may include various materials, for example SiGe, in anticipation of a sacrificial etch later in the process flow. The content of Ge in the SiGe may be designed per the selectivity desired and in consideration of the stress, for example, such as about 20% Ge, or about 10% Ge, or about 25% Ge, etc. With respect to the etch selectivity, the epi layer 204 could be favorably removed from the base substrate 202 and the subsequently formed silicon layer 206. The level of stress needs to be controlled to not cause dislocations. The stress can be controlled by at least growth rate, temperature, and film thickness. Predefined trenches on the silicon layer 206 and partially or fully across the epi layer 204 (not shown) in the designated dicing streets (or other non-circuit areas, for example, such as the streets between projection fields) could be used to provide some release of the potential stress. These trenches could have a width and a depth approximately corresponding to the thickness of the SiGe layer. Other techniques could be used to reduce stress, associated with epitaxial of SiGe on or under a silicon layer, such as incorporating smaller atoms in the SiGe layer such as boron or carbon; these and similar techniques are known in the art and could be used with combination with the techniques herein to support various forms of layer transfer or other applications herein.

Figure 2C:
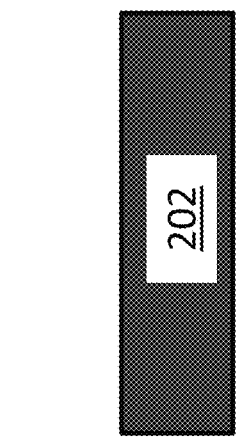

B. As illustrated in FIG. 2C, silicon layer 206 as an active layer for the active devices to be formed may be epitaxially grown on top of epi layer 204. The silicon layer 206 may also be single crystalline Ge, SiGe or Si:C depending on the applications. However, we herein will use silicon layer 206 as the active layer unless otherwise specified. The thickness of silicon layer 206 may include a thickness of about 10 nm, or about 20 nm, or about 50 nm, or about 100 nm, or about 200 nm, or about 500 nm, or about 1,000 nm or about 2,000 nm, as desired for the electronic circuits, depending on engineering, materials and scientific device considerations.

In many formations, silicon layer 206 may be considered to consist of mono-crystalline or single crystal silicon.

Figure 2D:
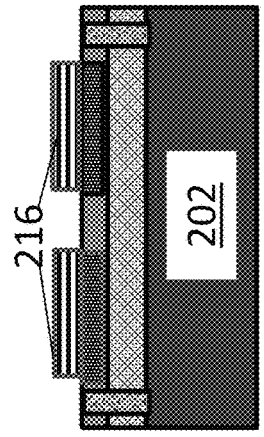

C. As illustrated in FIG. 2D, desired circuits 212 may be processed, including n-type and p-type transistors and other devices, such as inductors, capacitors, resistors, optoelectronic devices, gas sensors, etc., and may include a processed contact layer. For example, the desired circuit 212 may be processed to include metal 0 layer or metal 4 layer. This could be done using conventional processing including the appropriate high temperature processes (~600-900° C.) such as gate oxidation, dopant activation, contact silicidation, and so on. Types of transistors and circuits may include, for example, DRAM, NAND, or RRAM, RCAT, continuous array and FPGA structures, gate array, memory blocks, logic blocks, CMOS p-type and n-type transistors, MOSFET transistors, junction-less transistors, JFET, replacement gate transistors, thin-side-up transistors, double gate transistors, horizontally oriented transistors, finfet transistors, fully depleted thin-body transistor, JLRCAT, DSS Schottky transistors, and/or trench MOSFET transistors.

Figure 2E:
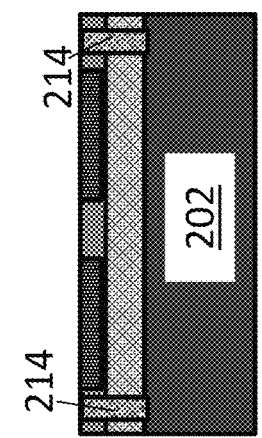

D. As illustrated in FIG. 2E, first set of holes 214 may be formed (by, for example, a conventional mask and etch sequence of processing) and may extend through the top silicon layer 206. The bottom of the etched trench may reside inside the SiGe epi layer 204 and may not touch the surface of base substrate 202 in order to reclaim the base substrate 202. Alternatively, the bottom of the etched trench may be located below the bottom of SiGe epi layer 214. These holes could then be filled with oxide or other material that would remain and play as a supporter for the desired circuits during future silicon and SiGe etches. Filled first set of holes 214 may serve as posts to hold the top layer designated to be transferred in later steps. First set of holes 214 may be located in the dicing streets area or some field oxides such as shallow trench isolation, and may be designed to be weak enough to be torn out, according to design and process integration engineering considerations.

Figure 2F:
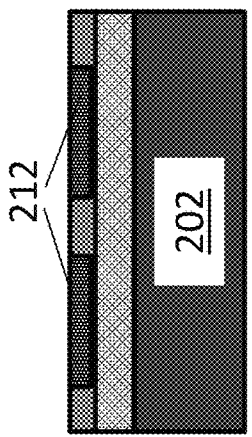
Figure 2G:
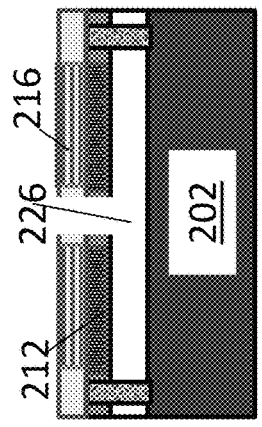

E. As illustrated in FIG. 2F, one or more interconnection layers 216 may be added. This is optional, depending on engineering and design considerations. Interconnection layers 216 may include wiring, contacts and vias, and may include materials such as, for example, copper, aluminum, tungsten, titanium, tantalum, cobalt metals and/or silicides of the metals. Interconnection layers 216 may be covered with isolation layer 222 (as illustrated in FIG. 2G) with materials such as $SiO_2$, carbon containing oxides, and so on. Isolation layer 222 may be planarized, for example, with CMP or other forms of planarization in anticipation of future wafer to wafer bonding.

Figure 2H:
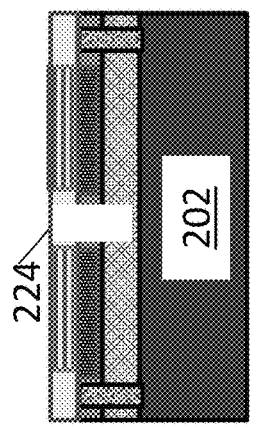

F. As illustrated in FIG. 2H, second set holes 224 may be formed to expose portions of sacrificial SiGe epi layer 204, thus allowing a substantially full etch of the sacrificial SiGe layer (the former SiGe epi layer 204). These holes could be made at un-used locations or in locations designated for future Through-Layer-Via (TLVs). These holes could also be made in locations designated for shallow trench isolation ("STI"). These holes may be opened through the top layers such as isolation layer 222 all the way into the epi layer 204. The formation of the holes for the sacrificial layer etches may include steps to protect the top silicon layer 206 and its holes side wall such as sidewall spacer by: 1. Use isotropic deposition techniques such as ALD to deposit isolation material such as silicon oxide in the open holes covering the side wall and the bottom of the holes. 2. Then may use anisotropic etching to open only the bottom of the holes to direct access to the sacrificial layers while protecting the side walls.

Figure 2I:
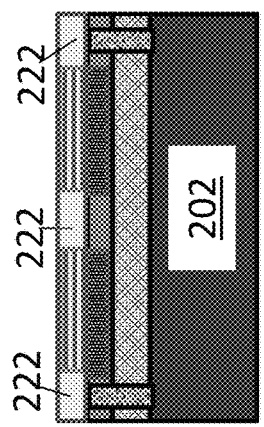

G. As illustrated in FIG. 2I, selectively etch the remaining sacrificial epi layer 204 creating void 226 underneath desired circuit layer 212. The design of posts and allocation of sacrificial etch holes could be designed so after the sacrificial layer etching is completed, the suspended circuit layer be remained substantially flat for layer transfer.

Figure 3A:
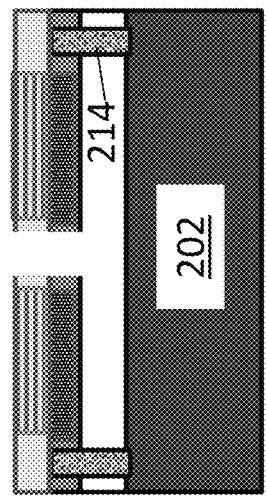
FIGS. 3A-3D are example illustrations of the structure transfer of an alternative system process flow.
Figure 3B:
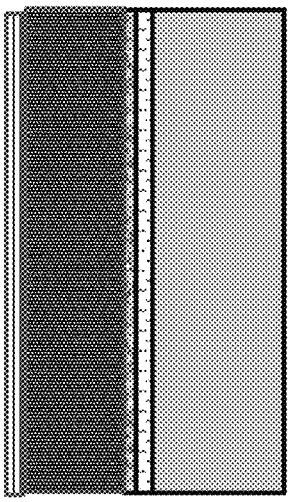
Figure 3C:
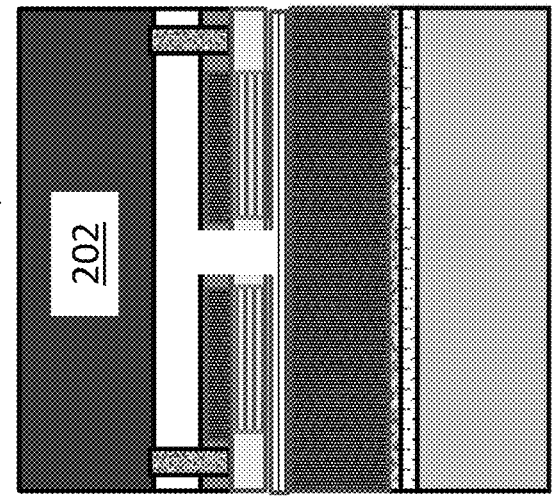

H. As illustrated in FIG. 3C, the structure such as illustrated in FIG. 3A (the structure from FIG. 2I) may be flipped and bonded onto a target wafer 302 illustrated in FIG. 3B. The target wafer 302 may be fully processed wafer including metallization, for example, an arbitrarily designed SoC or generic circuit. Alternatively, the target wafer 302 may be specially fabricated wafer which could be the underlying base in the 3D structure. For example, see the incorporated references listed as part of the Background of the Invention section of this specification. This results in bonded structure 390 such as illustrated in FIG. 3C. The bonding could be oxide to oxide bonding which could be followed with top wafer interconnection through a TLV (Thru Layer Via) process, or metal to metal bonding, or hybrid bonding (oxide to oxide and metal to metal bonding). The bonding process could be made so it results in sufficiently a strong adhesion between bonding surfaces of donor wafer and the target wafer 302. The target wafer 302 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be, for example, junction-less transistors or recessed channel array transistors. Target wafer 302 may further comprise semiconductor devices such as resistors and capacitors and inductors, one or more programmable interconnects, memory structures and devices, sensors, radio frequency devices, or optical interconnect with associated transceivers. Target wafer 302 may further include isolation layers, such as, for example, silicon and/or carbon containing oxides and/or low-k dielectrics and/or polymers, which may facilitate oxide to oxide wafer or substrate bonding. Target wafer 302 may also be a base substrate to build the 3DIC stricture onto.

Figure 3D:
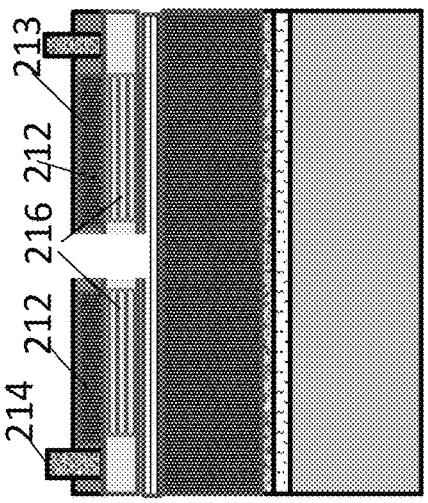

I. The donor structure, substantially donor wafer-base substrate 202, may be detached from bonded structure 390 leaving intermediate 3D IC structure 399 as is illustrated in FIG. 3D. The donor wafer, substantially reusable donor wafer-base substrate 202, could be reclaimed for processing to prepare for reuse, perhaps as a seed wafer of subsequent epitaxial growth as explained in FIG. 2. Intermediate 3D IC structure 399 may include target wafer 302, desired circuits 212, surface 213, first set of holes 214, and interconnection layers 216. Alternatively, the substrate 202 could be grind and etched back without being reusable for future processing.

J. The top surface 213 of intermediate 3D IC structure 399 may be cleaned and prepared for interconnections. Optionally cover with isolation.

K. TLVs may be formed for interconnection from the top to the bottom strata to form the 3DIC layer interconnects if necessary.

The donor wafer 'tearing off' detach could be assisted by known techniques such as, for example, water-jet, wedge, laser cutting, etched assisted tearing off and mechanical twist and pull.

Alternatively, additional interconnection layers and other processing could be added in between step 'G' and 'H' above. So, the structure illustrated in FIG. 2I could be further processed before being flipped and bonded to the target wafer 302. This add-on process could include adding additional metal layers or any other structure including additional transistor layers using similar techniques such as layer transfer.

The sacrificial layer removal holes 224 process could include side wall oxide deposition to further protect the side walls from the etch process designed to remove the sacrificial layers. These holes could be later sealed by a second step of, for example, oxide deposition. Such two steps oxide fill could be visible under proper magnification or other imaging techniques.

These layer transfer techniques could allow many of the benefits associated with monolithic 3D technologies including avoiding thermal budgets associated with forming one circuit strata affecting another circuit stratum, enabling mixing of technology nodes, mixing circuit substrate types, crystal structure, orientation and many other advantages associated with heterogeneous integration without process temperature restrictions described herein and in the incorporated art.

The use of SiGe for epitaxial based 'cut layer' instead of porous silicon or porous SiGe 'cut layer' could be adapted to many of the flows presented in at least U.S. application Ser. Nos. 14/642,724, 15/095,187, and 15/173,686, all the forgoing are incorporated herein by reference. It does add some complexity related to the holding posts formation and the holes to etch the SiGe thoroughly prior to performing the layer transfer. For applications in which two layers of active silicon, and isolation layer in between, is desired, the in-between SiGe could be removed after the transfer and replaced with isolation material.

Use of SiGe as a sacrificial layer for transferring a single crystal structure of one crystal on top of another structure has been presented in U.S. patent application 2015/0137187, incorporated herein by reference. Many studies of SiGe etch selectivity in respect to silicon have been done and published such as: In a work by T. Salvetat et al titled "Comparison between three Si1-xGex versus Si selective etching processes" presented at 214th ECS Meeting; and by M. Stoffel titled "SiGe wet chemical etchants with high compositional selectivity and low strain sensitivity" published in Semicond. Sci. Technol. 23 (2008) 085021; by V. Destefanis et al titled "High pressure in situ HCl etching of Si1-xGex versus Si for advanced devices" published in Semicond. Sci. Technol. 23 (2008) 105019; by T. K. Carns et al titled "Chemical Etching of Si, Ge in HF:H2O2:CH3COOH" published in J. Electrochem. Soc., Vol. 142, No. 4, April 1995; and by Marius Orlowski et al titled "Si, SiGe, Ge, and III-V Semiconductor Nanomembranes and Nanowires Enabled by SiGe Epitaxy" published at ECS Transactions, 33 (6) 777-789 (2010), all of the forgoing are incorporated herein by reference.

Another alternative is to skip steps related to FIG. 2D-2I and use the SiGe layer 204 as an etch stop, and after transfer grind and etch back the donor substrate 202, using the SiGe as an etch stop. And if desired, remove the SiGe layer 204 with an additional selective etch step, etching SiGe and very little or negligibly thin backside of the top silicon 206. The base substrate 202 could be about 775 microns thick while the SiGe 204 could be ten nm or less, or few tens of nm or even few 100 nm. For example, a 3D technique of flip bond and etch back of an SOI donor such as presented in at least U.S. Pat. Nos. 6,821,826, 7,723,207 and 7,312,487, all the forgoing are incorporated herein by reference. As an alternative to the use of SOI wafers, the base substrate 202 would not be reused but rather be ground and etched away from its wafer backside. The back grind and etch back could use wet etching and the SiGe layer 204 could be designed to be very resistive to the silicon wet etching. The SiGe could be designed to have multiple layers including one that might have high Ge content, for example, such as over about 20% or over about 40% or over about 80%, followed by other layers with low Ge content such as less than about 20% or even less than about 10% to reduce stress so to support the silicon layer 206. FIG. 1B illustrates an example of having the alternating Si and SiGe layers being comprised by multiple sub-layers with a varying content of Ge in the SiGe. Depositing or epitaxially growing the SiGe interface layer to the silicon with a smaller amount of Ge content decreases the stress due to the lattice mismatch. Then gradually increasing the Ge content to the desired level and then after the desired thickness has been grown gradually reducing the Ge content toward the next level of silicon could be used to reduce stress from both sides of the Silicon-SiGe-Silicon structure. Reducing the stress could help reduce the risk for formation of point defects and dislocations, and could help the engineering of the SiGe thickness as needed for the application. The alternative of use of SiGe as an etch stop later is further discussed herein later.

Alternatively, the 'cut' process could be integrated with Siltectra's 'Cold Split' technology as has been detailed in at least U.S. Pat. Nos. 8,440,129 and 8,877,077, and U.S. applications 20160064283, 20160086839, all of which are incorporated herein by reference. These techniques would allow reuse/recycling of the donor wafer (base substrate 202A middle location inside SiGe or the interface between Si and SiGe could be used to provide the "Pre-Defined Break Initiation Point" as an alternative to the Siltectra use of laser or in addition to it. The Siltectra's 'Cold Split' could reduce the need for the undercut etch and posts formation processing while providing reuse of the base substrate 202. For this technique, a multilevel SiGe could be designed to support the 'cut' on the one hand but also to reduce damage to the device layer on the other. This could be accomplished by increasing the Ge content in the interface with the base substrate 202 to have high Ge content such as over about 20% or over about 40% or even over about 80% and then on the side interfacing with device layer 206 forming a low Ge content such as less than about 20% or even less than about 10% to reduce stress to the silicon circuit layer 206. Alternatively, a few atomic layers thick Ge rich SiGe layer or even a pure Ge layer maybe used as a predefined break layer.

Once the base substrate 202 is removed, a selective etch could be used to remove the SiGe residues. Additional thinning processes such as etch and/or CMP could be used to further thin the back side of the device layer 206. Connection layers could be added included vias aligned to the target wafer 302 using "Smart Alignment" and similar 3D integration techniques discussed here and the incorporated by reference art.

This use of Cold Split could be used to form SOI wafers and could be less expensive to manufacture when compared to the current ion-cut methods.

A variation of flow in respect to FIG. 2A-2I, is to have the first set of holes 214 posts formed as part of the substrate process prior to desired circuits 212 processing. Accordingly, the flow in respect to FIG. 2E could be done to the donor wafer illustrated in FIG. 2C. These posts could be positioned at the dicing streets such as those between reticle projections, so they would not interfere with the future desired circuits 212. Alternatively post formation may be done to the donor wafer illustrated in FIG. 2B, which could then be processed with an epitaxial process which could be thick enough to fill-in the space on top of these posts allowing the following circuit processing without concern for the posts' locations. The number of posts per wafer could be 1-2, 4-10, 10-50 or over 100 first set of holes 214 posts per reticle. The diameter of these posts could be the size of vias for the designated process, or 50-100, 100-200, 200-400 nm or even larger. The material in these posts could be material compatible with these semiconductor processes and may be designed to be very selective with respect to the SiGe etch such as Silicon-Nitride, or any of the materials used for contacts such tungsten, or their combination, or, for example, copper, aluminum, titanium, tantalum, cobalt metals and/or silicide of the metals.

Another alternative is to use a similar flow to form a donor substrate which could support layer transfer as an alternative to an ELTRAN based donor wafer. This embodiment offers silicon on nothing structures anchored by post structures on the silicon ends. Then, the process follows using wafers with silicon on nothing. An exemplary donor wafer construction flow could include the steps A-F, referencing the illustrations in FIG. 4A-4H:

A. As illustrated in FIGS. 4A and 4B, on a reusable donor wafer-base substrate 402 and epi layer 404 as a sacrificial layer may be formed, for example, by epitaxy processes. Epi layer 404 may be formed with a thickness of about 100 nm, or about 200 nm, or about 500 run, or about 1000 nm or about 2000 run, depending on process integration and architecture engineering decisions and tradeoffs. Epi layer 404 may include various materials, for example SiGe, in anticipation of a sacrificial etch later in the process flow. The content of Ge in the SiGe may be designed per the selectivity desired and in consideration of the stress. Predefined trenches (not shown) in the designated dicing streets (or other non-circuit areas, for example, such as the streets between projection fields) could be used to release the potential stress. These trenches could have a width and a depth approximately corresponding to the thickness of the epi layer 404 SiGe layer.

B. As illustrated in FIG. 4C, first epi silicon layer 406 as an active device layer may be epitaxially grown on top of epi layer 404. The thickness of silicon layer 406 may include a thickness of about 10 nm, or about 20 nm, or about 50 nm, or about 100 nm, or about 200 nm, or about 500 nm, or about 1000 nm or about 2000 nm, as desired for the electronic circuits, depending on engineering, materials and scientific device considerations. In many formations, first epi silicon layer 406 may be considered to consist of mono-crystalline or single crystal silicon.

C. As illustrated in FIG. 4D, first set of holes 414 may be formed to eventually be anchors of silicon on nothing structures (by, for example, a conventional mask and etch sequence of processing) and may extend through the first epi silicon layer 406 and the SiGe epi layer 404. These holes could then be filled with silicon nitride or oxide or other material that would be remained to future silicon and SiGe selective etches. Filled first set of holes 414 may serve as posts to hold the top layer designated to be transferred in later steps. First set of holes 414 may be located in the dicing streets area and may be designed to be weak enough to be torn out at the 'cut' step, by methods, for example, such as mechanical tear-off, edge and twist tear-off, water jet, according to design and process integration engineering considerations.

D. As illustrated in FIG. 4E, form multiple second holes 424 to expose the SiGe layer 404 and resultantly allow a full etch of the sacrificial SiGe layer (the former SiGe epi layer 404). These holes need to be open through the first epi silicon layer 406 all the way into the SiGe epi layer 404.

E. As illustrated in FIG. 4F, selectively etch the sacrificial SiGe layer creating void 426 underneath the first epi silicon layer 406. The suspended first epi silicon layer 407 may remain substantially flat for good bonding process.

F. As is illustrated in FIG. 4G perform additional epitaxial processing adding second epi silicon 432 (incorporated suspended first epi silicon layer 407 in drawing) and sealing second holes 424. The material and doping type of second epi silicon 432 may be the same or different from those of the first epi silicon 406 depending on the applications. The additional epitaxial width could exceed the second holes 424 radius to ease the holes scaling. A smoothing technique such as chemical mechanical polishing and $H_2$ annealing could be used to improve the top layer surface.

The donor wafer illustrated in FIG. 4G could then be used to process circuits 212, in a similar manner such as illustrated in FIG. 2D and could form some interconnections 216 in a similar manner as illustrated in FIG. 2F, and then be flipped and bond on top of a target wafer in a similar flow as is illustrated in FIG. 3A-3D, and many of the flows presented in the incorporated by reference material, such as U.S. Ser. No. 15/173,686 in respect to ELTRAN based donor wafer.

The silicon epitaxial layer 206/406 could be constructed from two layers such as first layer doped n+ followed by p− doped layer. Such double layer construction could allow smoothing of the surface 213 of the transferred layer after the transfer. Selective etch could etch the doped n+ layer leaving a smooth p− doped layer. Alternatively, the silicon epitaxial layer 206/406 could be made with three layers as is illustrated for example in FIG. 4H. First a p− layer 442, followed by n+ layer 444 and finally the upper most p− layer 446. The upper layer 446 could be used for the transistor layer, underneath it layer 444 which could support back-bias as suggested by Zeno Semiconductors and as published such as in papers by Jin-Woo Han et al titled "A Novel Bi-stable 1-Transistor SRAM for High Density Embedded Applications" published at IEDM 2015, and "A CMOS-Compatible Boosted Transistor Having >2× Drive Current and Low Leakage Current" published at ESSDERC 2016, incorporated herein by reference. And the bottom layer 442, as a sacrificial layer, to support smoothing, post transfers by selective etch as discussed above.

In U.S. patent application Ser. Nos. 15/095,187 and 15/173,686 incorporated herein by reference, ELTRAN base layer transfer techniques are shown being adapted to support die to wafer 3D IC construction. Some of the die-to-wafer flows suggest transfer of dies having a relatively greater thickness such as 6 microns or even 20 microns and further thinning these dies after being bonded to the target wafer. Such die thinning could leverage a multi layers die structure. As an example, a multilayer such as is illustrated in FIG. 4H could be used. For such the bottom layer 442 could be silicon on top of it SiGe layer 444 and at the top silicon device layer 446. So the multilayered 440 could be 'cut' and bonded at a die level onto the target wafer, then a selective etch from the top could be used to first remove the silicon layer 442 and then thin the die all the way to the device layer by selectively etching the SiGe layer 444. These extra layers 442 and 444 could have a thickness of about 1 micron, 1-3 microns, 3-6 microns or even higher. The device layer 446 itself could have more sub-layers such as n+ and p− to support the back-bias scheme as discussed before. The use of multilayers, such as SiGe, allows having flexibility so a layer thickness is first set to support transfer at the wafer or die level providing the mechanical strength required for the handling and transfer, to be followed by selective etch trimming the thickness of the devices to support the electrical function and to allow forming via and other connection for following steps. These could be engineered by the artisan in the art. The 'cut' techniques could include selective under-etch or grinding and etch back as could be engineered for specific applications.

All these multilayer structures could be formed during the epitaxial growth by adding materials as gases to the epitaxial growth chamber as well known in the art.

These variations could be used for donor wafer substrate formation as discussed in reference to FIG. 4A-4H, or for transferable device layer as discussed in reference to FIG. 2A-2I.

As been stated before, a buried SiGe layer could be used as an etch stop layer. Use of buried SiGe as an etch stop layer to transfer a crystalline layer on top of another wafer structure has been presented in U.S. Pat. Nos. 6,521,041, 6,689,211, 6,940,089, 7,348,259 and U.S. patent applications 2014/0342523, and in combination with ion cut in U.S. patent applications 2007/0023066, 2008/018959 all of the forgoing are incorporated herein by reference.

An additional alternative is to combine the porous formation technology of the ELTRAN based wafer transfer with the epitaxial ease of formation of silicon —SiGe technology base layer transfer presented herein. In U.S. Pat. Nos. 5,685,946 and 5,757,024 and in paper by Mondiali, V., et al. "Micro and nanofabrication of SiGe/Ge bridges and membranes by wet-anisotropic etching." *Microelectronic Engineering* 141 (2015): 256-260, all incorporated herein by reference, SiGe is shown to be stain etched forming a porous layer with about 100 to 1 selectivity with respect to silicon. Using this selectivity could allow forming a 'cuttable substrate' from the structure of FIG. 2C or FIG. 4C without the need of the posts formation of FIG. 2E or FIG. 4D. This concept could be applied to substantially all of the transfer flows presented herein including die level and wafer level transfer. The buried SiGe layer would become mostly porous Ge or porous SiGe layer and would withstand the following process temperature and other related process steps. For the 'cut' step the techniques presented in respect to the ELTRAN process could be used, such as mechanical tear-off, edge and twist tear-off, water jet, and extremely selective etch (being porous and Ge vs. silicon). This would simplify the layer transfer process and would allow substrate reuse, both cost saving opportunities.

The stain etch of a buried (Si or Ge or) SiGe layer converting it to porous layer could also be used when thermal isolation is required. Porous layers function well as a thermal isolation layer and oxidizing it could further add mechanical strength and further decrease its thermal mobility. Accordingly such a layer process could be useful in forming thermal isolation between the stratum of the 3D structure. So, for example, using SiGe as an etch stop could be followed by, instead of etching away the SiGe after grinding and etching of the silicon substrate, stain etching the SiGe converting it to a thermal isolation layer.

Converting the buried SiGe layer to porous layer by stain etching as presented above could leverage the STI etching step to use it as access to the buried SiGe layer or could include dedicated holes 224, 424, etching step. These access holes could be designed to provide access for effective conversion of the full buried SiGe layer underneath the die to SiGe. Such full buried SiGe conversion could be engineered based on the height of the buried SiGe layer the percent of Ge and other engineering aspects. As presented in U.S. Pat. Nos. 5,685,946 and 5,757,024 the side spread of the stain etching could extend to over 1 micron from the access holes. The engineering aspect of such full SiGe conversion could include Electronic Design Automation ("EDA") to support the design process to place these holes throughout the die surface to provide sufficient access to full SiGe stain etching. Such EDA support could include adapting the macro-cell library to include access for very large structures, providing a holes adder utility to add holes in 'white' spaces area that do not need holes or STI for the active circuits, and adding modules to the Design Rule Checker ("DRC") utilities. Similar type of EDA enhancements to support process modules, is common practice in the industry.

The layer transfer process could include two steps. First step could be performed at the frontend of the line of the process optionally as part of the STI process in which the SiGe layer is stain-etched converting it to a substantially porous layer. The second step could be performed just as before the layer transfer. In this second step, the porous-SiGe layer is selectively etched to make it ready for "cut"— detach. At that point the porous-SiGe could be selectively etched with extremely high selectivity. As discussed before, etching porous layer is about 5 orders of magnitude faster than etching the respective same material in full solid form. In addition the porous-SiGe is mostly Ge which could be extremely selective etched in respect to silicon. Accordingly the porous-SiGe could be etched with many orders of magnitude selectivity vs. silicon or other elements of the active circuits. In this case, the top silicon sidewall protection process described in FIG. 2H and FIG. 2I may be skipped. For the second step of weakening the porous-SiGe the required deep holes access could be designed with very low area loss. An example for such low cost access could be using the dice lanes. Deep etch of the dice lanes could help the layer transfer and detaching process as 'divide and conquer'. Additionally, the second step of weakening the porous-SiGe etch could be design to leave only small porous regions in the center of dies, keeping the dies in place for the bonding but make it easy to then detach the wafer leaving the active die bonded and the substrate detached and ready to be refreshed for reuse. An additional aspect of these porous-SiGe and related layer transfer techniques herein is an improved bonder machine which could include a detaching module. Such a detaching module could be a simple twist and pull apart, tearing off the substrate for reuse.

Additionally, a substrate 502 similar to one illustrated in FIG. 2C could be used in a conventional semiconductor fabrication process to process device layer contacts and potentially some connectivity 516 as illustrated in FIG. 5A. The SiGe layer 518 could be made as a buffer layer with multiple gradient Ge or as a uniform SiGe with Ge content of 15-20% or 20-30% or even higher. The circuit layer could be covered with oxide layer 517 and then planarized and made ready for being bonded to a target wafer 504 shown in FIG. 5B. The target wafer 504 may also be processed with the desired level of metallization. An oxide to oxide bond could be used to bond it to the target wafer 504 as illustrated in FIG. 5C. Other types of bonding could be used; such as metal to metal or hybrid bonding. Then a grind and etch could be used to remove the silicon substrate 502 from the bonded structure 522 leveraging the SiGe layer 528 as an etch stop resulting with the structure 524 as is illustrated in FIG. 5D.

Alternatively, the substrate 502 could be made with perforations similar to as been described in U.S. Pat. No. 8,273,610, incorporated herein by reference, in respect to at least FIG. 184 and FIG. 185. The SiGe layer could be etched or stain etched through these perforations allowing the detachment of the carrier wafer 502 for reuse.

Additional advantage of the techniques described herein is having the transferred circuit being an SOI circuit with its active silicon thickness to be fully depleted channel. The single crystalline silicon layer such as 530 could be made thin enough and being bonded over oxide and covered with oxide effectively could provide the SOI functionality and if made thinner such as 10 nm provides FD SOI functionality.

Figure 6B:
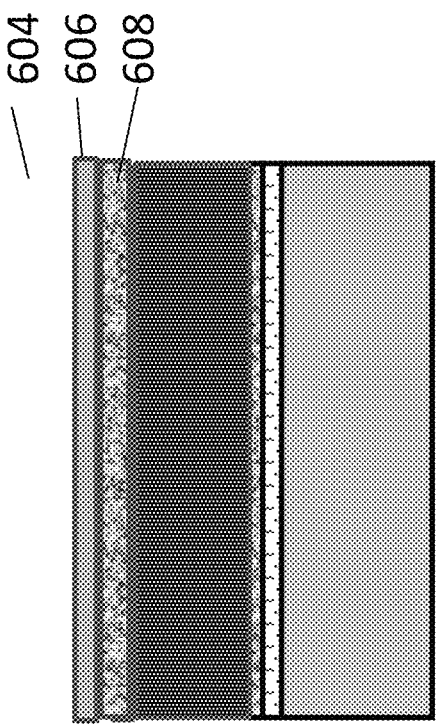
FIGS. 6A-6D are example illustrations of structures and methods to thermally isolate stratums in a 3D IC.
Figure 6D:
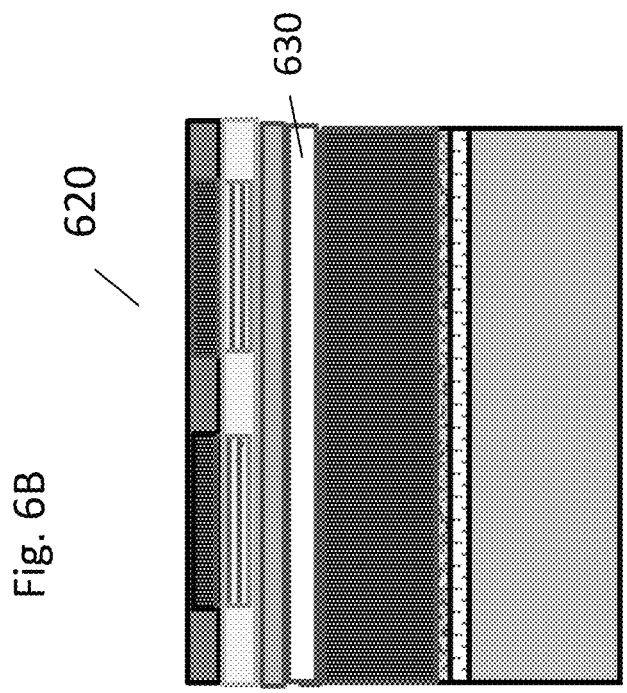
Figure 6A:
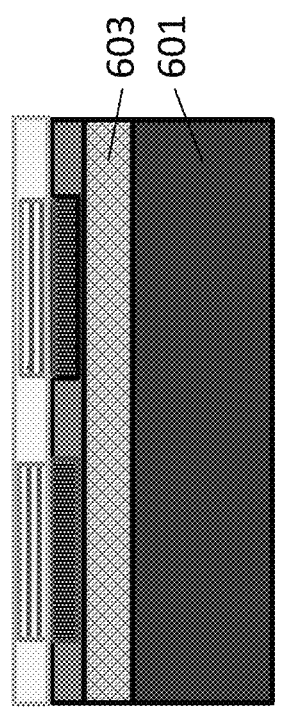
Figure 6C:
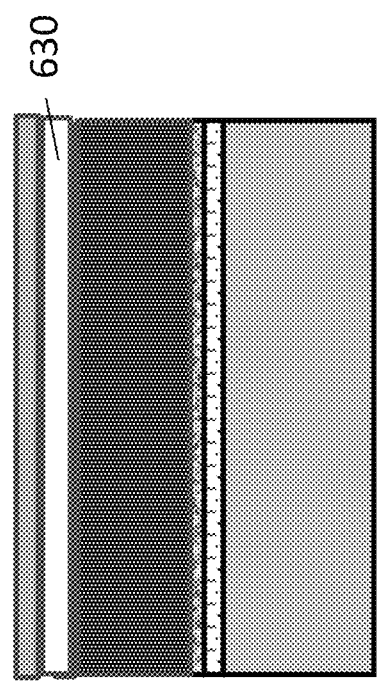

FIG. 6A is a 'cuttable' wafer carrying circuits 610 such as memory control (periphery) circuits. FIG. 6D illustrates transferring the circuits 610 of FIG. 6A on top of the structure 604 of FIG. 6B, transferring the substrate 601 and partially the 'cut-layer' (SiGe) 603, and then removing base substrate 601 and partially the 'cut-layer' 603. An additional inventive embodiment is to optionally form a thermal isolation 608 on top of the memory matrix of target wafer 604 as is illustrated in FIG. 6B. In U.S. Pat. No. 9,023,688, incorporated herein by reference, in at least FIGS. 1-5 and associated specification sections, various thermal isolation layer techniques are presented to allow high temperature processing of the upper layer with minimal effect of the underlying circuit. These techniques could also be used to allow thermal isolation between one stratum and the other strata. Such could help isolate the operating temperature of one stratum so that it would not affect the operation of the other stratum. For example, the target wafer 604 could be primarily memory circuits while the transfer circuit 610 could be logic circuits that consume higher power during operation. The logic circuit might be generating heat and operate at a higher temperature that the memory circuit underneath; for example, a temperature difference of greater than about 20° C., greater than about 40° C., greater than about 60° C., greater than about 100° C. Accordingly forming a thermal isolation layer 608 in-between might help isolate temperature across these strata. Such isolation layer techniques could also include having layer 608 act as a sacrificial layer that could be etched under the bonding layer 606 in similar way to what have been described in respect to the SiGe layer 204 in reference to FIG. 2D to FIG. 2I. Etching away layer 608 results as is illustrated in FIG. 6C, could further increase the thermal isolation by providing an air gap isolation 630 between stratuns. The etch technique could be such which forms a first porous layer which could be fully oxidized providing buried air pockets and thus almost an air gap level of thermal isolation. Using these techniques could allow forming a thermal isolation layer 630 between two strata having a thickness of few tens of nm or few hundreds of nm or even few microns, and having a low thermal conductivity such as less than about 1 W/mK or less than about 0.4 W/mK or less than about 0.1 W/mK or even less than about 0.05 W/mK. Alternatively, the isolation layer, for example, thermal isolation 608, 630 in between the target wafer 604 circuits and the transfer circuits 610 could comprise aerogel or high porosity dielectric as detailed in U.S. Pat. No. 9,023,688 and could be made extra thick to further increase the thermal isolation, such as, for example, greater than about 100 nm, greater than about 200 nm, greater than about 400 run, or greater than about 1 micron thick. In some cases, a thickness of 1-10 microns may be indicated, depending on design and engineering tradeoffs. Additionally, bonding layer 606 could include a heat spreader structure to reduce hot spots and further help protect the lower stratum from the upper stratum operating heat or vice versa. FIG. 6D illustrates a two strata 3D circuit 620 using techniques described herein. Furthermore, the through layer via ("TLV") used to connect the upper stratum to the lower one could utilize titanium to further reduce the heat conductivity between these strata. These TLV could use extra thick isolation to reduce thermal conductivity to the surrounding areas. Additionally, some of those TLV may be dedicated thermal TLVs wherein their main function is to serve as heat delivery channels to the heat sink and/or outside surface of the device. These even more important in respect to the TLV being used to conduct the heat from the operating circuit to the device external surface which is part of the device heat removal structure. Such extra thick lateral isolation could be greater than about 100 nm, greater than about 200 nm, greater than about 300 nm, greater than about 500 nm or more than a micron thick.

In a 3D system such as is illustrated in respect to at least FIG. 6D or FIG. 10-FIG. 11, may include both a memory array and a logic circuit, the thermal isolation 1157, to keep the logic heat away from the memory array, could be placed in between the logic circuit 1156 (or logic layer) and the memory control circuit 1155 (or memory control circuit layer) as is illustrated in FIG. 11. In general many vias, such as Thru Layer Vias (TLVs), may be connecting between the memory control circuit 1155 and the memory array 1131. These vias could connect to substantially every word-line, bit-line, source-line, and so forth. On the other hand the logic circuit 1156 could connect to the memory control circuit 1155 using address lines which represent far less connections (as an example—10 address line could control, with proper decoder circuits, 1024 word-lines). Reducing the number of TLVs through the thermal isolation layer 1157 helps reduce the thermal connectivity through it and greatly improves the effective thermal isolation.

Formation of multiple levels of arrays of transistors or other transistor formations in the structures described herein may be described at least by the terms 'multilevel device' or 'multilevel semiconductor device.' Some examples of multilevel device may include memory device such as DRAM, SRAM, and Flash memory and image sensors such as CCD and CIS.

3D devices could include redundancy for defect recovery in addition to redundancy techniques know for 2D devices. Such 3D devices could include one-time-programmable memory for at least packaged level memory repair. Such redundancy techniques and structure has been presented in U.S. Pat. No. 8,395,191, incorporated herein by reference, in respect to at least FIGS. 41, 86, 87, 114-132.

Additional variations of redundancy and repair techniques could be integrated within the 3D SRAM. 3D DRAM or 3D NOR fabric as detailed in PCT/US patent application 16/52726 and U.S. application Ser. No. 15/333,138 (now U.S. Pat. No. 10,014,318), incorporated herein by reference. Hereinafter, the use of 3D NOR fabric in any of embodiment in this invention may be 3D SRAM fabric or 3D DRAM fabric unless otherwise specified.

FIG. 7-FIG. 10 correspond to FIG. 35A-FIG. 35D of PCT/US patent application 16/52726. It is used to illustrates 3D system which includes 3D-NOR fabric 1130 over 'cut layer' 1113 over substrate 1110, and brought over from another substrate 1150 and cut layer 1143 periphery circuits 1154, and brought over additional processing logic 1156 enabling such as "Processing-in-Memory", or "co-processor in memory" or "function in memory". Such memory centric architecture may be useful compared to the conventional processor centric architecture for future machine learning, neural network, approximate computation and so forth. As discussed there many system options could leverage such 3D system 'Lego'. A generic memory array could be diced using predefined potential dice lines or etch defined dice line to fit specific overlay logic, the overlay logic itself could be broken to more than one stratum, and could include dedicated stratum for I/O, cut from another generic wafer. Additional 'Lego' options could be available from the 3D NOR fabric. One such option is segmenting and allocating the number of layers into the 3D NOR fabric and the amount of memory and programmable logic accordingly. FIG. 10 illustrates one type of 3D NOR fabric 1130 with control circuit 1154 and processing logic on top 1156. Alternatively another 3D system could be construct with similar "Lego" parts such as the processing logic 1156 with modified control circuit 1155 and a 3D NOR fabric with much fewer number of layers 1131. Another type of system variation using similar 'Lego' parts is to modify within the 3D NOR fabric where the thickness of the tunneling oxide is processed differently for sets of words line groups and accordingly creating variations with the memory type in the 3D system between retention time and access time. Another type of structure variation that could be applied is memory usage and the corresponding write and read techniques such as multilevel and mirror-bit tradeoffs between access time and density. Another type of modification that could be formed in the 3D system is the allocation of the fabric to memory versus to programmable logic. These variations could form completely different end 3D system with lower investment in new masks and higher leverage of the volume of generic product produced in the process line.

An additional inventive embodiment for such a 3D system as is illustrated in at least FIG. 10, is to add additional layer on top to provide an electro optics circuit which could allow use of light, such as, for example, fiber-optics or photonic components, to communicate with other systems and for other systems to communicate to the 3D system illustrated. Alternatively, the top layer of the 3D system may be image sensors, hyperspectral sensor, or time-of-flight sensor. Such a 3D system could comprise a memory fabric such as 3D NOR fabric 1130 which could be allocated as sub memory sections, some for high speed and some for high density, and a compute circuits within control circuit 1154 that could have many cores and control circuits designed for communications and control of the underling memory fabric (such as 3D NOR fabric 1130), and communication layer within processing logic 1156 that could be made with material optimized for those tasks, such as those optimized for RF. Such a 3D computer could be made to support very efficient programming as its entire internal routing are far shorter compared with current Printed Circuit Board (PCB) technique of computer system integration or even the 2.5D/3D initiatives.

Such heterogeneous 3D integration allows the use of one type of fabrication facility for one of the strata, for example, a memory oriented fabrication facility to produce the memory array 1130, and very different facility for a different stratum, for example, such as a logic orientated fabrication facility producing the memory control circuit 1154, thus allowing an increased flexibility in the design of the overall system including use of much more advance fabrication lines for some of the stratum.

Use of the alignment technique we call 'Smart Alignment' allows connection between the upper strata and the lower strata with vias (Through Layer Via—TLV) that are as small as the thickness of the layer and the process capabilities allow. Such is useful for connecting memory control circuits in one stratum to memory control lines such as bit-lines and word-lines on the other stratum.

FIG. 12 illustrates the 'Smart Alignment' technique. The target wafer 1164, such as illustrated in FIG. 8, could have its alignment mark 1162 and a connection strip target 1160 along direction 'X' 1190, having a length longer than the worst-case misalignment in 'X' direction of the wafer bonding (and subsequent release, planarization, and cleaning process). The transferred layer or wafer 1170, such as for example control circuit 1154 illustrated in FIG. 7-9, may have its own transferred layer alignment mark 1166. FIG. 13 illustrates the intersection between the horizontal connection strip target 1160 and the designated upper stratum vertical connection strip 1172, which could be aligned to the transferred layer alignment mark 1166, is now known and will be processed to be locating the $TLV_{21}$ 1168. The processed vertical connection strip 1172 length should be designed to be longer than the worst-case misalignment in 'Y' direction of the wafer bonding. Accordingly, the via 1168 could be aligned, to target wafer alignment mark 1162 in the Y direction and to the transferred layer alignment mark 1166 in the X direction. Once the via layers are formed an upper layer metal mask aligned to the upper layer alignment mark 1166 could be used to form connection between the transferred upper stratum and the target stratum underneath. FIG. 14 illustrates connecting the upper stratum strips 1178 to memory control lines 1176 in the target wafer using the 'smart alignment' technique individually connecting to each control lines even for bonding misalignment which far exceed the memory control lines pitch.

Yet the target wafer 1164 in most cases of memory array would have at least two set of control lines one in X direction and one in Y direction. To allow effective connectivity the 'Smart Alignment' technique could be enhanced to have two sets of TLV. One $TLV_{21}$ aligned to target wafer's alignment mark 1162 in Y direction and to the transferred layer's alignment mark 1166 in X direction. And the other $TLV_2$ aligned to target wafer's alignment mark 1162 in X direction and to the transferred layer's alignment mark 1166 in Y direction. This may require two step of lithography. FIG. 15 illustrates such two connection sets. Bit-lines in X direction 1180 connected to upper stratum by strips in Y direction 1182 while word-lines in Y direction 1184 connected to upper stratum by strips in X direction 1186.

An additional inventive embodiment relates to monolithic 3D by layer transfer whereby a unique structure may be formed by replacing silicon with high quality oxide prior to the layer transfer at the time that high temperatures processes are acceptable. For example, the silicon in the zone 1179 that is being designated for TLVs may be etched and filled in with high quality oxide (or a lower quality oxide deposition followed by a high temperature anneal) that would have leakage current of less than one picoamp per micron at a device power supply voltage of 1.5 and at a measurement temperature of 25° C. Thus, as well, the TLVs would not require any insulative lining to pass thru the TLV transiting layer, which could be islands/mesas of silicon in a sea of oxide, or vice versa.

An alternative to, two lithography steps with two via masks, could be the smart use of direct write eBeam in which the eBeam alignment could be managed to provide proper placement for the $TLV_{12}$ and $TLV_{21}$.

In some applications, it could be desired to transfer stratum including interconnection performing what could be called parallel integration instead of sequential integration. Bonding layer or die in such case could utilize hybrid bonding forming bonding and direct metal to metal connection in the process. In general, such hybrid bonding utilizes connection pads that are large enough to accommodate the bonding misalignment which in advanced bonder is approaching 100 nm worst case misalignment. Yet some memory stratum might use control line pitches which could not accommodate the bonder misalignment. An alternative for such cases could be use of bonding oxide that could be made to conduct by electrical signal, using what is known as One Time Programmable—"OTP" or Resistive RAM technologies. In such case one stratum could have some control signal and power signal connected using the hybrid bonding while the memory control lines could be connected by programming.

Figure 17:
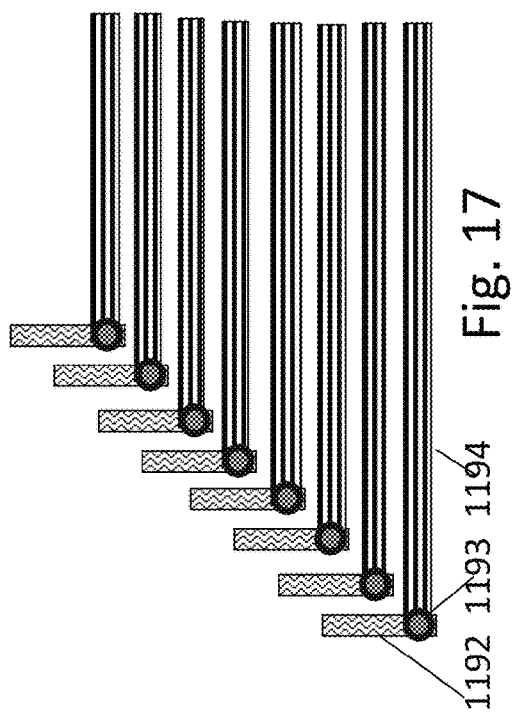
Figure 18:

FIG. 16 illustrates a section of memory control lines in one stratum. FIG. 17 illustrates connection segment on the other stratum. For the case in which the memory stratum is the one under the connection structure of FIG. 17 includes connection strips in Y direction 1192 that are formed long enough to cover the bonding misalignment in Y direction, connected by via 1193 to the X direction connection wires 1194 on the upper layer. FIG. 18 illustrates these connection structures after the bonding. For misalignment of less than three memory control lines pitch, three independently controlled programming signals VP1, VP2, VP3 could be used to form the connection between the memory stratum and the logic stratum. These could be provided using properly arranged and connected diodes. Other arrangements could be designed and engineered.

Figure 19A:
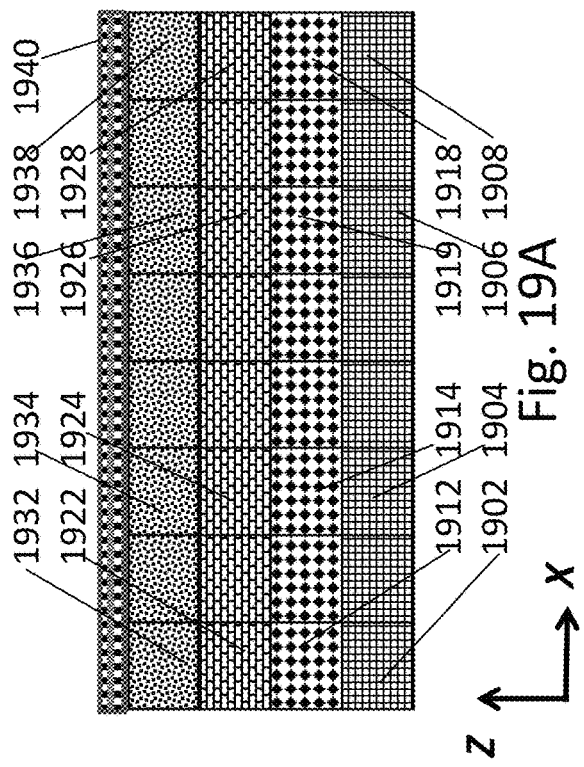
FIG. 19A is an example illustration of a 3D system.

An additional inventive embodiment is an alternative for a 3D device-system; such a system as is illustrated in FIG. 11. It is to construct the system as array(s) of memory units, such as illustrated in FIG. 12B of PCT/US2017/052359, and with a corresponding processor cores on top of it or underneath. For many compute tasks the program code loaded on a processor core could be set according to the content loaded in its corresponding memory unit on top or under it. Thus processing of data could be accomplished with a short distance data transfer of less than about 1 mm or less than about 100 microns or even less than about 20 microns, as opposed to PCB (Printed Circuit Board) based computers in which the data from the memory being fed though over 20 mm wires using the PCB. The memory unit and the processor core could be rectangular in shape with an area of less than about 4 mm$^2$, or less than about 1 mm$^2$. Alternatively, the data transfer into the 3D device-system could be set such that data is placed in correspondence with the designated processor to process it. An additional alternative is the use programmable logic as part of the processing logic. With the use of programmable logic, or FPGA, the logic configuration could be adapted to the data stored in the corresponding 3D memory to further enhance processing efficiency while reducing data movement power and delay. FIG. 19A illustrates an X-Z cut view of a 3D system in which a first strata of memory units 1902, 1904, 1906, 1908, is overlaid by a second strata of memory units 1912, 1914, 1916, 1918, is overlaid by a third strata of memory control circuits 1922, 1924,1926,1928, and is overlaid by fourth strata of processor core units 1932, 1934, 1936, 1938. In some embodiments, the first strata of memory units may be high density non-volatile memory such as Flash memory or RRAM. In some embodiments, the second strata of memory unit may be high-speed memory such as DRAM or static memory such as SRAM. For example, such computer system could be tasked to search for a person who meets a specific criterion. Accordingly the fourth strata cores could be set with the search in parallel in which core 1932 is access using memory control 1922 for that person in the data base being hold at memory cores 1912 and 1902. In another case only one core at a time will perform the search while the other cores perform other tasks, yet the search is performed by a core 1932 in the data bank in 1912, 1902, and then the search task is assigned to core 1934 which will run it for the data in 1914, 1904 and so forth.

An additional advantage in such a 3D memory system relates to the potential defects in semiconductor manufacturing. For example, the structure illustrated in FIG. 19A could be processed at full reticle level with the expectation that some of the cores or the memory units could be defective and would not be activated on the end product, which could be designed to function with only 80% of the units functional. As such, the third strata of memory control circuits may have an on-chip testing function (not shown) in order to assess the functionality of the memory layers underneath and allocate those memory blocks into the enabled and the disabled blocks, and update the data routing path(s) accordingly. An important advantage of this 3D structure is the ability to effectively support a very fine grain of unit-based construction. Such units could be designed and engineered to be sized to less than about 1 mm$^2$ or less than about 0.2 mm$^2$ or even less than about 0.05 mm$^2$. While the 3D system size could be larger than 100 mm$^2$ or larger than 600 mm$^2$, or larger than 2,000 mm$^2$ or even larger than 10,000 mm$^2$.

Moreover, a mix of redundancy techniques could be used. As such the multi-core multi-unit 3D system of FIG. 19 could have a system control function 1940 which controls the overall 3D system and could be constructed with two strata: one strata provides redundancy to the other at the logic cone level as been presented in U.S. Pat. No. 8,994,404, incorporated herein by reference, in respect to at least FIGS. 24A-44B.

The system control function 1940 could include input output channels to other systems, or to a communication channel such as the internet or to wireless systems such as G4, G5. This could include such as fiber optic channel, free space optical channel, wireless channel and other forms of communication channels. The Monolithic 3D technology presented herein enables heterogeneous integration to enable those forms of communication.

Figure 19B:
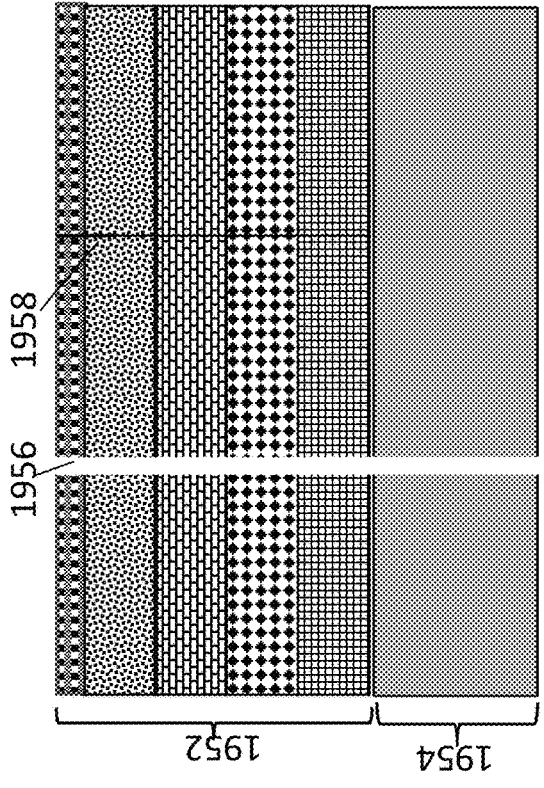
FIG. 19B is an example illustration of customization of a 3D system.

The 3D architecture also could be useful to enable common manufacturing of a modular system that could be customized to specific needs by techniques presented herein, such as the use of each of a continuous structure as presented U.S. Pat. No. 8,994,404 as related to at least FIGS. 11A-12E, FIGS. 14-17, and FIGS. 22A-23D. FIG. 19B illustrates such customization. The upper portion 1952 is a magnification of section of a structure such as is illustrated in FIG. 19A, and it overlay a substrate 1954. The generic wafer could be then customized by dicing it to the desired end chip size. The dicing 1956 could be done by many of the known techniques including conventional dicing saw, or plasma etching also called plasma dicing or laser assisted dicing. The dicing could be done at designated potential dice lines 1958. These potential dice lines could include various restrictions (for example, design rule restrictions) and support for potential future dicing including guard rings and avoiding active regions or metal lines through them. Alternatively, the dicing could be done by advanced dicing techniques such as laser assisted or plasma assisted dicing. And could be supported by additional techniques to seal and provide side wall protection to support good functionality and reliability of the end device.

An additional inventive embodiment is an additional aspect of a 3D computer system, such as is related to FIG.

19A, where there is the need to integrate multiple memory stratums to achieve a larger memory bank. In one alternative, multiple stratums could be integrated via 3D integration with minimum per strata processing, and then a memory control stratum could be added to control each and every memory cell in the strata underneath. These memories could be structured for such integrations. These memories could be volatile memory such as DRAM, Non Volatile memory such as 3D NOR, or 3D NAND or even a mix of such. In the following description of such integration, it is assumed that the memory are constructed in a same size memory unit array and each such unit is controlled by the same pitch of memory control lines so when one memory wafer is bonded on top of another memory wafer these memory units and their control lines (wordlines and bitlines) are precisely overlaid to each other. This overlaying is subject to the wafer to wafer or die to wafer misalignment precision of the bonding equipment. The integration technique leverages copper to copper, hybrid or 'fusion' bonding in which the bonding process also functions as an electrical connection process between these wafer/strata Such precise bonding is presented in a paper by Kurz, Florian, et al. "High Precision Low Temperature Direct Wafer Bonding Technology for Wafer-Level 3D ICs Manufacturing." *ECS Transactions* 75.9 (2016): 345-353, incorporated herein by reference. Utilizing a precision bonder and thin layer transfer to construct 3D generic memory structure and integrating it with a logic wafer to form high performance 3D compute system is presented in a paper by Zvi Or-Bach titled "A 1,000× Improvement in Computer Systems by Bridging the Processor Memory Gap" IEEE-S3S 2017, incorporated herein by reference. FIG. 20A-20F illustrates preparation of a wafer for such connectivity using wafer bonding, including construction of the TLV to allow multiple stratum integration, leveraging the 3D layer transfer techniques presented herein or other thin layer transfer techniques.

FIG. 20A illustrates a Y-Z 2000 cut view of section of a wafer, a base wafer 2002 including a SiGe "cut layer" 2001 and memory circuits 2003.

FIG. 20B illustrates the structure of FIG. 20A after etching hole region 2004 substantially all the way to expose the cut layer 2001.

FIG. 20C illustrates the structure of FIG. 20B after forming top metal landing pad 2006. The isolation layer to protect the silicon sidewall of the memory circuit 2003 (not drawn). This top landing pad 2006 may be drawn larger in the X and the Y direction than the pitch of a TLV as determined by the bonding process, in order to accommodate the wafer bonding alignment tolerance of the TLV. Top landing pad 2006 may be in-plane with the silicon layer of the memory circuit 2003.

FIG. 20D illustrates the structure of FIG. 20C after covering the structure with isolation layer 2008.

FIG. 20E illustrates the structure of FIG. 20D after adding interconnection layer 2010 including at least one via 2014 to the landing pad 2006. This could be a memory control line. The interconnection layer 2010 may be wordline, bitline and/or sourceline of the memory circuit 2003.

FIG. 20F illustrates the structure after adding the bottom connection pad 2012 connected to the interconnection layer 2010.

Such prepared stratum may be bonded onto another target wafer and once the cut is performed the target strata is ready to have additional stratum bonded and connected onto it.

FIG. 20G illustrates an alternative to adapt such technique to die level operation as was presented in reference to FIG. 4H herein. As an example, a multilayer such as is illustrated in FIG. 4H could be used. For such the bottom layer 2042 could be silicon, and SiGe layer 2044 on top of the silicon layer 2042, and top silicon device layer 2046. Then using a similar flow to the one in reference to FIG. 20A-20F herein, bottom pads 2022 and top pads 2044 could be formed. Thus the multilayered structure 2040 could be 'cut' and diced out and bonded at a die level onto another target wafer (not drawn), then a selective etch from the top could be used to first remove the silicon layer 2042 and then thin the die all the way to the device layer, for example, by selectively etching the SiGe layer 2044. These support layers 2042 and 2044 could have a thickness of about 1 micron, 1-3 microns, 3-6 microns or even higher. The device layer 2046 itself could include sub-layers such as n+ and p− to support the back-bias scheme as discussed before herein and in incorporated references. By having the inter-stratum connectivity structure 2022, 2024 pre-built, the stacking process could provide both mechanical bonding and through silicon connectivity—hybrid bonding—thus simplifying the 3D system formation which could include wafer level stacking and die level stacking yet having thin stratum in the stack. These stratum could be at a thickness of about 10, 20, 40, 100, 200, 400 nm or about one or a few microns.

FIG. 21A-21C illustrates a small region of a memory control line X-Y 2100 top view. In this integration technique, a layer selected (not shown) could be used to allow multiple stratum control lines to be connected in parallel yet by enabling the layer select only the selected stratum could be accessed.

FIG. 21A illustrates top metal landing pads 2102 for control lines 2104 such as bit line, word line, or source line that are sized to the maximum bonding misalignment margin 2101 to guarantee that the bottom connection pad 2108 of the following stratum to be bonded will land on the top landing pad of the prior stratum. In some of the advanced wafer bonders the bonding misalignment is less than 100 nm (three sigma).

FIG. 21B illustrates the structure with the added control lines 2104 and their connection 2106 to the top landing pads. In many cases, the control lines pitch is denser than the expected worst-case misalignment and accordingly the landing pads are placed on multiple rows as illustrated. These control lines could be the bit-lines or the word-lines. The connectivity structure of FIG. 21A-21C assumes a control lines pitch of about 80 nm. Using an advanced lithography process, control lines pitch could be further pushed to even below 30 nm. The connectivity approach illustrated in FIG. 21A-21C could be adjusted accordingly.

FIG. 21C illustrates the structure after adding the bottom connection pads 2108. The use of the term bottom and top connecting pads is just for the ease of explanation and being part of layer transfer process top and bottom could be flipped.

FIG. 21D illustrates the X-Z cut-view or the Y-Z cut-view 2120 of the top landing pad during the wafer processing. Having a carrier substrate 2110, the area designated for intra stratum connectivity could be first processed to etch the silicon 2118 all the way to expose the SiGe layer 2111 using selective etch with the SiGe as an etch stop. Silicon 2118 may include a bottom layer silicon layer 2122 (dark black line) which later after flip bonding and 'cut' could become the top layer. The etch process could be wet or dry as the region being etched is relatively large, for example, of about 1 micron by 200 microns, or about 0.5 microns by 300 microns. Then the region could be filled with an electrically isolative material, for example, such as oxide 2113. Then the top landing pads may be patterned and then filled in with a conductive material, for example, such as copper, forming top landing pads 2112. The size of these pads 2112 could be large enough to assure the desired electrical and physical contact after the following wafer bonding step. For example, such as about 100 nm by 100 nm, or about 200 nm by 200 nm, or about 220 nm by 220 nm, or about 180 nm by 180 nm, or about 250 nm by 250 nm, or about 180 nm by 220 nm depending on production, design and other engineering considerations, especially the wafer bonder alignment capability. Then vias 2116 to these landing pads 2112 may be formed and additional isolation 2113 could be added if needed. These vertical connectivity elements pads 2112 and vias 2116 could be called Through Layer Via (TLV) or nano-TSV. The processing of these nano-TSVs could take place after the wafer has completed the high temperature process, often called Front End of the line ("FEOL"), which includes forming all the transistors, their isolation, and contacts in the active silicon 2118. The metal pattern could include a 'bonder alignment marks' 2119 to support the following face-to-face precise alignment. These 'bonder alignment marks' could be placed at the die level or even at the reticle level as they are part of the full wafer alignment process.

FIG. 21E illustrates the structure after completing the interconnect layers—the Back-End of The Line ("BEOL"). The memory array interconnect 2130, the nano-TSV which includes the future bottom pads 2138, the landing pads 2132, and the vias 2136 connecting them, and the bit-lines or the word-lines 2134. An oxide 2131 could be added to cover the array interconnect 2130. The process could be designed so the top surfaces of the future bottom pads 2138 are exposed to support the future metal to metal or hybrid bonding. Such preparation could include a slight height adjustment to ensure connectivity between the stack stratums.

FIG. 21F illustrates the resulting structure after having the structure of FIG. 21E, first structure 2144, flipped and bonded (metal to metal or hybrid bonding) to a second structure, base structure 2142 (may be similar to first structure 2144). The base structure 2142 may not need full nano-TSV or SiGe layer, for example, if it is supposed to be the uppermost stratum of the 3D chip; however, having a unified memory wafer could be preferred and having the ability to connect controls from both sides could be desired.

FIG. 21G illustrates the structure after removal of the base silicon 2146 of the top wafer first structure 2144. This could be done with a conventional grind followed by etch leveraging the SiGe layer 2148 as an etch stop.

FIG. 21H illustrates the structure after removal of the SiGe cut-layer 2148, using selective etch to etch mostly SiGe and not silicon. The exposed silicon layer 2122 could be oxidized to support subsequent hybrid bonding of additional structures, for example, such as first structure 2144 on top to form a three stratum stack or as many as needed. Alternatively, the hybrid bonding could be made of silicon to oxide and metal to metal. A few processes could be used to convert the now top layer silicon 2122 to oxide. Such as simple etch and deposition with potential CMP step to expose the pads, or to oxidize the top silicon surface 2122 using low temperature techniques such as presented in a paper by H. Kakiuchi, et al., titled "Formation of silicon dioxide layers at low temperatures (150-400° C.) by atmospheric pressure plasma oxidation of silicon", published at Science and Technology of Advanced Materials 8 (2007) 137-141; and by Masaki Hirayama, et al., titled "Low-Temperature Growth of High-Integrity Silicon Oxide Films by Oxygen Radical Generated in High-Density Krypton Plasma" published at IEDM 99. Alternatively the boding could be made between the top silicon 2122 and oxide 2131 of the added stratum such as presented in a paper by R. Do Black, et al., titled "Silicon and silicon dioxide thermal bonding for silicon-on-insulator applications" published at J. Appl. Phys. 63 (81), 15 Apr. 1988, all of which are incorporated herein by reference.

The process for removing the base silicon 2146 and the SiGe cut-layer 2148 could include use of grinding and selective etch as previously discussed. First selectively etch silicon using the SiGe layer 2148 for an etch stop, and then etching selectively the SiGe using the silicon 2122 and the pads 2132 as an etch stop. Alternatively the SiGe layer 2148 could be pre etched or mostly etched similar to the process in reference to FIG. 2H to FIG. 3D and FIG. 4E to FIG. 4H herein. The 3D integration between memory control circuits and the bitline/wordline of the memory array could utilize the concept illustrated in FIG. 21A-21C, as an alternative to the 'smart-alignment' technique such as in reference to FIG. 12-FIG. 15, or the programmable technique of FIG. 16-18.

Figure 22A:
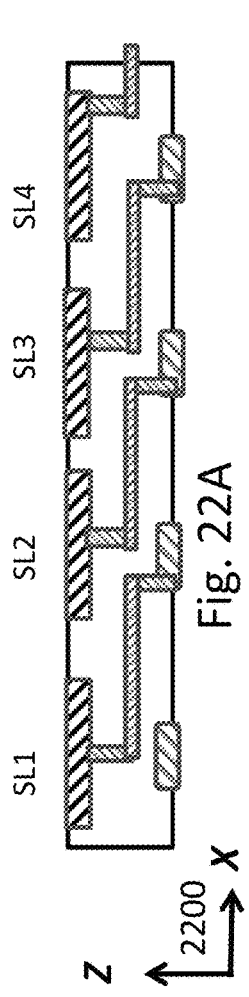
FIGS. 22A-22B are example illustrations of a stratum select connectivity scheme.
Figure 22B:
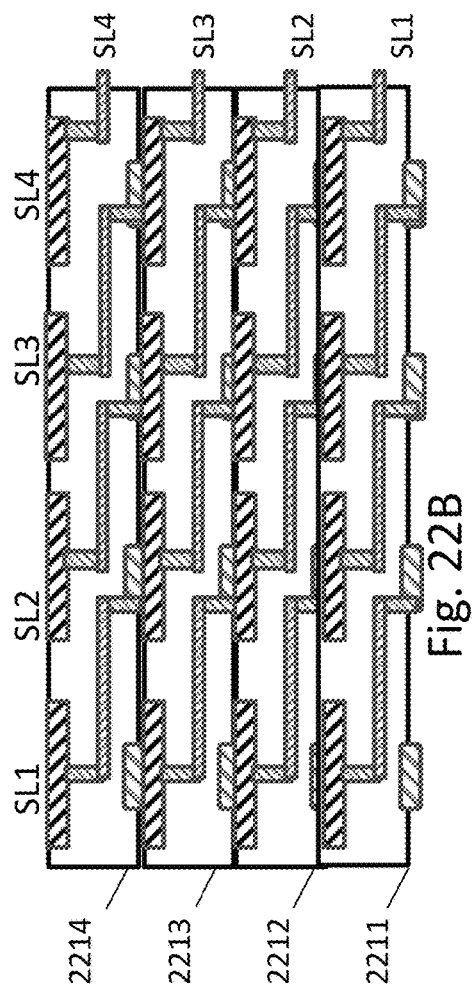

FIG. 22A-22B are X-Z 2200 cut view of the stratum select connectivity. It supports a generic stratum design which could be integrated in any stack numbers of 3D integration and allow a top select of each stratum.

FIG. 22A illustrates one stratum section with per-level stairs, which is designed to support up to four stratum integrations (for example) with top access to select each of the stratum in the stack by the top access—SL1, SL2, SL3, SL4.

FIG. 22B illustrates a stack of four stratums 2211, 2212, 2213, 2214 which are stacked so that SL1 could be used to select stratum 2211 and so forth to SL4 to select the top stratum 2214.

Figure 22C:
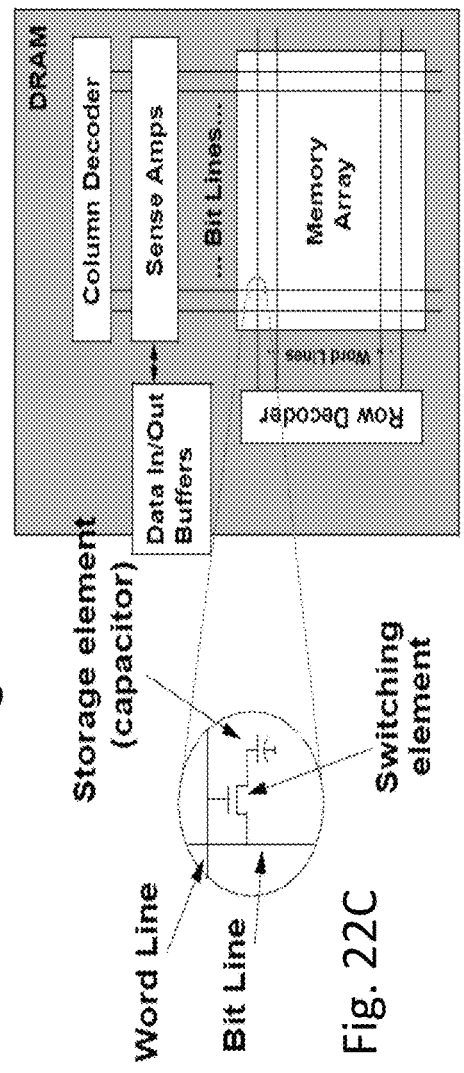
FIGS. 22C-22E are example illustrations of wordline and bitline select schemes.
Figure 22D:
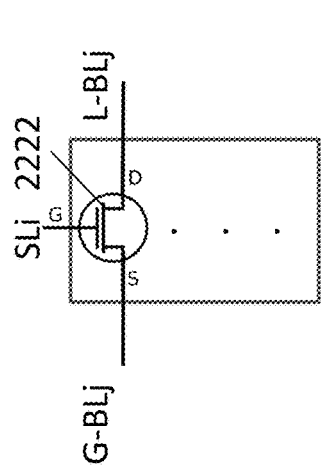
Figure 22E:
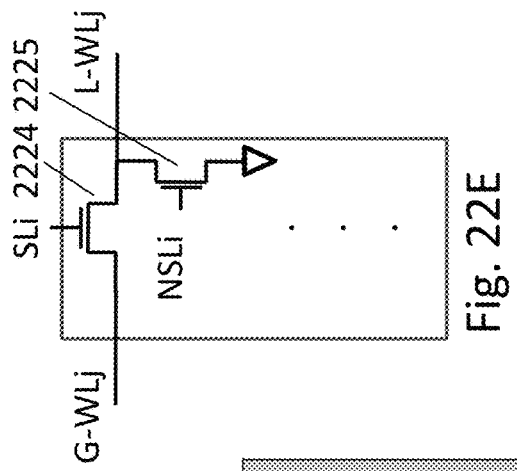

FIG. 22C illustrates a conventional DRAM block diagram. In the 3D computer system presented in herein the memory array could be in one strata while the control circuits, for example, such as Row Decoder, Sense Amps, Column Decoder, and Data In/Out Buffers, are placed on upper most overlaying (or lower most underlying) strata. Such memory multiple array stratums could be combined by techniques such as has been described herein to form a larger memory 3D array. For example, the per layer select to be added per unit array as is illustrated in FIG. 22D for the bitlines and as is illustrated in FIG. 22E for the wordlines. At the edge of the unit array the per layer bitlines -L-BLj could be selected by the control line SLi by activating select transistor 2222, which its output G-BLj is one of the control line 2104 illustrated in FIG. 21B to connected together as General Bit Line-j, as presented in respect to FIG. 21A-21C herein. Herein the symbol i indicates the number of the layers in the stack, and the symbol j te the count of the control lines. Similarly, at the other edge of the unit array the per layer wordlines -L-WLj could be selected by the control line SLi and its inversion NSLi by select transistor 2224, which its output G-WLj is one of the control lines 2104 illustrated in FIG. 21B to connected together as General Word Line-j, with additional transistor 2225 to deactivate the unselected wordlines (as gate signal is preferred not to be left floating).

Figure 22F:
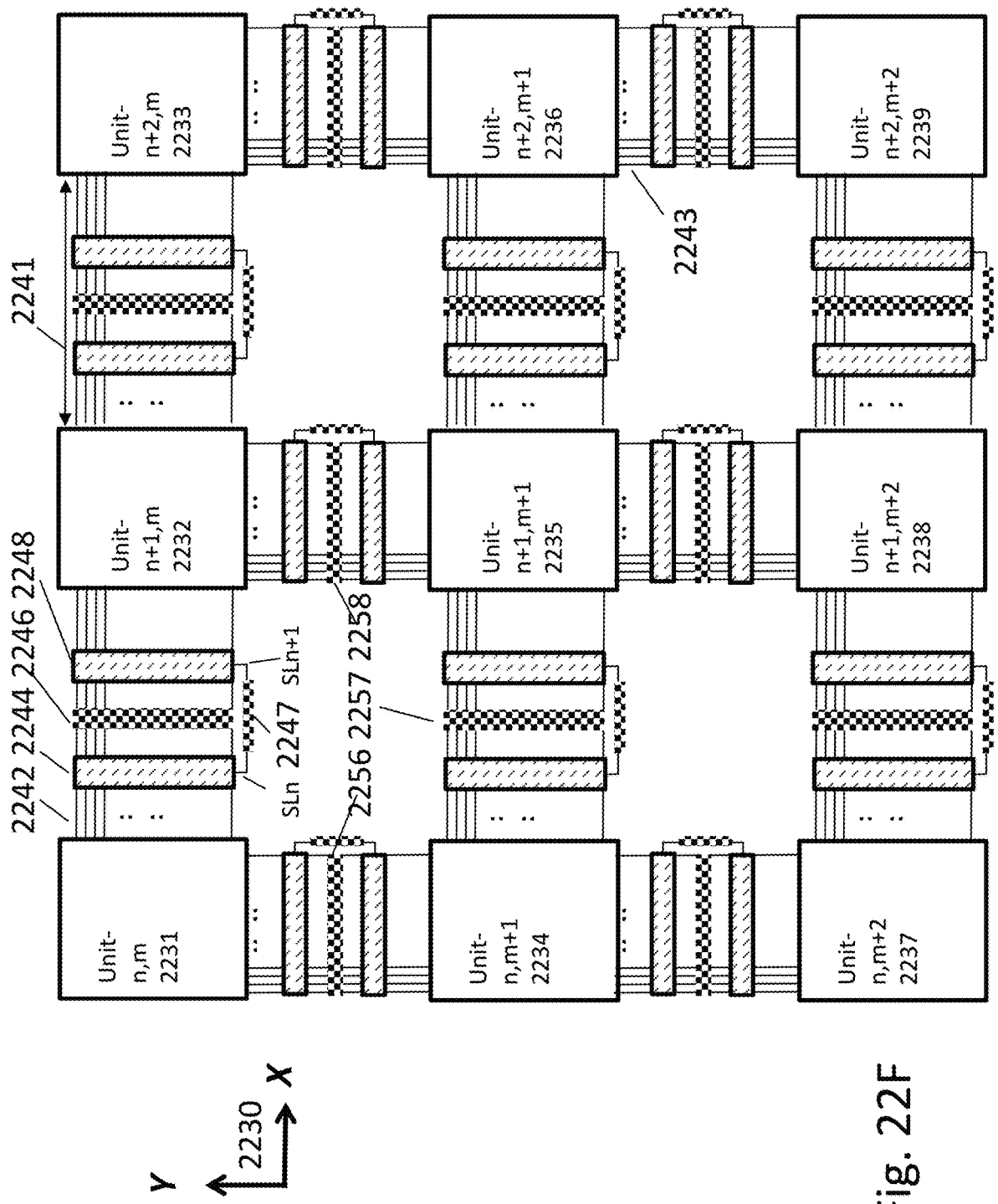
FIG. 22F is a section of a partition an array of memory units.

As an additional embodiment, the per layer select circuits could be made to either the bit lines (FIG. 22D) or the wordlines (FIG. 22E) and the select for the wordlines could be made with primarily N type transistors for which both the SLi and the NSLj signals could be routed from the control stratum. FIG. 22F illustrates a section of such partition to array of units illustrating a section of 3×3 units 2231-2239 along X-Y direction 2230. Each unit may be an array of bit-cells having wordlines 2242 traveling in the X direction and bit-lines 2243 traveling in the Y direction. The memory unit array (2231-2239) size could be about 200 microns×200 microns while the gap between units could be about one micron to allow for the vertical connecting pads 2246 of FIG. 21A-21C, for the layer select 2244, 2268 of FIG. 22E for the wordlines and of FIG. 22D for the bitlines. In the corners between units the 'layer-select' vertical connection structure 2247 of FIG. 22A could be placed. It should be noted that FIG. 22F like many other figures herein is not to scale and the unit size (~200 micron×200 micron) are not drawn in proportion to the size of gap (~1 micron) between units, and so on.

An additional embodiment is to have two layers of select circuits for each control line as is illustrated in FIG. 23A. One select sector 2314 controlling the bitlines or the wordlines 2312 coming out from memory array unit 'n' 2304 before the connections pads 2316, and one select sector 2318 after it, in between the adjacent memory array unit n+1 2306. The select signals pads 2317 coming from the memory control circuits could include two signals SLn and SLn+1. This way the vertical memory control lines from the memory control circuits connected to the horizontal memory control lines (Word-line or Bit-lines) via pad structure 2316 could drive each of the adjacent memory array units 2304, 2306. This connectivity structure enables many use options, for example, including redundancy used to overcome defects, or multiple memory access options from single units to multiple units. A 3D computer system could leverage this flexible connectivity to blend between high speed local access with multiple processor cores, each accessing a local memory in parallel operation, combined with global memory access in which multiple units are functioning as a larger memory array. The hybrid bonding of stratum in the 3D stack allows connecting not just the active signals but also support signals such as ground, power and feed-through 2308 as needed for such stratum within the stack and below and on top of it. The space between the memory units 2311 could be designed to accommodate the landing pads 2316 and the layer select transistor 2314, 2318.

FIG. 23B illustrates a block diagram for the generation of per layer select signal SLi. For example, a case in which 8 stratum of memory array are needed, the lower address bits $A_0$-$A_2$ could be decoded 2324 to eight layer select—$SL'_0$-$SL'_7$. In such a 3D system it could be desired to use one extra 9th stratum in which one stratum is used as redundancy to replace a defective stratum. The operation could include first a testing cycle to check if any memory cell in a unit had a defect for which the redundancy could be used. In general, the big memory may be segmented to many small units such as multiple thousands of units each about 200 microns by 200 microns. The likelihood of two defects in two overlaying units is extremely low so repair at the unit level could enable extremely high system yield. For memory unit by redundancy unit replacement, the redundancy stratum may be segmented into multiple units according to the unit size of the memory stratum. For such the 8 signals $SL'_0$-$SL'_7$ could be input to the repair control unit 2326. The repair control unit will allocate the 8 layer select to the 8 good stratum out of potential 9-th stratum leaving one stratum always unselected, by generating the proper 9-th layer select signal $SL_0$-$SL_8$. FIG. 23B illustrates an optional a sub unit repair control by having some additional address lines $A_{10}$-$A_{11}$ control signals to the repair control unit 2326, so to allow different distribution of the layer select lines to the 9-th potential stratum to each quarter of the memory array. The repair control unit 2326 could be constructed to be programmable so after testing the arrays it could be programmed to avoid use of a defective sub array or array region. Using the enhanced access scheme of FIG. 23A, memory stratum of adjacent unit(s) could be used as a replacement of the defective unit within a stratum if needed, thereby giving a larger range of recovery options.

Persons in the memory art could adapt these techniques in many variations to engineer 3D Computer systems with the desired memory size with consideration to process yield. Such could include, having first the logic stratum then the memory control and then overlaying the memory stack, or having the memory stack first as illustrated in FIG. 11. The 3D memory array 1131 could be a monolithic memory array or stacked memories array such as been presented in respect to FIG. 20A-FIG. 23, or both above and below. In such a 3D computer system it could be desired to include a thermal isolation layer such as layer 1157 of FIG. 11 to isolate the relatively high operating temperature of the logic layer from the memory structure. Redundancy techniques could be also used for the memory control circuits and the processing logic. The redundancy technology utilized could include techniques presented herein or in the incorporated by reference art, leveraging the unit modularity aspect of the 3D computer system and the 3D integration in which the repair could be provided in a very close proximity overlaying the replaced part and preserving the full system functionality.

In the 3D Memory stack presented herein, the unit partition could be symmetrical in which the length of the wordlines within a unit is similar to the length of the bitlines, or the unit partition could be very asymmetrical. These control line length and accordingly the size of the respective unit size in X direction or in Y direction could be about 50, 100, 200, 400 micron or even one or few millimeters. The number of connections associated with these control lines is order of magnitudes larger than the number of vertical connections associated with the access control, the per layer select (SLi). In some applications the control could be broken into a few banks, each with its own select line allowing more control flexibility to individual memory banks within the unit. Such could allow better granularity for redundancy use or parallel access to the unit memory array. These banks could be allocated horizontally (X, Y) or vertically (Z). Such could also be used for parallel access from logic overlaying and or logic underlying the array. Such could also allow for sections of the memory array to be mapped for global access across multiple units. Such variation and the support control logic to support them are known in the art and could be designed by an artisan in computer architecture and memory controls.

FIG. 24A illustrates an alternative 3D computer system utilizing the technologies presented herein. The base 2410 is a carrier substrate which is also provides cooling to the main multi cores computing stratum 2424, through a first thermal isolation layer 2426 the computer stratum is connected to the multi-unit memory control stratum 2428, which controls the multi-unit memory array strata 2430. Overlaying the memory strata is a second memory control stratum 2432 which provides second access to the same memory strata 2430. Through a second thermal isolation layer 2434 a second computing stratum 2436 could be connected to the second memory control stratum 2432. The second computing stratum 2436 could communicate with external devices utilizing a communication stratum 2438. The communication stratum 2438 could utilize wired, wireless, optical or other communication channels to communicate with external devices. An upper heat removal apparatus could overlay the communication stratum 2438.

An additional alternative is to integrate in such 3D computing structure active cooling. Such active cooling work was recently supported by DARPA and the report on these techniques is presented in a paper by Chainer, Timothy J., et al. "Improving Data Center Energy Efficiency With Advanced Thermal Management." *IEEE Transactions on Components, Packaging and Manufacturing Technology* (2017), incorporated herein by reference. Such active cooling could be incorporated in addition or as replacement of the thermal isolations 2426, 2434. FIG. 24C illustrated a 3D structure with active thermal cooling supporting feed through of electrical interconnects 2472 and thermal vias 2474.

Herein the term layer transfer or layer cut could be applied to use of SiGe as a cut layer either as sacrificial layer with far different etch rate vs. silicon as presented such as in reference to FIG. 2A-FIG. 3D, or as an etch stop layer for back grinding and silicon etch scheme. Either one of these techniques could be used for the 3D system presented herein.

Additionally, alternative structures to SiGe could be used for the formation of the 'cut layer'. In some embodiments, the 'cut layer' may also function as an etch stop layer or sacrificial layer which could be selectively removed. Such alternatives have been detailed in PCT/US patent application 16/52726 and U.S. application Ser. No. 15/333,138 (now U.S. Pat. No. 10,014,318), incorporated herein by reference. For example, one may use a highly doped layer of N+ or P+ or porous layers. A unique advantage of a doped layer used as 'cut layer' is the ability to make it at the processing fab as part of the conventional process flow via conventional processes such as ion implantation or in-situ doped epitaxial growth. Another aspect is the ease to make the 'cut layer' selectively using patterning which opens up more options; for example, instead of a full layer or to allow change in the layer thickness in different location across the wafer. The use of a doped layer as a 'cut layer' could be combined with other functions, such as a back bias connection for transistors or other devices. The choice of 'cut' between undercut and lift off or grind and etch back could be in consideration of the type of etch and its selectivity in respect to choice of the 'cut layer' structure.

Many other variations of 3D system could be constructed utilizing techniques presented herein or in incorporated by references. In some applications, the peripherals circuit could be placed on more than one stratum. This could be used for memory partitioning to small units such that the area of a unit is too small to fit all the require memory control on a single stratum. For example, the upper most stratum may be control logic to control about the upper half of memory stratums while the lower most stratum may be control logic to control about the lower half of the memory stratums.

Another approach that could leverage such monolithic 3D technology is multiple port access to the memory array. This could also include non-symmetrical multiport access, such as one access port could access single unit, while another access port could access multiple units. This multiport non-symmetrical access could be achieved by controlling the access to the segments of word-lines and/or bit-lines. The access from the top and the access from the bottom could be independent, yet synchronized. In such, for example, the wordlines and bitlines could be accessed by per unit memory control from the top control stratum, while the bottom control stratum provides access to the same word-lines and bitlines with multiple units control, providing one memory port access per unit from the top, while the bottom control stratum could provide access to a block of memory that could include multiple units.

The 3D memory architectures herein constructed with arrays of memory units each comprising memory strata in which every stratum has at least one select controlled from the overlaying and/or underlying memory control stratum, and the multiple options opened up by such architecture including yield repair, local and global access, is applicable to many memory technologies, including volatile and non-volatile. These architectures benefits are applicable to many of the 3D integration techniques presented herein including epitaxial based with shared lithography and layer stacking with grind and etch-back. A technologist in the art of memory systems could engineer a specific system leveraging the techniques presented herein.

FIG. 24B illustrates a generic 3D memory structure "G3DM" which could be constructed according to the techniques presented herein. Such a 3D memory could include a controller to manage the memory including self-test and advanced refresh techniques. The 3D memory could include at least one or two stratum of memory control circuits, first memory control stratum 2448 and second memory control stratum 2452 and the 3D memory stack 2450. The 3D memory stack 2450 structure could be constructed and may include an array of memory units each with its own memory control structure as a tile of the 3D structure, it could also include 3D memory array structures such as 3D NOR or 3D NOR-P disclosed herein or elsewhere. It could be provided as a wafer ready to have additional customer specific circuits, for example, such as control and encryption, which could be similar to those presented in FIG. 24A 2436, 2438. And it could be constructed on top of a 'cut-layer' so it could be cut over other structures. These additional integration steps could be done at a die level after dicing, or at a wafer level to be diced afterwards. Dicing afterward could be performed by: conventional saw dicing, laser assisted dicing, or etch assisted dicing. The structure could be useful to support more than one device size as previously presented forming a continuous structure which could be tiled to specific device size(s) near the final phase of the processing, thus allowing stocking of generic wafers, etc. The external surfaces such as 2454 could include the pads for the additional custom circuits to interface with. Alternatively, such external surfaces with the pads may be used for subsequent conventional chip packaging. The decoding circuits could be part of the generic 3D memory structure "G3DM" such as part of the memory control circuit 2448 or 2452, and accordingly the number of wires per such memory unit (about 200μ×200μ) connectivity with the customer specific circuits could be at the range of 30-100. Such connectivity could be readily achieved with today's face to face bonding capabilities. The G3DM could incorporate self-test to invoke redundancy memory stratum per unit at product release and also during normal operation to extend operations with self-repair capabilities. The G3DM could also include wireless test and report capabilities as discussed such as in U.S. Pat. No. 9,142,553 in reference to at least FIG. 24A-C and FIG. 48-FIG. 50. The system level memory structure herein could be used for many types of memory technologies and products. A very common memory technology is DRAM for which additional enhancements could be integrated in such high granularity memory structures. DRAM is known to require refresh with the common refresh cycle of about every 60 ms. The refresh rate is known to be driven by the worst case of relatively few memory cells that exhibit high leakage. Recent works have suggested adaptive refresh to reduce the refresh energy by adapting the refresh to those sections that require higher refresh rate while reducing the refresh rate for most of the device's cells. Such as presented in papers by Ahn, Jin-Hong, et al. titled "Adaptive self-refresh scheme for battery operated high-density mobile DRAM applications," published in Solid-State Circuits Conference, 2006. ASSCC 2006. IEEE Asian. IEEE, 2006; and by Mukundan, Janani, et al. titled "Understanding and mitigating refresh overheads in high-density DDR4 DRAM systems," published at ACM SIGARCH Computer Architecture News. Vol. 41. No. 3. ACM, 2013, all incorporated herein by reference. The high granularity of this 3D structure with arrays of relatively small sized units could enable deploying such techniques at the unit level, or even at a layer of a unit, so the refresh rate could be reduced to units that either have not be written into yet, or that exhibit lower leakage. In addition, for a unit in which all the memory layers are good, the choice of the unit to be left unused could be based on refresh needs. The partition to units with the associated reduction of the wordlines and bit-lines length could itself reduce leakage and accordingly the required lower refresh rate. Alternatively these techniques could enable the reduction of the DRAM capacitor size for some application which could enable significant overall memory cell size reductions.

Memory centric applications such as intelligent systems or search applications could be implemented as a memory focused processing system utilizing such 3D systems as is illustrated in FIG. 24A. In such a system, a new approach could be used, instead of the conventional processor centric approach in which data is transferred to and from the central processing unit, transfer the processing to where the data is. As an example, the dashed border 2462 of FIG. 24A may represent a database stored in the memory 2430 associated with people in city A while the dashed line 2464 indicates data bank stored in the array 2430 associated with people in city B. And if a search is needed in respect to city A the program performing the search could be transferred to the processing unit in the logic layer 2436 located in the area marked by 2462, while the program code related to a search in city B could be transferred to the processing core located in the region marked by 2464. Memory centric system operations could leverage the 3D computer system illustrated herein as a new compute paradigm. The program or code itself could also be stored in the memory matrix 2430. An additional option is to run parallel processing on the memory stored in the memory matrix 2430 converting it from one form to another form. There are many forms of data transfer such as from amplitude domain to frequency domain, often called Fourier Transform. Another type of transform is to form multiple feature plans with one or very few bits from a many bit per data point representation, which is useful for technique for brain inspired algorithms.

An additional alternative is to replace the per level select transistors such as illustrated in FIG. 22D, FIG. 22E, and 2244, 2248 of FIG. 22F and 2314, 2318 of FIG. 23A with per level pillar for each wordline or bitline. Such could be desired in cases where the process used to form the memory array is not in good fit for the process to form such per level select transistor. As an example, such could be the case in advanced DRAM process. For such the sequential per-level select staircase structure presented in reference to FIG. 22A-22B could be used for each wordline and/or for each bitline. The drawback of not having per level select transistors is the additional in-between units distance 2241 needed for the per-level pillars. The area associated with the vertical pillars 2246, 2258 could be now multiplied by the number of levels. Accordingly it could be preferred to do so for either the bitlines or the wordlines. Additionally it might be preferred to have the unit not as square. Accordingly the structure could be designed so for example the bitlines (L-BLj) of all levels use the same pillars (G-BLj) while only the wordlines (L-WLj) (use per-level pillars (L-G-WLj), and having the unit wordlines much longer than the bitlines such as 50% longer or even 100%, 150% or even more than 200%, reducing the effective overhead of the vertical stacking. The recent progress in wafer bonding as was announced in mid-2018 by EVG for 50 nm worst case misalignment and the expectations for further improvements in the future, makes such a per-level pillar approach a very practical option.

Figure 24D:
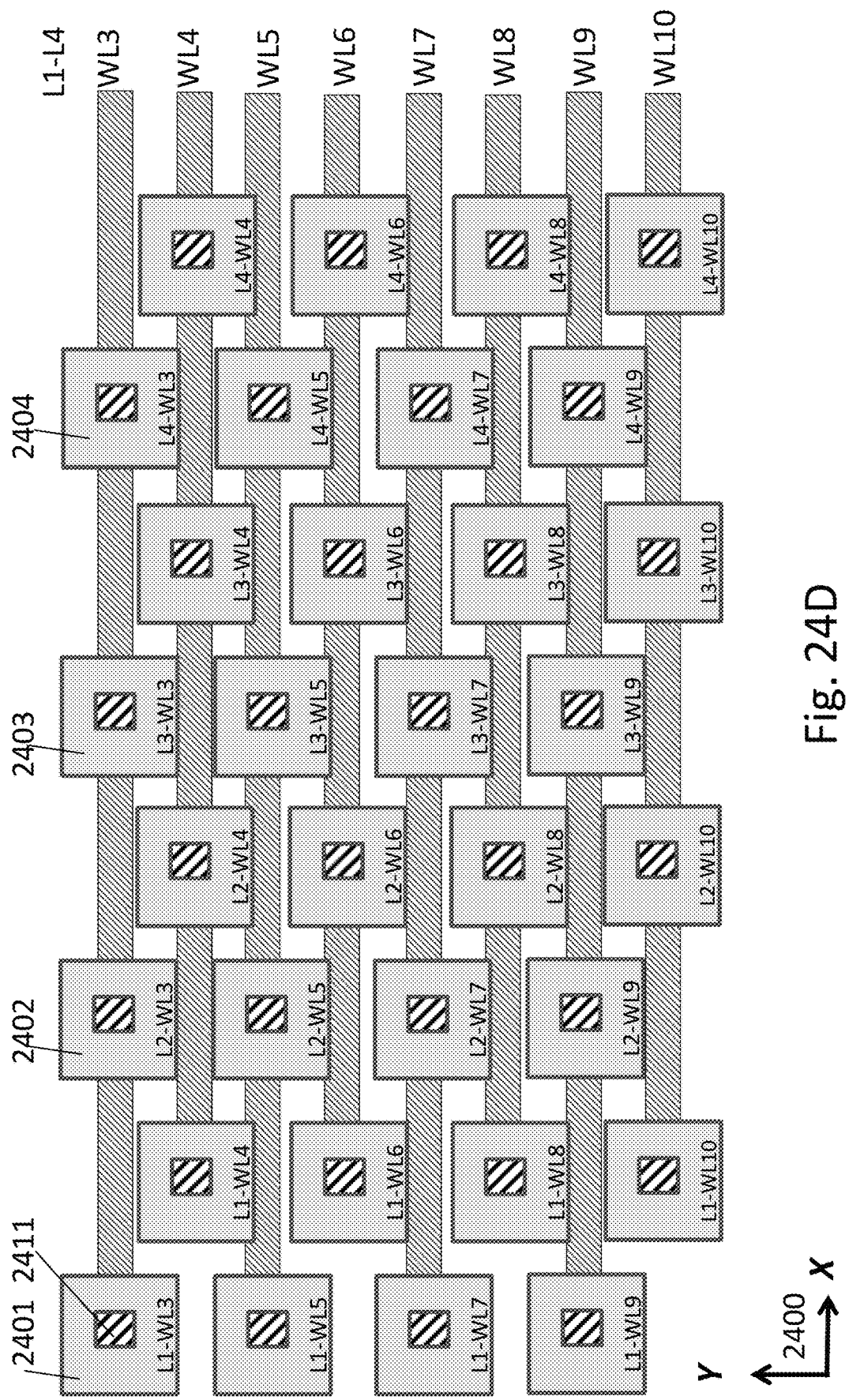
FIG. 24D is an example illustration of section with wordline with per level pillar.

FIG. 24D is an X-Y 2400 top view of a section of such per level pillar concept. It resembles FIG. 21C with 90° shift as it shows the pillars for the wordlines (WL3-WL10). Unlike FIG. 21C it assumes that the bonding misalignment is below 50 nm so for a boding pin 2411 of square 50×50 nm the landing pad 2401 could be about 14=50×150 nm sq., and for wordlines having a pitch of 100 nm the spreading of the landing pads could be one every 150+50+150+50=400 nm. FIG. 24D illustrates the structure supporting stacking of four (L1-L4) memory levels. So the line WL3 represent four wordlines for level 1, level 2, level 3 and level 4 overlaying etch other, and using structure like in reference to FIG. 22B to bring the four per level global wordline for WL3 (L1-WL3, L2-WL3, L3-WL3, L4-WL3) to top pads 2401, 2402, 2403 and 2404. It should be noted that FIG. 24D illustrates an ideal scenario in which all four level are in perfect alignment. In real life these layers would have some misalignment which could be accommodated by having large enough landing pads. In the example related to FIG. 24D with 50 nm maximum bonding misalignment the overhead for the per level pillars (no per level select transistors) could be about 4×400=2,000 nm which is about 1% for a unit with wordline length of 200 micron. The Y direction for the bitlines could be about 400 nm as all levels could share the same bitline global pillar. A different example could be of a non-rectangular unit having wordline length of ~100 micron and a bitline length of 32 micron. For such small unit the overhead could be still only about 3.2%.

The memory control circuits 2432 and/or 2428, also often called the memory periphery circuits, could include decoders, sense amplifiers and additional circuits for the specific memory 2430. For the case of per level pillar the circuits driving the word-lines or not-lines pillar (2401-2404) could include first the level selects similar to the one in reference to FIG. 22D or FIG. 22E. And then connecting them together forming the global word-lines effectively like G-WLi (or G-BLi for the bit-lines). Alternatively other types of circuits could be designed taking advantage of direct and independent access to each level.

The memory control circuits 2432, 2428 could be designed to be transferred on top of the memory multi-level stacks with the control transistors facing down toward the memory stack, or first be transferred onto a carrier wafer and then be transferred on top of the memory stack, resulting in the control transistor facing up away from the memory stack. Similar alternatives are available for the control circuits under the memory stack 2428. While FIG. 24A illustrated a 3D system with one memory stack, the techniques presented here could be used to construct 3D systems with multiple memory stacks and their control including multiple processing levels. The memory control circuits could be designed to support sharing access to a memory unit from closely located processing units. Such could allow system agility to support advanced effective data transfer or overcoming defects in some of the processing units.

Figures 25A, 25B, 25C:
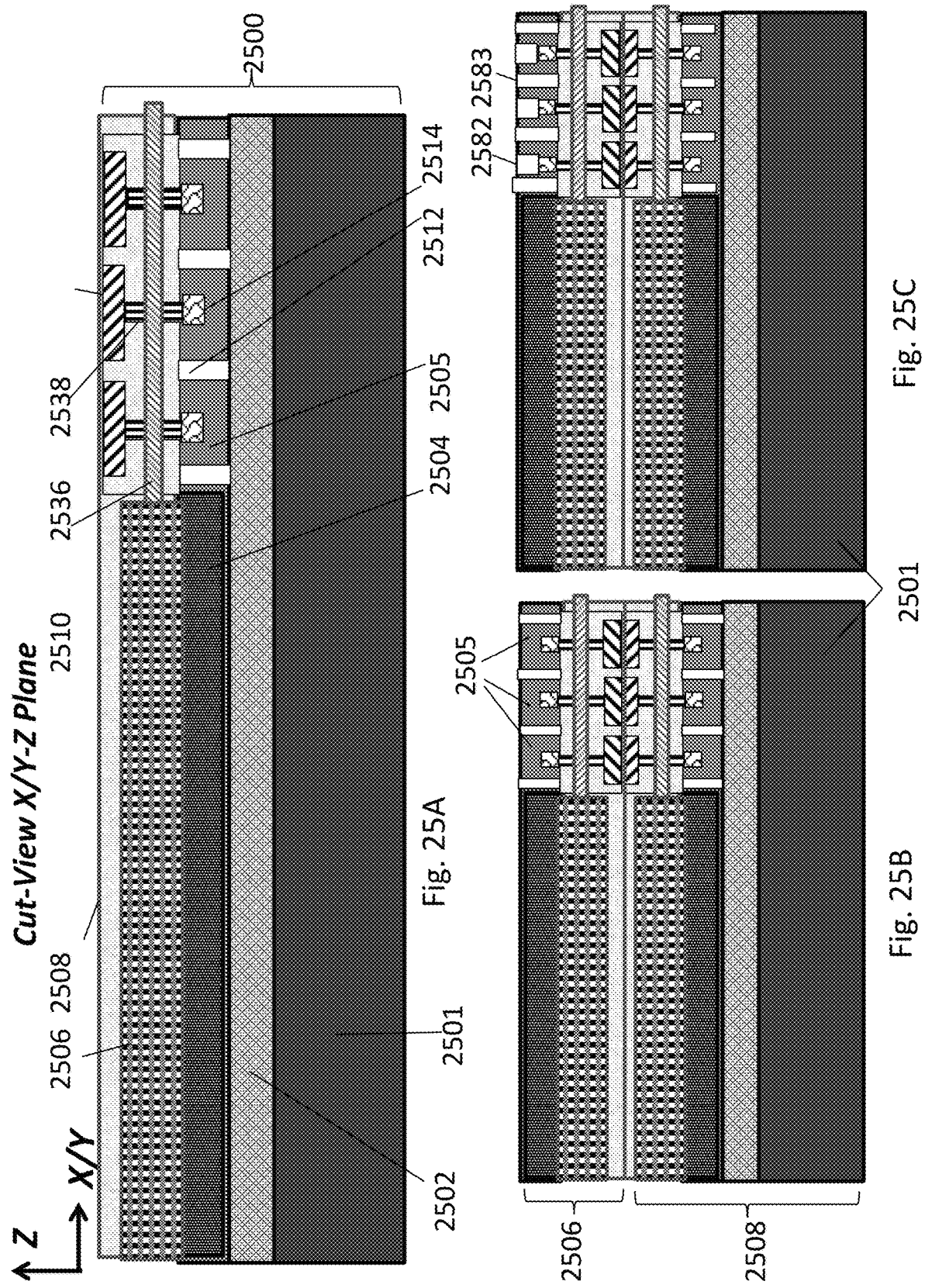
FIGS. 25A-25D are an example illustrations of an alternative flow and structure for 3D stacking without changing the main processing of the memory/logic.
Figure 25E:
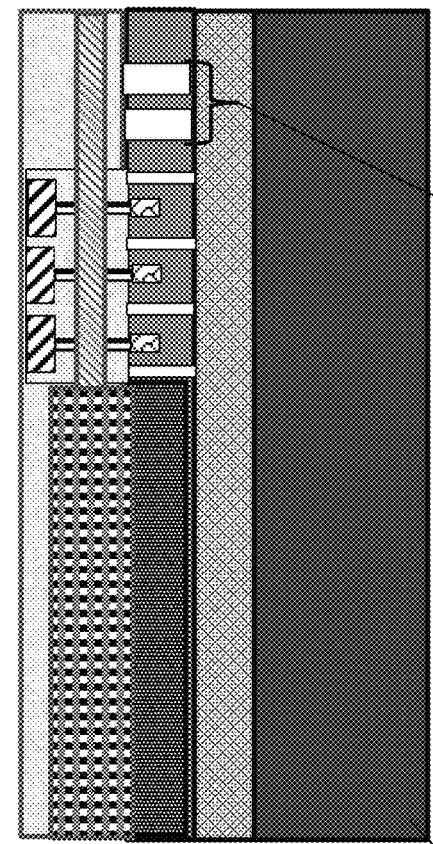
FIG. 25E is an example illustration of forming alignment marks for the method and structure of FIGS. 25A-25D.

Another alternative for constructing a 3D memory stacked structure is to reduce changes in the memory wafer processing and compensate by adding process steps to the stacking process. FIG. 25A illustrates structure 2500 as alternative in respect to the structure of FIG. 21E. A wafer substrate 2501 with cut-layer 2502, memory semiconductor structure 2504, memory interconnection structure 2506 and oxide layer 2508 may be formed. The in-between units control line 2510, through memory via 2536 and connecting pads 2538 are formed similar to those of FIG. 21E. The difference is that the in-between silicon 2505 is not etched away but rather shallow trench isolation 2512 and bottom dummy contacts 2514 are added, using conventional memory processing. The bottom dummy contact 2514 may be formed at the same step as the source and drain region of memory bit cell formation. The bottom dummy contact may be an n+ diffusion region. The through memory vias 2536 are connected to the respective bottom contacts 2514. FIG. 25B illustrates this alternative in respect to FIG. 21H after having a structure such as 2500 flipped and bonded to similar structure 2508, and have it substrate and cut layer removed, thus shown as processed bonded layer 2506. Then, vias 2582 could be opened by removing silicon 2505 to expose the bottom side of the bottom contacts 2514 as is illustrated in FIG. 25C. If the STI 2512 of the standard process are not deep enough, then the via formation process could include the STI locations to etch through to assure full isolations of the vertical connection from the substrate and each other, thus forming full etch structures 2583. Alternatively, the silicon at the regions could be first etched out and replaced with isolation material. Then add landing pads 2522 on top of bottom contact 2514 as is illustrated in FIG. 25D, to prepare the structure for the following layer.

An additional step could be added which is forming alignment marks for this stacking process. The bonding alignment mark could be included in the metal layer as the bonder could see these alignment marks from the top view of the wafer. FIG. 25E illustrates the structure of FIG. 25A with alignment marks 2532 utilizing the STI process. These marks could be used once the wafer has been flipped and the substrate and the cut layer have been removed. Other alternatives could be the use of an ion implant process or leveraging the contact process for the alignment marks.

Additional steps that could be taken in the memory fab to help the following stacking process could include using a lithographically defined doping process. FIG. 25F illustrates an optional use of N+ doping for extending the contacts 2514 into the silicon with conductive N+ silicon 2534 reducing the need of forming the metal connections illustrated in FIG. 25C-25D 2502, 2522. Such N+ doping can be accomplished by adding extra high dose deep ion implantation in the memory wafer fab or even attainable using a part of a standard process step. The depth of the N+ layer may be the substantially close to the body thickness of the stratum to be transferred, so that the N+ regions play as nano-TSVs.

Figure 25G:
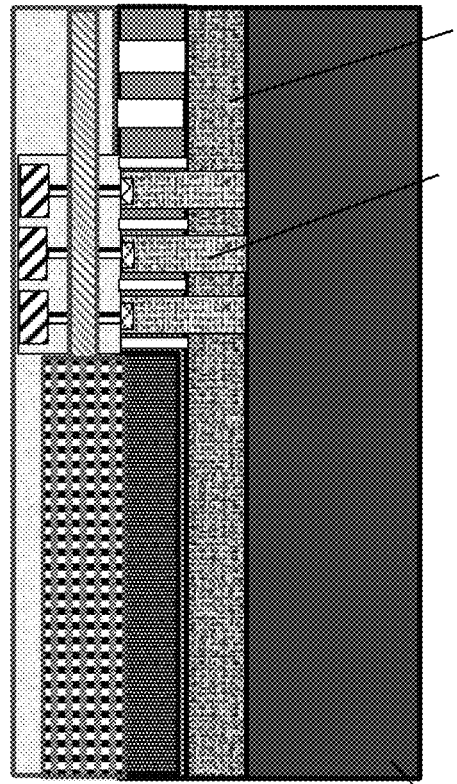
FIGS. 25F and 25G are example illustrations of using a lithographically defined doping process to simplify 3D stacking.
Figure 25D:
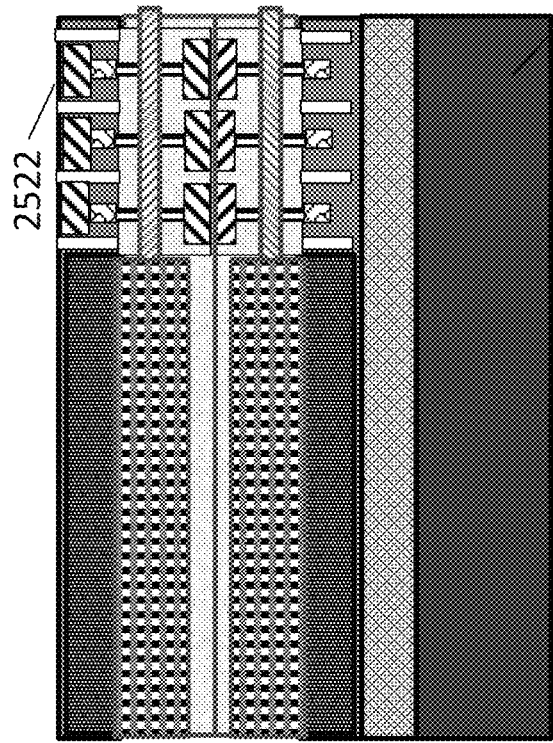
Figure 25F:
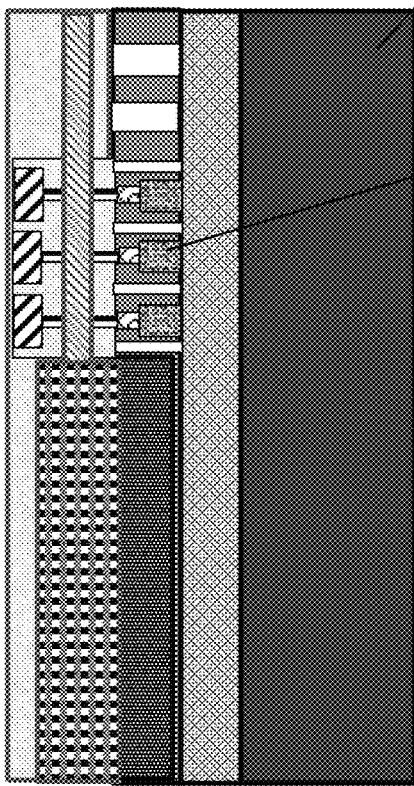

FIG. 25G illustrates an optional use of N type silicon as the cut-layer 2540, and leaving the regions 2536 for the nano-TSV as P−. Once flipped and bonded, the process of substrate removal using the N as etch stop could allow etching these P− regions 2536 exposing the contacts 2514. Filling with conductive metal and then removing the excess using processes such as CMP would make the stack ready for the next stratum. As discussed previously, the selective etch of P silicon to N silicon could be an anodizing process which would first etch the P silicon to become porous and then the porous silicon could be selectively etched away. Utilizing these techniques the memory array wafer could be processed using a standard memory process or such with simple changes, and then stacked using simple processes that could be just bond, grind and etch, or with some additional steps as presented herein.

As a general note, the use of top pad and bottom pads herein are exchangeable as with the use of layer transfer techniques. These structures could be flipped for specific applications using the presented technology and strictures herein. In some cases there might be a need to flip the layer before bonding it to the target wafer. A carrier wafer, such as presented in at least U.S. Pat. No. 8,273,610, incorporated herein by reference, could be used to support such flipping. The carrier wafer could also leverage techniques presented herein in respect to the term "cut layer", and could be designed to be grind and etched out, or to be reused having it 'refurbished' and used again. Additional techniques for such a carrier wafer could be to form a porous layer at the top of a carrier, such as presented in respect to the ELTRAN process, without the need for the epitaxial step but rather just use it with silicon top or add oxide for the bonding. Another option is to use a wafer with a thick oxide and/or a nitride cover of a few microns and optionally add grooves at the dice lane or between lithographic projection fields. Then detach the carrier wafer by a though-side etch leveraging the very high selectivity of etch rates between silicon and oxide or nitride. An additional alternative is to implant ions such as a combination of helium and hydrogen and then use low temperature (~400° C.) ion-cut for detach. An example for a need of flipping is in a case when the desired landing pads 2006 are in a range of about 200×200 nm$^2$ or about 400×400 nm$^2$ while the designated location for these pads might be desired for operating silicon. In such case, a via smaller than 100×100 nm$^2$ through the transferred silicon film (strata) could be used and the landing pads could be constructed over the carrier wafer, once the layer was transferred onto the carrier wafer.

An additional enhancement could be by adding to through-strata-via that we could also call a through-layer-via "TLV" such as illustrated in FIG. 20H including top landing pad 2054, a via or chain of vias 2050, and a bottom connection pad 2052. Such connection path might serve as path through without connecting to other elements within the strata it is passing through. It could allow signal paths through such as connecting signals between first memory control stratum 2448, of FIG. 24B, and second memory control stratum 2452 without connecting to any element within the 3D memory stack 2450. Furthermore, a plurality of dummy vias not connecting any pad may be included to improve process uniformity, serve as mechanical support, or in some application when it is desired facilitate heat dissipation, such as thermal pipes and paths to an external surface of the device.

An example for such a feed-through TLV is illustrated in FIG. 24A. A base wafer carrying, for example, processors and other circuits 2410, 2424, could be sourced from conventional 2D fabrication process and facility. It could include connecting pads on its upper surface. Then a wafer carrying multilayer memory strata 2430 with its memory control circuits 2428 could be bonded on top of the sourced wafer forming the connection between the standard flow wafer and the stack memory and control circuits. Then using the feed-through TLV connections could be made with the upper stratum 2436 which could include the I/O circuits to interface the 3D system with external devices. These could also include wired connections such as, for example, pads, balls or pins, or wireless systems such as electromagnetic, optical, etc. This heterogeneous integration supports the use of different device crystalline material, RF, Analog and other forms of heterogeneous integration. Such could include magnetic films using technique such as presented in at least U.S. Pat. Nos. 9,337,251, 9,357,650, 9,357,651, 9,647,053, 9,679,958, incorporated herein by reference. These ferromagnetic films could be added to construct an on-chip inductor using standard metallization layer(s) with high quality factor for voltage regulators or RF transceiver/receiver to improve the 3D system effectiveness and capability.

A standard wafer fabrication technology or baseline technology could be established for the memory per unit pin out position and function. That standard wafer fabrication technology or baseline technology could also be used for the custom logic design so it could integrate the generic memory wafer presented herein, for example, by bonding. Each standard wafer could include alignment marks for the custom logic top layer to help align the generic memory wafer during the bonding process. The standard wafer could include processing cores compatible with the size of the memory unit such as, for example, about 200 μm by 200 μm, a street width between units such as, for example, about 1 sm. The signals to be connected in-between such as: 40 pins for address, 16 pins for data, 10 pins for control (such as read and write) and 4 pins for pass through paths. Some of these pins could be defined in the industry standard as expansion options or to allow more than one memory type or architecture. With about 100 pins per unit, the area for each pin could be about 20 μm by 20 μm, which allows the use of most wafer bonders available currently in the industry. Additionally, the generic memory and control stack could be designed to be about 50 μm thick so it could be shipped, handled, and bonded by industry standard processes and machines. Such could become also a standard for which the memory stack could include a path-through the interface layer with the proper thickness so the total stack would be about 50 μm thick. For example, for a 16 memory layer stack of 1 μm each and control stratum with I/O stratum of 2 μm, the stack thickness could be about 18 μm, and a path-through layer of about 32 μm could be bonded on top to bring the overall stack thickness to about 50 μm thick, compatible with the current industry capability. The pass through paths could be built using technology such as TSV to pass, for example, the approximately 100 signals from the generic memory to the custom 2D processor device, to the processor device such as based on planar, SOI, FinFET, or gate-all-around technology.

Figure 32C:
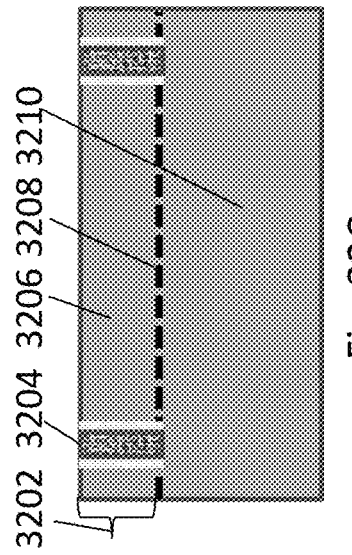
FIGS. 32C-32D is an example illustrations of formation of through level paths through for the 3D system.
Figure 32D:
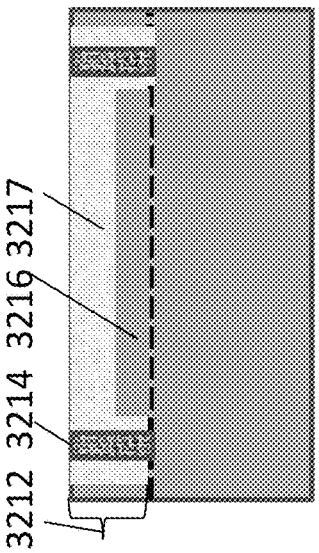

FIG. 32C illustrates such 'pass-through add-on structure' 3202 constructed within a silicon wafer substrate, having base substrate 3210, designated cutline 3208 that could be formed by cut-line technique presented herein or just by timing the grinding and etch once bonded as it design to be many microns thick. The 'pass-through add-on structure' could include pre-built isolated TSV 3204 to function as the conductive feed through. An enhancement of such 'pass-through add-on structure' is to have it function also as a thermal isolation between the heat generating processor and the memory stack, for example, as is illustrated in FIG. 32D. The enhanced 'pass-through add-on structure' 3212 could have some of the silicon 3206 be replaced by etch, deposition and planarization with thermal isolating material 3217 such as silicon oxide. With feed-through TSV 3214 and the remainder of the silicon substrate 3216 similar to those illustrated in FIG. 32C. Those 'pass-through' structures could be reserved for the arbitrary purpose that can be determined later by the system designer. The strata containing 'pass-through' structures may be a generic product such as memory, sensor, power, or communication chip. Alternatively, use of such feed-throughs could be, from the processor logic in the logic layer 2424, to the I/O layer 2438 to connect to an I/O or analog function being placed on the 2438 layer, or to interconnect memory control layer being placed on top 2432 and under 2428 the memory structure 2430. Such could be used to coordinate use of the redundancy control function between the top control 2432 and under control 2428. An additional use could be to coordinate dual control to support multiport access to the same memory matrix.

The technique of using a precise bonder with staggered pads on word-lines or bit-lines presented in respect to FIG. 21A-21C, could be used to add memory control logic over 3D memory such as 3D NAND or 3D NOR. This could be an alternative to the technique presented here in respect to FIG. 12-FIG. 18. An advantage of a staggered pads approach could be the parallel processing of the memory and memory control which then could be integrated into a 3D device by bonding.

The stacking techniques presented in respect to FIG. 20A-FIG. 25G, and FIG. 32C-32D could be extended to 3D memory such as 3D NOR. Such could include stacking multiple strata of 3D NOR each having multiple layers of memory. In such case, the per layer select transistors of FIG. 22D-FIG. 22E could become per memory strata select. This per layer select transistors could be implemented within a control stratum on top or below the multilayer memory strata or alternatively without such control stratum but rather in the memory structure such as by doubling the ridge select transistors to have to serial transistors instead of the one ridge select transistor. In such case, one transistor could function as the ridge select while the other could be globally controlled by the per layer select signal SLi, effectively providing strata select to support simple vertical stacking. This could allow use of the same memory control circuits to control multiple strata with relatively simple additional control and z-decoding circuit to control the strata select signals. Such stacking could include periodical stratum of rebuffering and redrive to support the relevant control lines.

Additional option is to stack different memory type. Clearly stacking could include many type of stratum, yet the unique aspect of the stacking technique herein is to form vertical connection of the word-lines and the bit-lines while having per strata select line such as SLi of FIG. 22D-22E. These word-lines and the bit-lines could control a plurality of memory types including volatile and non-volatile. Sharing these memory control lines could allow efficient form of memory structure and in some cases, could even allow direct data transfer from one memory type to another memory while keeping some of these control line unchanged reducing power for such data transfer and reducing time for such transfer.

An additional step that could be included in the preparation of 3D memory structures for stacking is adding bonder alignment marks. Precise bonders generally need alignment marks to align wafer to wafer. These alignment marks could be incorporated in the proper location on the top and/or bottom layers of the 3D memory wafer structure using a proper mask of the 3D memory structure such as in a nonfunctioning zone over the wafer such as in-between memory structures.

The technology for precise wafer bonding is being enhanced, recently demonstrating the improvement of wafer to wafer alignment tolerance from 200 nm three sigma to 50 nm. These works have been reported by papers such as by Peng, Lan, et al. "W2 W permanent stacking for 3D system integration." *Electronics Packaging Technology Conference (EPTC), 2014 IEEE 16th*. IEEE, 2014; by Sakuma, Katsuyuki, et al. "Bonding technologies for chip level and wafer level 3D integration." *Electronic Components and Technology Conference (ECTC), 2014 IEEE 64th*. IEEE, 2014; by Sugaya, Isao, et al. "Precision wafer bonding process for future cost-effective 3DICs." *Advanced Semiconductor Manufacturing Conference (ASMC), 2015 26th Annual SEMI*. IEEE, 2015; and by Kurz, Florian, et al. "High Precision Low Temperature Direct Wafer Bonding Technology for Wafer-Level 3D ICs Manufacturing." *ECS Transactions* 75.9 (2016): 345-353, all of the forgoing are incorporated herein by reference.

An additional option to accommodate large total stacking misalignment is to build the relatively larger landing pads and pins over the memory unit. This way the space 2311 between the memory units could be kept relatively small while the landing pads could be made large enough to accommodate the total error which could include the bonder alignment error or/and the die placement errors. Such over the array pads construction could add costs associated with the processing of such over the array pads and additional per stacking layer costs in the stacking fabs to build these extra layers of landing pins. FIG. 25H-FIG. 25J could illustrate such over the array connectivity structures. FIG. 25H is lower portion 2560 is similar to FIG. 25A. The upper portion 2561 illustrates the landing pads 2550 constructed over the memory bit cell array 2556. These landing pads are connected to the respective bit-line or word-line by via 2552, connection wire 2554, and via 2562. These additional metal layers are added on top of the isolation covering the array 2558 and are with the additional isolation material 2557. It might be desired to have two versions of over the array pads: one with landing pads 2550 and one with landing pins 2570 as illustrated in the lower part of FIG. 25I. FIG. 25I illustrates bonding such a wafer with large landing pads 2550 on top of another such wafer with landing pins 2570. FIG. 25J illustrates the structure after removal of the top substrate and SiGe layer and constructing landing pins 2572 or alternatively large landing pads (not drawn) for the following stacking step. Artisans in the art could mix and match this alternative stacking option to the specific 3D system design.

The 3D memory stack herein enables stacking multilayers of memory stratum in which the vertical connectivity is at the word-line and bit-line level. Such 3D stacking enables use of a memory control for multiple memory stratums thus reducing cost in addition to benefits in performance and power reduction. Yet vertical connectivity at the word-line/bit-line level could be a technology challenge as the high pitch of these memory control lines may prevent the use of techniques such as 'smart-alignment' as there might not be enough room to run TLVs through. For such cases the Hybrid/Fusion bonding techniques presented herein, at least in respect to FIG. 21A-FIG. 25J, are an effective technique to provide word-line/bit-line level 3D connectivity.

The 3D memory stacking presented herein could be modified to accommodate technology limitations or cost objectives. Such modification could include connecting only the bitlines at the unit level while connecting the wordlines at a far courser granularity or vice versa (connecting the wordlines at the unit level and the bitline at the bank on multiple unit level). Other modifications could include staggering the layer select transistors position of FIG. 22D or FIG. 22E, to accommodate the high metal pitch of the respected control lines. Another modification could be to position the connecting pads for/on odd control lines in one side of the unit and for/on even control lines on the other side of the unit thereby resembling the structure illustrated in FIG. 12C-12E of PCT/US2017/052359.

An additional alternative to a form buried cuttable layer is to replace the buried SiGe with oxide, nitride or other layers. This could be done following a step of isotropic etch as has been described, such as in reference to FIG. 21. This could use deposition techniques such as ALD or other conformal deposition techniques to refill the etched-out space with a proper dielectric material. This could be done while forming and keeping posts to hold the top silicon layer or in two steps; first portion and then additional etch and replace the remaining portion. Following the replacement an epitaxial process could be used to seal the entrance holes 224 (with reference to FIG. 21). This could be done for the whole wafer or at selective sections for specific applications. This could be done as part of forming a generic substrate or per a specific application. The replacement could be done for specific circuit considerations, for example, such as substrate capacitance, or back bias, or back gate. This could also be done to support any of the 3D integration flows such as presented herein for which the replacement material could be later etched with a much higher selectivity. For example the selectivity of dry etch of nitride vs. silicon could be set to be 2,000:1, which is much higher than the selectivity of SiGe vs. silicon. This could also be done in combination with bonding to another substrate and detaching with a finishing process such as residue etch CMP and epitaxial. This flow could also be done as an alternative process for the formation of SOI substrates, and may have lower cost to manufacture compared to the current methods. This could also be done using a stain etching to convert the SiGe layer to porous layer as previously presented herein.

An additional alternative for a 'cut-layer' is to use a single atom layer of Graphene as presented in a paper by Kim, Jeehwan, et al., "Principle of direct van der Waals epitaxy of single-crystalline films on epitaxial graphene." Nature communications 5 (2014); and Yunjo Kim, et al., "Remote epitaxy through graphene enables two-dimensional material-based layer transfer" published at NATURE|VOL 544|20 Apr. 2017, incorporated herein by reference. It was discovered that a single atom layer of graphene being placed on a single crystal substrate could allow a single crystal epitaxial growth on top having the base crystal orientation and quality. Yet the layer grown on top of the graphene could be pulled off as the graphene layer has "weak van der Waals interactions, and which also allows facile layer release from 2D surfaces". Enabling "the grown single-crystalline films are rapidly released from the graphene-coated substrate and perform as well as conventionally prepared films". Accordingly, such a single atom graphene layer could serve as alternative to the porous layers described herein or combined with such or other forms of 'cut-layer' presented herein. The base substrate could be reused after 'cutting' off the functional layer. A graphene cut could be used in a similar way to the original concept of porous layer for formation of SOI wafer as was named ELTRAN by Cannon.

Many mix and match of these cutting techniques could be utilized for different product formation and related flows. One such mix could be used for die to wafer 3D integrations as discussed in U.S. patent application Ser. No. 15/095,187 (now U.S. Pat. No. 9,721,927) and Ser. No. 15/173,686 and herein. So, the cut of the 6 microns thick die could use the graphene as the cut layer but then the following a step of thinning the layer after being bonded to the target wafer, and could leverage the SiGe etch selectivity for etch and controlled thinning to below 1 micron to allow a simple process with nano-TSV through (with less than 400 nm via diameter) the thinned die.

An additional technique that could be used for a 2D material such as Graphene as a 'cut layer' is an oxide type post that could be etched out prior to the layer transfer step. As the substrate with a cut layer being built in could go through the full front end of the line processing and some back of the line processing before the layer transfer, it could be desired to add in such posts to keep the stability of the structure for the various processing steps prior to the transfer step. Using a modified STI step, holes could be etched all the way through the graphene into the underlaying substrate, and filled with oxide. These holes could be made in the dice lanes. Then as one of the last step before performing the layer transfer operation these oxide posts could be etched away releasing their hold. Additionally, these in the dice lanes could be extended to a full dice lane etch so that in the layer transfer step each die may be peeled off independently from the other dies.

The release process could include a polymer or other material such as nickel to help form a stress which together with temperature, such as liquid nitrogen or less than 400° C. degree spike heating, could help the detach and release of the re-useable substrate from the 3D structure comprising the target wafer and the bonded transferred layer. An alternative technique could include the use of pulling 5-30 micron thin layers off reusable wafers using a technique called controlled spalling such as presented in papers by Shahrjerdi, Davood, and Stephen W. Bedell. "Extremely flexible nanoscale ultrathin body silicon integrated circuits on plastic." Nano letters 13.1 (2012): 315-320; and by Bedell, Stephen W., et al., "Layer transfer by controlled spalling." Journal of Physics D: Applied Physics 46.15 (2013): 152002; and U.S. Pat. Nos. 9,698,039, 9,704,736 and 9,713,250, incorporated herein by reference. A reusable "cuttable" substrate could be constructed using the following steps; 1) Form the thin layer with desired silicon thickness on top of a SiGe etch stop layer using an epitaxial process over a donor wafer. 2) Form a reusable carrier by growing 3-10 micron thick oxide (or nitride) over a silicon wafer. 3) By using controlled spalling pull out a 5-10 micron layer off the silicon over SiGe (top Si/buried SiGe/fractured bulk Si stack) from the donor wafer and bond it on top of the reusable carrier, thus forming the reusable "cuttable" substrate. Optionally, the fractured surface portion of bulk Si maybe treated to be planarized for better bonding to the reusable carrier. The reusable "cuttable" substrate could now be processed with building the desired circuits on top of it. Then it could be bonded on top of a target wafer. Then using selective oxide or nitride etch from the side of the wafer, the bulk of the reusable "cuttable" substrate could be detached leaving over the target wafer the circuits and the layers previously bonded to the 3-10 micron thick oxide. Than using SiGe as an etch stop, the 5-10 micron silicon could selectively etched followed by a SiGe etch. In the process the edge of the wafer could include protection of the interconnect layers to protect them from the side oxide detaching etch.

The 'cut-layer' technology presented herein could also be used for applications requiring a very thin device. An example of such application is integrating a semiconductor device in a contact lens or in application requiring a very flexible circuit layer. In these applications the ability to use a standard semiconductor fabrication process following by thinning the device thickness to a few microns or hundreds of nano-meters or even less, could be key enabling technology.

An additional inventive embodiment for a 3D memory constructed of arrays of relatively small memory units, with the memory control circuits on top or under of such memory units relate to the ability to perform per unit refresh and other techniques to extend memory effectiveness. This could be applied for DRAM type memory as presented herein before and also for non-volatile memory such as charge trap, floating gate and ferro-electric based memory. These memory units could have an X direction and/or Y direction size of a few tens of microns, or a few hundreds of microns. For example, son of the general concerns with memory structures relate to disturb and other forms of losing memory fidelity. These could impact the level of memory density utilization. With such a 3D memory system as illustrated in FIG. 19A, the control system could copy the contents of a memory unit to cache storage, erase the unit and re-write the content to restore memory fidelity. These refresh cycles could be performed based on time or activity of that memory unit. These refresh operations could be performed at a time there is no active use of the memory so auto-maintenance could be performed. FIG. 27 of PCT/US2017/052359 illustrates a block diagram for such a refresh operation flow. Such a refresh could extend the effectiveness of the memory by enabling a greater number of bit site locations with the memory cell and a greater number of storage levels within such storage sites.

FIG. 26A illustrates an X-Y-Z 2600 embodiment of 3D stacked memory. It illustrates per level memory control pillars 2603, similar to the ones in reference to FIG. 24D. The 3D stacked memory example includes four memory levels. The 3D stacked memory is referred to herein could be at full wafer level or as memory dice. The stacking process could be done at wafer level and diced afterward or in combination with dice levels such as presented in U.S. Pat. Nos. 10,014,292 and 9,721,927, incorporated herein by reference. The memory level may be any semiconductor type memory, for example, such as DRAM. SRAM. Flash, MRAM, PRAM, or RRAM. The memory levels may be the same type of memory or the memory levels may consist of combinations of different types of memories. In one embodiment, the memory dice may include four levels of DRAM as illustrated in FIG. 26A and FIG. 26B. But the embodiment is not limited to any particular number and type of memory level in the memory dice. A memory dice may be two levels of SRAM. Alternatively, a memory dice may include a DRAM memory level and a Flash memory level. The memory level could consist of just memory cell elements without logic functions such as level select, core logic circuit including row decoder, column decoder, sub-wordline driver, sense amplifier and peripheral circuit including control logic and I/O interface. The memory dice may be further coupled with the logic level. The memory control level may include core logic circuit including row decoder, column decoder, sub-wordline driver, sense amplifier and peripheral circuit including control logic and I/O interface. Additional processing circuits such as custom SoC could be integrated into the memory control level or be integrated in the 3D system on an additional level. The memory dice may be divided into a plurality of memory 3D mats of memory overlaying memory units. The memory mat is a vertical slice or portion of 3D stacked levels as illustrated in FIG. 26C. The memory cells in the same 3D mat of the dice may share the core logic such as row decoder, column decoder, sub-wordline driver, sense amplifier. The plural core logics in the logic level may share the peripheral circuit.

At least one type of control lines from wordlines and bitlines of each memory levels could have its own per level vertical connection to the logic level. In the illustrations of FIG. 26A and FIG. 26B, the wordlines of each memory level have its respective per level vertical connection to the memory control also called logic level while the bitlines of each memory levels could use common connections to the logic level. Depending on the types of memory used to configure the memory dice, the memory dice may further include other vertical connections such as power (Vdd), ground (Vss or GND), capacitor plate voltage (Vcp), body bias (Vbb), and any other control voltage associated with operating the memory cell.

The memory level of the memory level may be similar to its neighboring memory levels. An exemplary section of memory level is shown in FIG. 27A, an X-Z 2700 cut and FIG. 27B, a Y-Z 2701 cut. The memory level includes arrays of memory cells, control lines such as wordlines and bitlines, per level stair (step via), and through vias. The vertical connect structure—the stairs, as referenced in FIG. 22A, enable the formation of the per-level select pillars, as referenced in FIG. 22B. This illustration suggests the use of a staircase for the wordline while the bitline uses a common pillar. The memory level may further include a cut layer in the bulk region of the substrate. The cut layer may be an end-of-range region of hydrogen ion implantation, buried oxide, buried SiGe epitaxial region, or buried porous semiconductor region. The vertical pillar for the bitlines is illustrated in FIG. 27B and FIG. 27D. FIG. 27C illustrates a level transfer and the final memory structure.

FIG. 28A and FIG. 28B show one embodiment of arrangement of wordlines, bitlines and bonding pads in planar view. In this embodiment, the staircase bonding pads of wordlines for the odd row and the even row are formed in the east side or the west side of the memory unit, respectively, as shown in FIG. 28A, as an alternative configuration to the one in FIG. 24D. Additional advantage to such east west split is the added area in the memory control level to place the per level select circuits (such as in FIG. 22E). Similarly, the pillars for the bitlines could be split for the odd column and the even column and placed in the north side or the south side of the memory unit, respectively, as shown in FIG. 28B.

FIG. 29A illustrates a 3D memory stack device. The 3D memory stack device could include a peripheral logic level, which may be supplied as a known good die as illustrated in FIG. 29B. In this embodiment, the memory device may be configured to be compatible with the conventional memory protocol such as DDR. GDDR, LPDDR, Wide I/O, GDDR. High Bandwidth Memory (HBM), and storage class memory (SCM). Another alternative option may be the memory stack coupled to the logic level that is larger than the area of the memory stack structure as illustrated in FIG. 29C and FIG. 29D. The larger area logic level may include not only core and peripheral circuits but also other system functions according to application. The other system functions may include PHY or SerDes interfaces for high speed interconnect. The entire system may be accessed by wire bonding as shown in FIG. 29C or microbump or TSV as shown in FIG. 29D. In this embodiment, the critical dimensions or technical node to implement memory levels and the logic level may be different. For example, the memory levels could be SRAM cell array based on 22 nm fully-depleted SOI technology and the logic level may be based on 14 nm FinFET technology. In the devices illustrated in FIG. 29A to FIG. 29D, the top memory level may be left without the base wafer cut-off and may be thinned down by conventional wafer backside grinding. Thus the top memory level may be thicker than rest of the memory level.

The 3D memory stack device could be coupled with core and peripheral logic and be supplied as known good die, the memory device may be use to configure an SoC, ASSP, FPGA, TPU, or FPGA as shown in FIG. 29E-29F. If needed, a redistribution level (RDL) may be further incorporated to match the set of 10 pads of known good die atop to the logic level underneath.

For high precision bonding, the industry is adopting a technique called fusion bonding. In fusion bonding, both wafers are aligned and a pre-bond is initiated. When bringing the device wafers together, wafer stress, local warpage, and/or bow can influence the formation of a bond wave. The bond wave describes the front where hydrogen bridge bonds are formed to pre-bond the wafers. Controlling the continuous wave formation and influencing parameters is the key to achieving the tight alignment specifications and avoiding the void formation noted above. The reason for this is that any wafer strain manifests itself as distortion of the wafer, in part due to lateral and vertical thermal non-uniformity and built-in bowing, which leads to an additional alignment shift Process and tool optimization can minimize strain and significantly reduce local stress patterns. Typically, distortion values in production are well below 50 nm. Indeed, further optimization of distortion values is a combination of many factors, including not only the bonding process and equipment, but also previous manufacturing steps and the pattern design. Once the initial bonding has been confirmed to meet the alignment requirements, an annealing step would take place to finalize the bonding process. So it desired to have the first bonding step, also called pre-bonding, at a lower temperature or even at room temperature thus reducing stress and expansion associated with an elevated wafer temperature. Only after good alignment has been confirmed will the bonding move to the second step at an elevated temperature to finalize the bonding. The elevated temperature could be higher than 100° C., or even higher than 200° C., and preferably lower than 400° C. There may be a need to control the ramp-up and ramp down rates of this thermal anneal of the final bonding step.

An additional option could be integrated with the proposed flows herein, that the additional bonding step could be used after removing the bonded wafer substrate 2146. Once the ~700 micron substrate 2146 has been removed the top structure left would be relatively flexible. Than applying pressure or thermo-pressure on it, could help to assure connecting pins to pad if those are not yet connecting 3002 due a thin gap left in-between.

Figure 30:
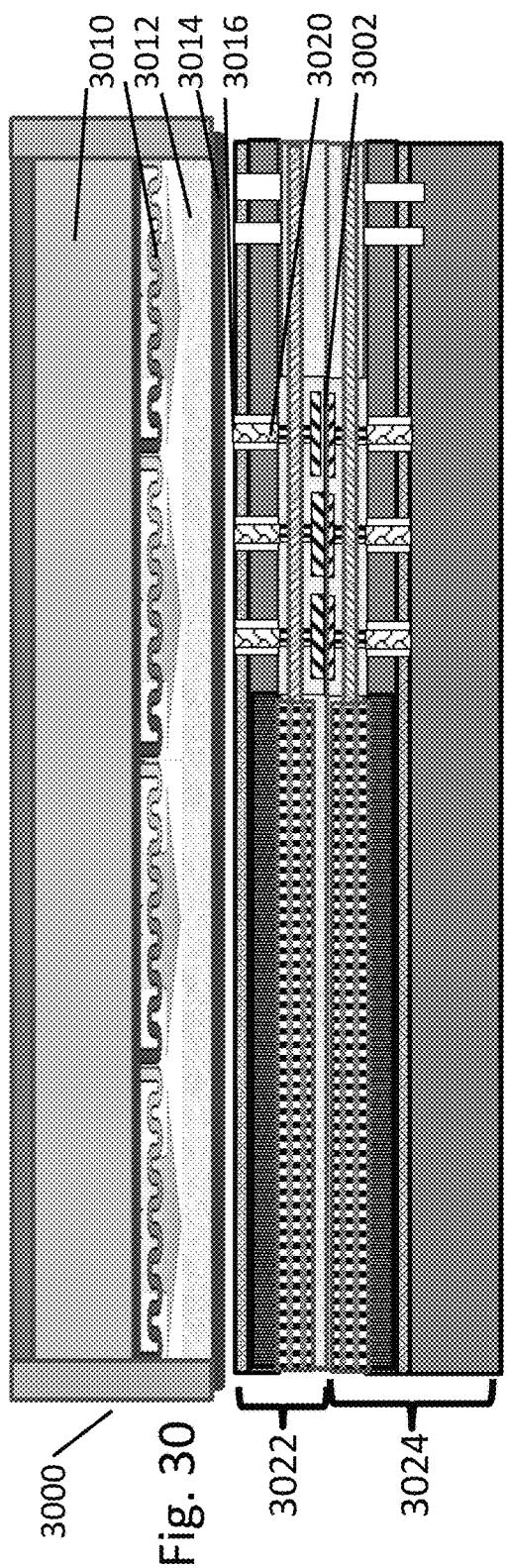
FIG. 30 is an example illustration of a special wafer chuck for wafer bonding.

For such pressure a special chuck could be used. The special chuck which we will call bonding-piston 3000 could have a flexible contact surface 3016, a fluid 3014, water or oil or option for such fluid, or sol/gel, or elastomer to distribute the pressure evenly, heating bodies 3012 segmented in multiple patterns and with independently temperature control and main body 3010. Alternatively, a flexible contact surface may be implemented by flexible and thermally conductive materials, such as, for example, doped elastic polymers. Using such bonding-piston 3000 the bonder could form an even pressure on the top surface of the bonded structure 3024, 3022 after the top substrate has been removed as is illustrated in FIG. 30. The top pressure on the thin and flexible top stratum 3022 could help push down the pin 3020 structure into the pad 3002 and a bonding could then be achieved by applying the annealing while the bonding-piston is pushing down on the pin 3020 and pad 3002 structures.

Additional step that could be used to enhance these pins to pads bonding is a light etch back of the top oxide surface just prior to bonding. A few nanometers of atomic layer oxide etch could make the pins and the pads to connect and bond first while the oxide would be connected and bond slightly later achieving mechanical strength from the oxide to oxide bonding while the metal to metal bonding also provides the electrical connectivity.

Additional findings related to fusion bonding have been detailed in work by Di Cioccio, L., et al., "An overview of patterned metal/dielectric surface bonding: mechanism, alignment and characterization" *Journal of The Electrochemical Society* 158.6 (2011), incorporated herein by reference. For instance, Cu—Cu bonds can occur at room temperature, without pressure normal to the bonding interface. The mechanism is as follows: below 200° C., Cu surfaces have an unstable copper oxide; when two Cu surfaces are brought into contact, the asperities make contact first; Cu diffuses across the copper oxide interface; the unstable oxide moves laterally; the asperities undergo plastic deformation; the contact area spreads along the oxide interface; eventually, a tough bond occurs (as seen in bond toughness vs multi-day storage time data). This process can be accelerated using a 200° C. anneal. Use of CMP, to reduce asperities and make the surface hydrophilic, could be important. "Dishing" of the Cu surfaces during CMP can either delay bonding, or prevent it altogether, on large-area bonds. Generally this can be mitigated by dividing the large area into a multiplicity of smaller areas. Dishing may therefore be less of a problem for 20 nm+/− bond areas. Especially as metal-metal contact areas shrink well below 1 µm, some copper oxide contact between small bond areas could be important to ensure bonding according to the preceding mechanism proceeds to completion. This realization suggests that some selective augmentation of the height over metal bond pads could succeed in producing a low-resistance, high-quality metal-metal bond. Graphene suffices for this purpose, especially as it deposits preferentially on Ni and Cu surfaces. A simple, slight oxidation of the bond pads could create a slightly raised CuO surface, to ensure mechanical contact prior to wafer- and contact-bonding and annealing.

Selective and/or preferential, maskless deposition of adjuncts onto the metal pads, prior to bonding, could suffice to produce a low-resistance, high-quality bond. Such deposition could be performed using atomic layer deposition (ALD). A list of such adjuncts includes, but is not limited to, the following: aerogels; MoS2; epitaxial perovskites; metals; SiC; porous Si nanowires; transition metal di-chalcogenides (TMDCs), such as WSe2, which additionally may be doped or activated in-situ using, for example, He or H2 plasmas.

Low-resistance, high-quality metal-metal bonds may also be affected using copper nano-pillars, as described in Lee, K. W., et al., "Novel W2W/C2W Hybrid Bonding Technology with High Stacking Yield Using Ultra-Fine Size, Ultra-High Density Cu Nano-Pillar (CNP) for Exascale 2.5 D/3D Integration." *Electronic Components and Technology Conference (ECTC)*, 2016 *IEEE 66th. IEEE*, 2016, incorporated herein by reference.

The specific memory unit architecture herein could help by having the pins and pads in the periphery of the memory array units. Additionally a patterned oxide etch could be used to further assist the process of bonding these memory strata.

An additional process embodiment that could be applied to this memory stratum is the use of electrical current to harden the word-lines and bit-lines global pillars. Current is used for Bridge-RAM and R-RAM to form conductive filaments to reduce resistivity as a technique to form memory. Similarly, current applied through the pillars could be used to further harden/improve the connection between the pins and pads and may overcome a thin oxide or other barrier. The location with incomplete bonding naturally has high resistance and the flowing current through such results in localized hot spot. Therefore, Joule heating is localized to the weak bonding region and thus selectively improves the bonding due to intermixing of the metal material or partially melting the metal. The design of the top most and the bottom most level could be such that it would enable such a current hardening without damaging the low voltage circuitry and circuit elements. Such techniques are commonly used for metal to metal antifuses as presented in at least U.S. Pat. Nos. 5,126,282, 6,529,038 and 5,986,322; all of the forgoing are incorporated herein by reference. Conventional and other stacking technologies have been presented in: Di Cioccio, L., et al., "An overview of patterned metal/dielectric surface bonding: mechanism, alignment and characterization." *Journal of The Electrochemical Society* 158.6 (2011): P81-P86; Di Cioccio, Lea, et al., "An overview of patterned metal/dielectric surface bonding: Mechanism, alignment and characterization." *ECS Transactions* 33.4 (2010): 3-16; Kim, Soon-Wook, et al. "Ultra-Fine Pitch 3D Integration Using Face-to-Face Hybrid Wafer Bonding Combined With a Via-Middle Through-Silicon-Via Process." *Electronic Components and Technology Conference (ECTC)*, 2016 *IEEE 66th. IEEE*, 2016; Liu, Ziyu, et al. "Room temperature direct Cu—Cu bonding with ultrafine pitch Cu pads." *Electronics Packaging and Technology Conference (EPTC)*, 2015 *IEEE 17th. IEEE*, 2015; Teh, W. H., et al. "Recent advances in submicron alignment 300 mm copper-copper thermocompressive face-to-face wafer-to-wafer bonding and integrated infrared, high-speed FIB metrology." *Interconnect Technology Conference (IITC)*, 2010 *International. IEEE*, 2010; Lee, Kangwook, et al. "Nano-scale Cu direct bonding using ultra-high density Cu nano-pillar (CNP) for high yield exascale 2.5/3D integration applications." *3D Systems Integration Conference (3DIC)*, 2016 *IEEE International. IEEE*, 2016; and Lee, K. W., et al. "Novel W2W/C2W Hybrid Bonding Technology with High Stacking Yield Using Ultra-Fine Size, Ultra-High Density Cu Nano-Pillar (CNP) for Exascale 2.5 D/3D Integration." *Electronic Components and Technology Conference (ECTC)*, 2016 IEEE 66th. IEEE, 2016, all of the forgoing are incorporated herein by reference.

An additional technology that could be utilized to achieve good metal to metal connection is ultrasound energy. Ultrasonic bonding has been used for years in wire bonding. An advantage of the use of ultrasound is having the energy focused in the bonding area allowing the processing to keep the overall temperature low, both to avoid forming defects in the semiconductor active devices and to reduce stress resulting from thermal expansion. For such processing, the chuck could include, for example, ultrasonic transducers instead of the heating elements 3012, or in addition to them.

An additional embodiment is to tune the ultrasound frequency to match the bonding pins self-resonant (natural) frequencies for even better targeting of the sonic energy to the desired pin-pad locations. Use of ultrasound for bonding has been reported in a paper by Xu, Penghui, et al., "An ambient temperature ultrasonic bonding technology based on Cu micro-cone arrays for 3D packaging." Materials Letters 176 (2016): 155-158; by Matheny, M. P. and K. F. Graff, "Ultrasonic welding of metals." Power ultrasonics. 2015. 259-293; by Iwanabe, Keiichiro, et al., "Bonding dynamics of compliant microbump during ultrasonic bonding investigated by using Si strain gauge." *Japanese Journal of Applied Physics* 55.6S1 (2016): 06GP22; and by Li, J., et al., "Interface mechanism of ultrasonic flip chip bonding." *Applied Physics Letters* 90.24 (2007): 242902; all of the forgoing are incorporated herein by reference.

A potential challenge for such a stacking process is wafer to wafer variations. There are many sources for such variation and some could be managed by sourcing the wafers in the stack from the same process line being produced, preferably from the same lot using the same stepper. Yet some times this might not be possible or there might be variations that are still too high. During wafer processing such variations could be managed by the stepper equipment periodic alignment and optical magnification or reduction to achieve layer to layer alignment with sub nanometer precision. In a similar way such could be done using thermal expansion to compensate for these local variations.

Figure 31:
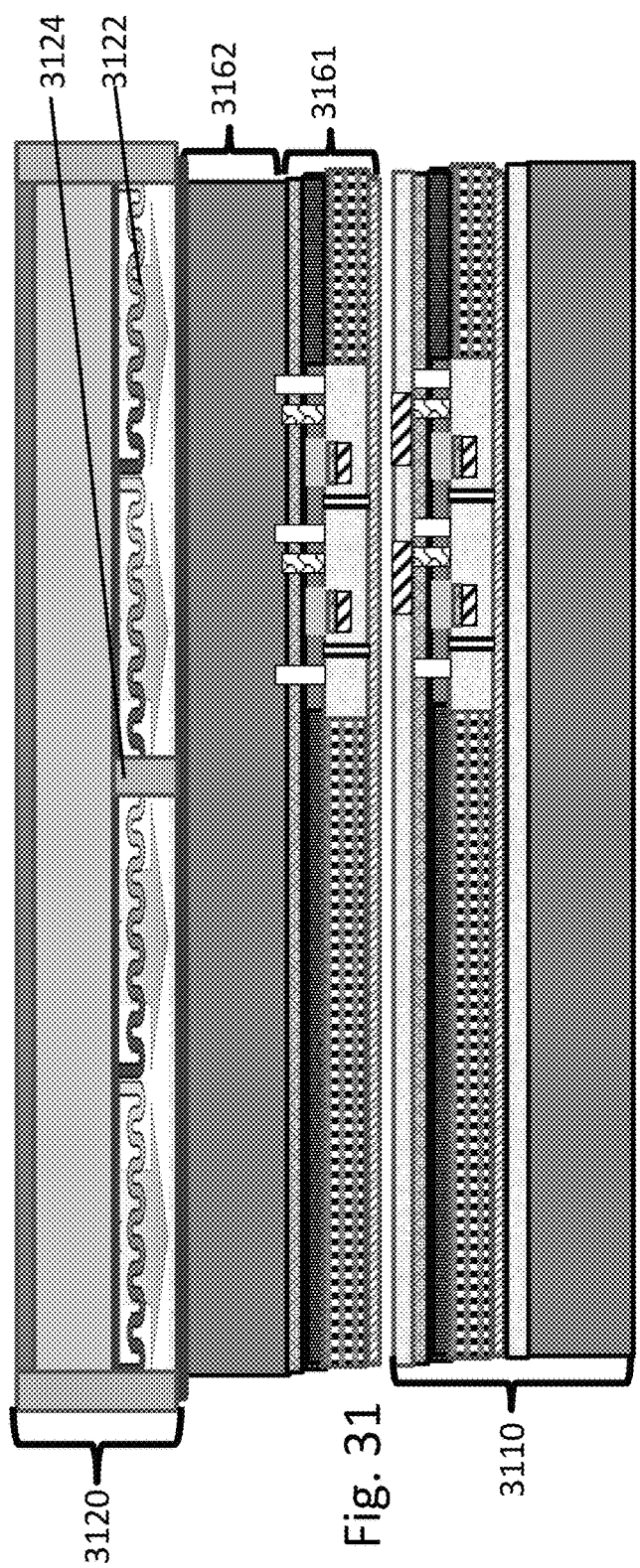
FIG. 31 is an example illustration of a thermal chuck with by area thermal control.

Accordingly the fusion bonding of the wafer described in at least herein could include a thermal chuck with area thermal control. For example, the thermal chuck can be divided into a number of tiles with the unit thermal control size such as at a reticle or sub-reticle level. FIG. 31 illustrates a section of the structure. A base stratum 3110 is being prepared to be bonded to an upper stratum 3161 having a substrate 3162. The substrate 3162 may have been thinned to about 50 microns. The chuck 3120 could have a thermal control 3122 allowing setting various local temperatures across the wafer. A prior optical measurement could be conducted to measure the required variation to achieve the desired face to face connection. The zones needing expansion could be heated up while the zones needing contraction will be heated less. Chuck 3120 may also include by area cooling functions and/or an entire chuck cooling function. Once properly set, the wafer could be bonded achieving good face to face connection. It could be desired to remove the substrate 3162 promptly to reduce the overall stress experienced in the structure. The design of the circuit in the upper stratum 3161 could account for the potential circuit variation attributes to the expansion or contraction required to achieve such face to face bonding connection.

The chuck 3120 structure could include thermal isolation structures 3124 so to allow better confinement of the temperature of each zone to better achieve expansion or contraction of different zones to better align to the bonding targets and control the bond wave more precisely. Chuck 3120 structure may include temperature measurement devices in each area zone, for example, with an embedded MEMS device/structure, thermoelectric heaters and/or cooling devices/structures, as well as local feedback/proportional control functions/devices. Chuck 3120 structure may include micro valves and channels for coolant or heating materials, such as liquids or gases.

A 3D system construction could use a mix of the technologies presented herein and the incorporated references. For wafers that been produced having precise wafer, reticle, and die alignment, a simple stacking process flow and tools might be good enough and then other wafers could be stacked on using more advanced techniques such as the Advanced Smart Alignment technique. These could be integrated with other bonding techniques such as using per zone temperature setting and filling/bonding and forming a via for connectivity afterward using techniques such as smart-alignment. Such mix and match techniques could be engineered to achieve the many times dissimilar objectives such as performance and cost.

Some of the stratum within such a 3D strata could include layers designed to function as, for example, an Electro Magnetic Field "EMF" shield, a power plane, a heat spreader, a heat isolation layer, or as some combination of such. For example, properly designed metal layer may provide some of the above functions. At least these functions and how to achieve them may be found in U.S. Pat. No. 9,023,688, incorporated herein by reference.

In reference to FIG. 25A-FIG. 25G, a 3D memory integration flow is presented designed to utilize existing memory process flows and add processes to form a stacking fabrication flow to enable the desired 3D memory integration. An additional alternative is use an existing SOI process flow, for example, such as is offered by Global Foundries with the commercial names: 12FDX, 22FDX and so forth. Utilizing an SOI process could match well the 3D stacking as the buried oxide ("BOX") could be used as the cut-layer just as the SiGe 2502 of FIG. 25A. An added advantage is that within such an SOI standard flow the STI depth is such to at least go thru and past the BOX and also there is a contact to the substrate below the BOX for body bias access and other functions.

The operation of such a 3D system could reference the memory fabric as a dual port memory fabric in which one side of the stack could be used to input and output data access, while the other side could be used for processing the data in the memory stack. Both operations could utilize the same pillars of memory control, preferably by synchronizing access. Such could include time slot allocation or space slot allocation. For example, for space slot allocation one processor could have two or more units in which processing is done in one unit while data input/output is done with the other unit.

An additional advantage to the memory architecture herein as illustrated by FIG. 22F is a flexible memory access. With the proper memory control, the processor access to the 3D memory unit could be to a single bit, 8 bits, 16 bits or even 2024 bits in one memory access. Alternatively, the processor access to the 3D memory unit can be segmented into per-block with arbitrary unit bits selected from single bit, 8 bits, 16 bits or even 2024 bits. This could allow an effective memory access per the designed need.

The recent adoption of neural net and learning algorithms suggests many simple operations, such as multiply and accumulate, to process a massive amount of data. In many of these systems the base elements are called neurons and may need three operand reads (since each neuron MAC operation requires 3 reads, weight, activation and partial sum, and one write-new partial sum). In AlexNet, a well-known reference network in the domain, 3 billion memory accesses are required to complete a recognition. The processor unit could use corresponding memory control circuits to fetch the three operand reads in parallel from its 3D memory unit, and once ready store the result back to its 3D memory unit. The number of bits for many of these processes is less than 16 per operand so more than one such neuron could be processed per one 3D memory unit. For example, with the area marked by 3264 could include a 3D memory unit having 8 levels of memories 3230, memory control circuits 3228 designed to provide three sixteen bit operands for one read, and a multiplier accumulator circuit within its processor fabric level 3224. In some memory structures there is a need for a sense amplifier to convert the signal on the bit-line to a logic signal useable for the multiply accumulation function. Such could require 48 sense amplifier circuits on the memory control level. Alternatively, a lower number of sense amplifiers may be provided and the signals are multiplexed in and buffered afterward.

An additional alternative is to mix processing to unit access with processing to clusters of unit access. Thus, in addition to read and to the same unit, the 3D system could be designed to support access to a group of units as just a bigger array. In such a mode, for example, the units 2231, 2232, 2234, and 2235 could be considered as a larger memory. To access the 2×2 units as a larger memory block the memory control of these units could be designed so the bit-lines and the word-lines are enabled to provide all the selected units; for example, using the vertical pillars 2256 & 2258 as BL access and the 2×2 block and the vertical pillars 2246 & 2257 as the corresponding WL access. Accordingly the exemplary 3D system illustrated in FIG. 24A could operate in a per unit mode in which read and write is per unit allowing massive parallel operation, and in another mode in which multiple units are functioning as part of a bigger array and data could be read or written across units. Such mode of data transfer between units could reduce the effectiveness of the system and additional techniques for across units data transfer could be useful.

Figure 32A:
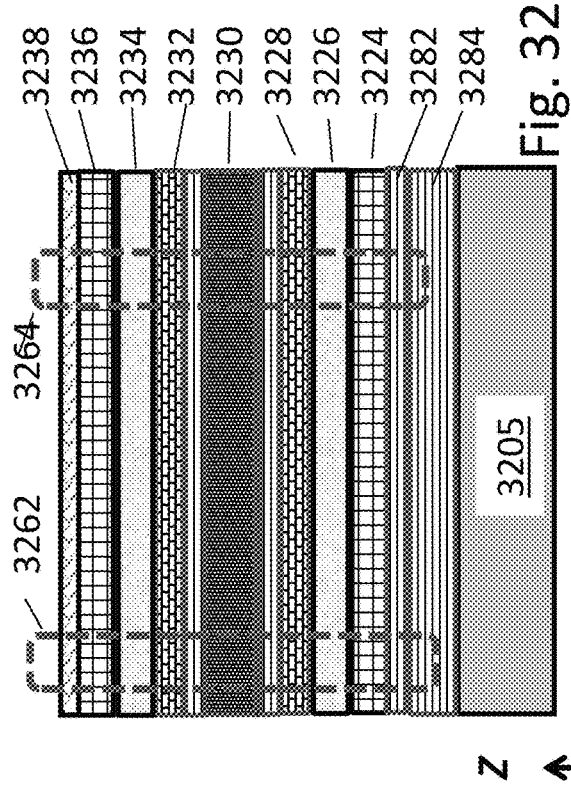
FIG. 32A is an example illustration of the 3D system of FIG. 2A with an additional level of global memory connectivity and associated additional stratum.

FIG. 32A illustrates the 3D system of FIG. 24A with an additional level of global memory connectivity 3284, connected with its own control logic 3282 to the per unit processor level 3224, having heat isolation layer 3226 disposed between the three (3284, 3282, 3224) aforementioned levels and the rest of the system. The global memory connectivity 3284 and control logic 3282 may be built on the same wafer. In a class of data intensive processors, such as could be designed for neural networks and deep learning, massive amounts of data need to be manipulated including transferring partial sums generated in computing data from one unit 3264 to be later process in another unit 3262. In many of these processes the data transfer is part of the matrix multiplication and could be done in regular processes in parallel between many units.

Figure 32B:
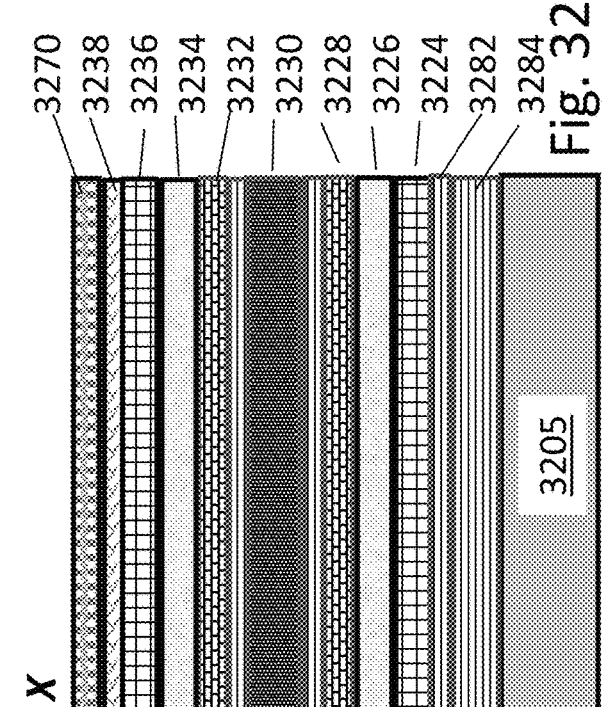
FIG. 32B is an example illustration of the 3D system of FIG. 2C with an additional layer of sensors.

FIG. 32B illustrates an additional alternative 3D system. It illustrates adding an additional layer of sensors 3270 which could be connected in parallel to the underlying structure. Such sensors could be image sensors or bio sensors for which the massive parallel connection between the sensing elements—pixel, and the control elements could be very effective.

An alternative fabric could include buses oriented in the X direction and buses oriented in the Y direction. Such buses could include eight to sixteen data lines: about six to eight unit address bits and two to four control signals. These buses could be a single line per bit or a differential line with two lines per bit. These buses could include re-buffering electronic support to reduce the effect of the line's RC. These buses could include mixed length buses such that cover of the full length of the system in the X or Y direction to buses that are shorter, such as a half-length, quarter length and so forth, down to the length of two units.

Figure 33A:
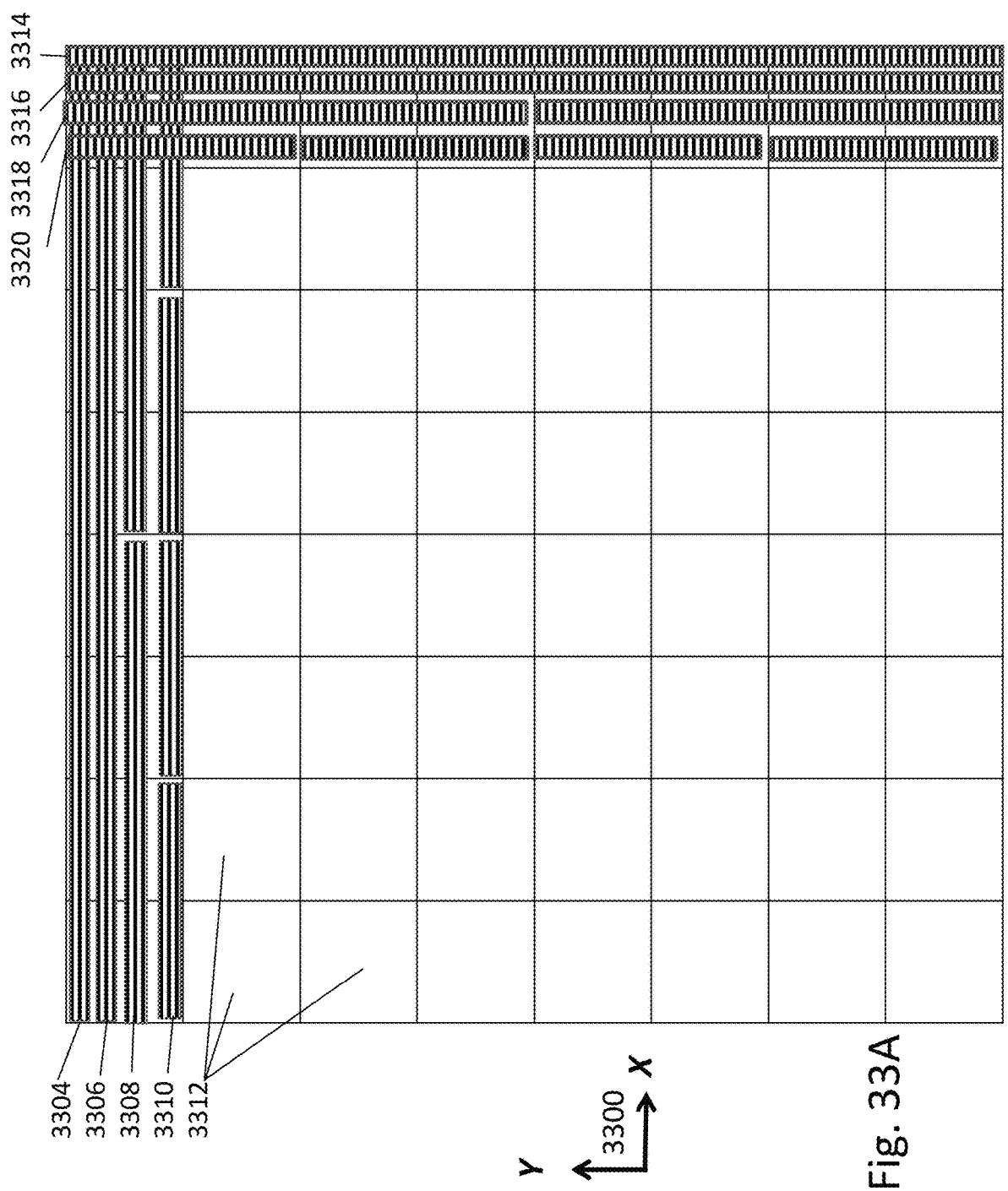
FIG. 33A is example illustration of an X-Y view of an 8×8 units 3D system having units with busses illustrated for one row and one column.

FIG. 33A illustrates an X-Y 3300 view of a 8×8 unit 3D system having a multiplicity of units 3312 with busses illustrated for one row and one column. It illustrates busses that extend through the full size 3304, 3306, 3314, 3316, busses that span four units 3308, 3318, and busses that extend over two units 3310, 3320. The 3D system could leverage many of the techniques used in GPUs to have control per unit as GPU has per processor and control of cluster of units or even the full structure similar to the central control of a GPU.

Figure 33B:
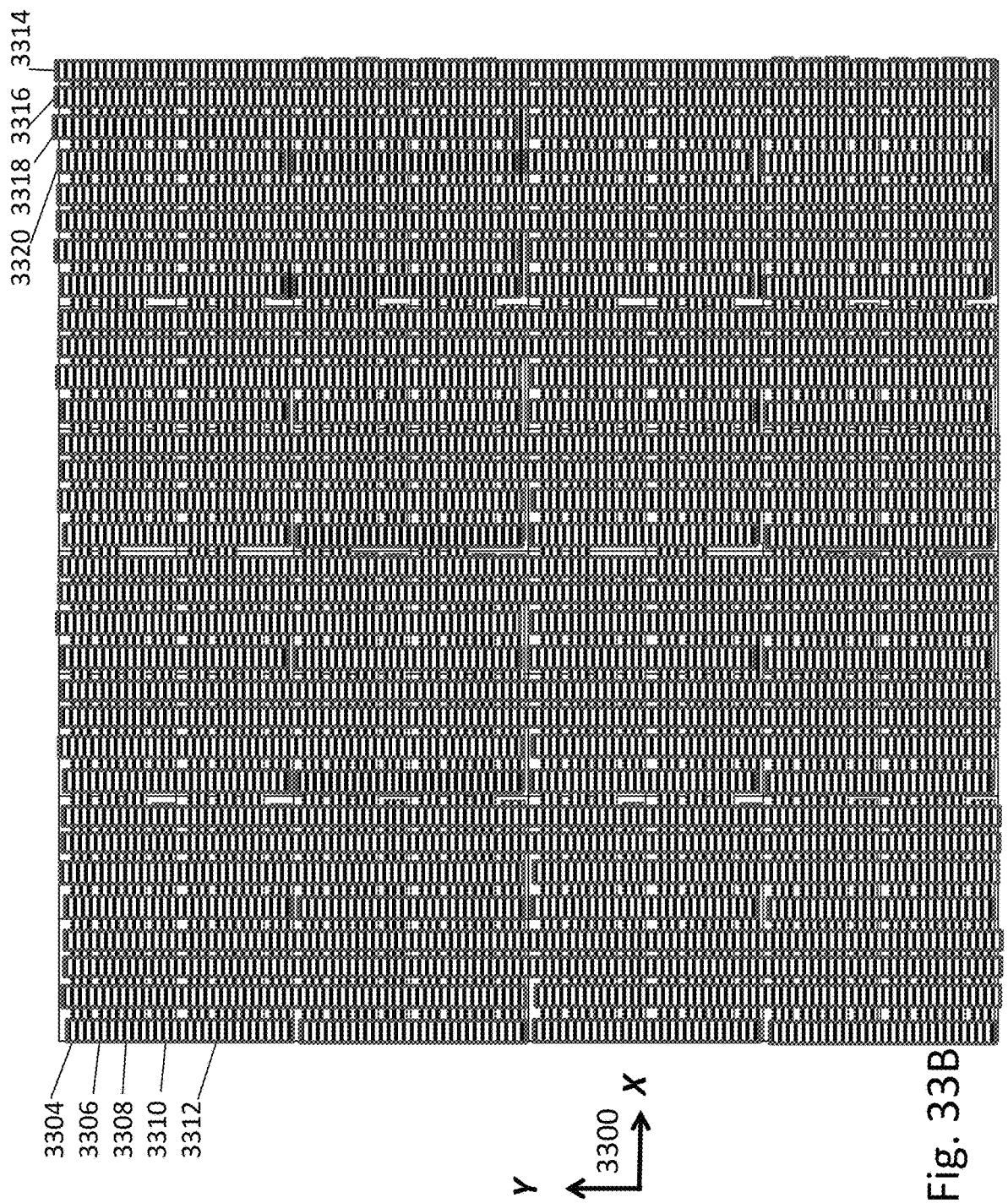
FIG. 33B is example illustration of an X-Y view of an 8×8 units 3D system having units with busses illustrated for substantially all rows and columns.

FIG. 33B illustrates the structure illustrated in FIG. 33A showing the buses overlaying substantially all units.

These across unit array data exchanges buses could be managed by the central system control circuits. These buses could function as a synchronized data exchange and could use differential data communication using centralized clocking to activate the active differential amplifiers to convert the differential signaling to conventional CMOS signaling, similar to what has been presented in U.S. Pat. No. 7,439,773, PCT/US2016/52726, and also U.S. Pat. No. 4,916,910, and U.S. application 2017/0170870, all are incorporated herein by reference.

As a general note we described herein or within incorporated documents a memory structure and variations. Their are many ways to form other variations of these structures which an artisan in the semiconductor memory domain may form by the presented elements described herein. These may include exchanging n type with p type and vice versa, increase density by sharing control lines, silicidation of some silicon control lines, improve speed and reduce variation by strengthening bit-lines and word-line with upper layer parallel running and periodically connected metal lines (strapping).

In general, as previously discussed the 3D stacking flow presented herm could be used for 3D memory structures just as for 2D structures and could be engineered by an artisan in a memory art for mix and match. For 3D memory the level select could become the structure select. Such as discussed before, adding additional transistors into the word-lines or the bit-lines to select a 3D structure of multilayer as a multi-floors level. It could be desired to have additional set(s) of pads and pins to allow vertical connectivity also for the per layer contacts. Accordingly the memory control accesses the memory stack just like accessing a single memory structure as they are connected in parallel while the selecting of one structure in the stack is achieved by activating its level select (LS). As had been discussed before in such architecture the memory matrix could be structured as a matrix of units each about 200 microns by 200 microns. Current state of the art of 3D memories (3D NAND) are approaching ⅞ layers yet with a height of about 6 microns. Many such 3D memory structures could be stacked before the unit height approaches its X/Y size.

Figures 34A, 34B:
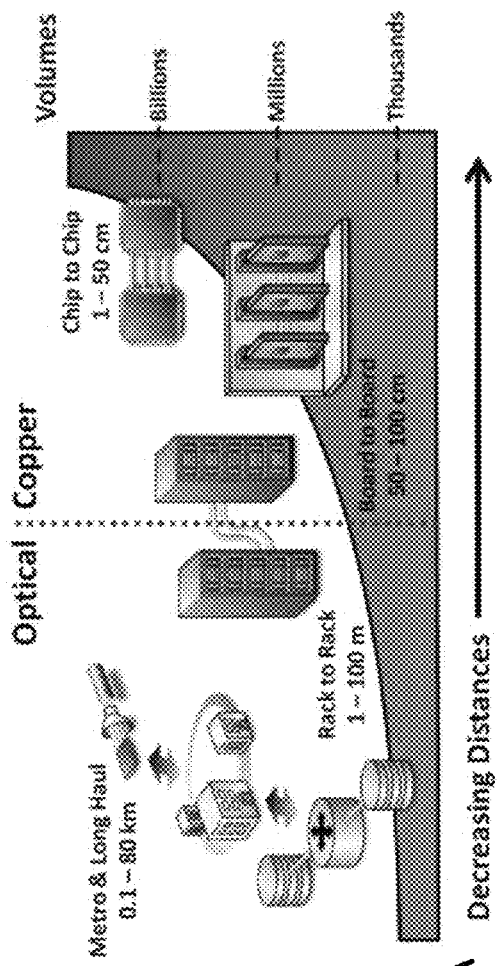
FIGS. 34A-34B are example illustrations of on-chip optical interconnect ("OCOI") state of the art presentations.

A modular 3D IC system, as disclosed here utilizing arrays of units each with its unit 3D memory cell block, memory control circuit block, processing logic block, and I/O block, needs good in-plane (X-Y) lateral interconnect such as high throughput and low power consumption for system level functionality. While the out-of-plane (Z) vertical interconnects are formed having vertical vias with diameters of nano-meter sizes (10 nm-200 nm) up to micron sizes (3-20 μm) and relatively short heights of equal or not exceeding the back side to back-side ground die thickness, such as less than 50 μm, the interconnect length of horizontal in-plane direction (X-Y) remains at millimeter sizes, from die level (3-16 mm, for X and Y sides), reticle level (20-30 mm), to multi reticles, and up to wafer sizes (60-300 mm). Clearly the interconnect challenge is now greater for the X-Y interconnect. The propagation delay and power dissipation using low-resistance metals such as copper and low-k dielectric material may have a switching frequency limit in the 10 GHz range, which will end up impeding the 3D system performance improvement. The optical interconnect in X-Y allows an enormous bandwidth increase as well as immunity to electromagnetic noise and chip temperature variation. Furthermore, the optical interconnect decreases power consumption. In reference to FIG. 33A-33B herein, conventional on chip metal interconnect techniques were presented. In the current art, optical interconnects have recently become common and many off-chip systems use optical interconnects which utilize optical fibers. FIG. 34A-34B illustrates the state of the art as was reported in papers by M. Paniccia and J. Bower, "First electrically pumped hybrid silicon laser," pp. 1-27, 2006, and B. J. Offrein, "Optical interconnects for computing applications," SEREC, 2009, incorporated herein by reference. Some research and academic work has been published suggesting on-chip optical interconnect ("OCOI") but as FIG. 34B indicates such seems still to be a futuristic idea.

The monolithic 3D technologies presented herein and in the referenced works could be used to simplify the challenge and enable 3D integration of optical on-chip interconnect to further enhance such 3D systems and allow efficient X-Y interconnect across or among 3D SoC (System on Chip) or other 3D devices.

An important aspect of the monolithic 3D technologies is the enabling of heterogeneous integration, in which one level (wafer) is produced using process and material to fabricate logic devices while another level (wafer) is produced using different process and different materials to fabricate on-chip optical interconnect devices. Furthermore, these levels (wafers) would likely be made in different locations and/or wafer fabs. Then using a layer transfer process, one level is transferred over the other enabling fine vertical (3D) integration between the two.

The on-chip optical interconnect level could include more than one sub-level, for example, such as a passive photonic device level(s) for signal routing such as wave guides, photonic crystals, and resonators, and an active device level(s) such as photo-detector and light source (for example, a laser). The photo-detector and light sources can reside in its own different levels or they can be in the same level but with the two made with different substrates knitted tighter side by side. For example, the photo-detector may be based on germanium, the light source maybe based on III-V semiconductor, and the passive devices may be based on silicon (core)-silica (cladding) structures. The logic level itself could include many levels as illustrated in FIG. 32B.

The optical modulator which is controlled by an electrical driver connected to an electrical logic block may be inserted between a light source and a waveguide. The optical modulator combines an optical structure and an electrical structure. A PIN diode and microresonator make an optical modulator in one embodiment. A MOS capacitor and a Mach-Zehnder interferometer make an optical modulator in another embodiment. Any of those optical modulators may be monolithically integrated as a part of the waveguide.

In one embodiment of the 3D SoC, the on-chip optical interconnect level may use a single wavelength point to point link (1-1 link), single and multiple wavelength point-to-many broadcast (1-n link), or multiple wavelength bus and switching (n-n link). The 1-1 link may be used in data-intensive links such as processor-memory buses. The 1-n link may be used to replace the clock distribution network and eliminates the use of several hundreds of repeaters, which used metallic interconnect. Herein, n represents an integer number larger than 1. Current technologies support optical interconnect such that a wave guide could allow many electrical input ports to add optical coded data to be transferred by the waveguide and many output ports to sense the data in the waveguide and to form electrical data outputs based on the optical data in the waveguide. This could be called an n-n optical link.

In another embodiment of 3D SoC, only the light source may be off-chip whilst the rest of the optical components are integrated on-chip. The light source and on-chip optical interconnected 3D SoC may be implemented using multi-chip module technology.

In one embodiment of optical interconnect 3D SoC, the wavelength of the light source may range from 1.3-1.55 µm. Alternatively, wavelength division multiplexing (WDM) may be used. Each individual wavelength signal does not interfere with another wavelength while a single wavelength could be used to replace a multiple bit bus. Therefore, WDM provides a very high data rate beyond any single wavelength device bus data rate.

The choice of layer transfer technique could be engineered based on the specific choice of substrates of the various levels, fabrication line and so forth. Techniques such as ion-cut which was detailed in respect to at least FIG. 14 of U.S. Pat. No. 8,273,610, incorporated by reference, and in many of the presented 3D IC flows in it. U.S. Pat. No. 8,273,610 presents multiple techniques to repair the damage formed during the ion-cut process such as in reference to at least its FIG. 184. This challenge is significantly reduced with respect to optical level transfer as these optical elements are far larger and less sensitive to transfer precision compared to advanced logic transistors. Alternative layer transfer techniques using porous layer and known as ELTRAN technology, such as detailed in respect to at least FIG. 22-FIG. 27D of U.S. Pat. No. 10,014,292, incorporated herein by reference, could be used. Another layer transfer technique which could fit well has been presented such as in respect to FIG. 44A-FIG. 45D of PCT/US2016/52726 incorporated herein by reference, and in respect to FIG. 1A-FIG. 6D herein. Or variations of these layer transfer technologies could be used. Using precision wafer bonders such as the one produced by EVG, presently named Gemini FB, with "face-to-face bond aligner with sub-50 nm wafer-to-wafer alignment accuracy" may facilitate the layer transfer.

Optical interconnect could be used to complement the metal interconnect for X-Y connectivity of a 3D IC system. At relatively long in-plane distances such as 5 mm, 10 mm, 20 mm or even longer than 40 mm, optics provide higher speed and lower power dissipation. The capacitive load and on-resistance impede the metal connection performance. Optical wave guides could be used for simultaneous transfer of multiple signals using modulation techniques similar to those used in fiber optic communication systems. But unlike electrical connections, optical wave guides need far larger dimensions, which imply that the optical wave guide profile is sized in microns rather than in nanometers. A layer transfer based optical interconnection could be to leverage a generic optical connectivity fabric. Such could be transferred and reused over different designs, allowing each design to use the generic optical fabric in a different way. Such a generic fabric could include wave guides going though across dice lines and across reticle borders. As discussed in many of the incorporated art herein, 3D devices could include redundancy and repair technology to allow a very high level of integration including a finished device/system size of, for example, a reticle size, a few reticle sizes, or even wafer level, known as wafer scale integration ("WSI"). For some of those techniques, a generic fabric represents a challenge of dicing metal lines which may need an etch step and sealing material deposition to be included. An optical wave guide could be diced without the need for such etch or addition of sealing layers to protect the device as the optical waveguide in most cases is formed by isolation layers which do protect the device from external humidity, etc. This could be part of the engineering & design trades made by an artisan skilled in the art. Such makes the concept of one or more generic optical connectivity layers an attractive option to support different system configurations which could include dicing for different sized base devices customized for the specific target application. Stress relief layers may be added in-between the optical (Ge, SiGe, etc.) and the Si circuitry—so after layer transfer and bonding they are between the optical and other layers. Silicon dioxide is an example of a stress relief material.

The formation of a very long waveguide going across reticles might include a step of isotropic etch and other smoothing techniques to allow better waveguide performance as it crosses reticle boundaries.

Figure 35A:
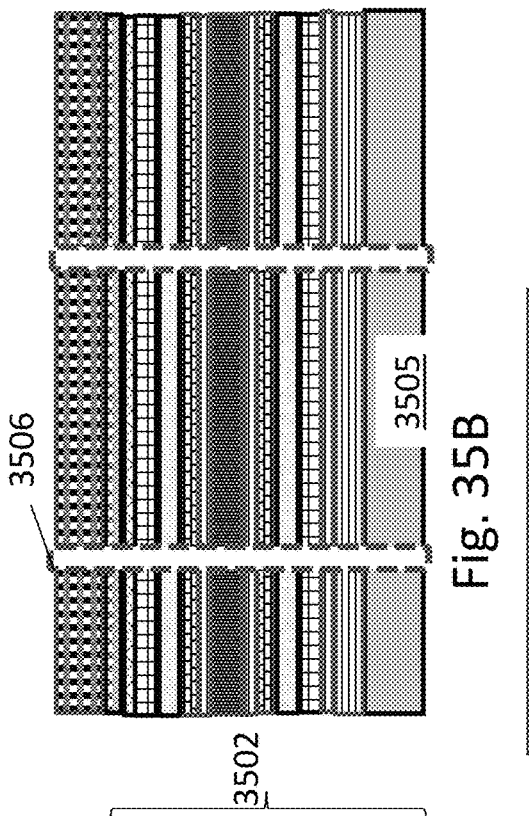
FIGS. 35A-35C are example illustrations of a structure of 3D SoC diced to a different system size.

FIG. 35A illustrates a structure of 3D SoC 3502 similar to the one illustrated in FIG. 32B and having an optical interconnect structure 3504 transferred over to provide long range X-Y connectivity. FIG. 35A is an X-Z 3500 cut illustrating section of such 3D wafer constructed over wafer substrate 3505.

Figure 35C:
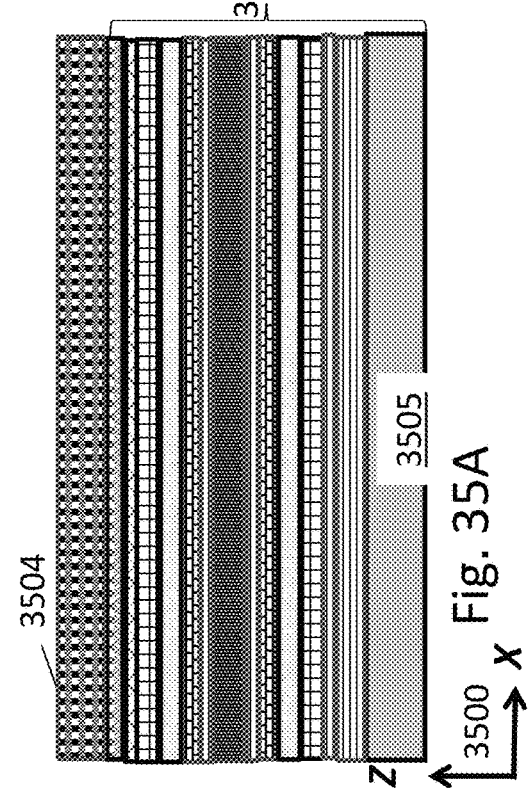
Figure 35B:
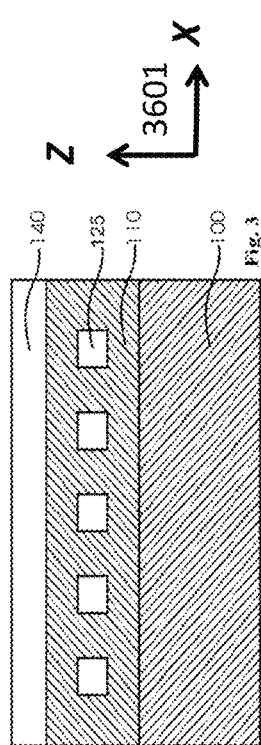

FIG. 35B illustrates the wafer of FIG. 35A diced to one size having dice lines 3506, while FIG. 35C illustrates the structure diced to a different system size than FIG. 35B's system size.

The architecture of the generic optical interconnect level 3504 could be designed to support a modular 3D system fabric having a generic array of units underneath. An industry standard could be set so different design teams can use the generic optical interconnect each in a way that supports its target system design and application.

In one embodiment, a vertical cavity surface emitting laser (VCSEL) may be considered as the III-V light source and a PIN germanium diode may be considered as the detector. In another embodiment of the present invention, all silicon based light sources and detectors may be considered. In such case, a Raman-silicon laser and a silicon based PIN photo-detector may be considered.

Prior art work shows alternative options to form an On-Chip Optical Interconnect. Such work has been presented in at least U.S. Pat. Nos. 7,389,029, 8,837,872, 8,428,401, 8,938,139, 9,368,579, 9,423,560, 9,851,506, and application 2015/0049998, all are incorporated herein by reference. These technologies could be engineered to support specific applications. U.S. Pat. No. 8,428,401 does teach use of a metal structure as part of the optical wave guide which could require some attention if it needed to be part of a dicing lane. These could be resolved by either dicing process or etching these regions before dicing, modifying the waveguide in regions that could be part of dicing lanes, such as by replacing the metal on these regions with a dielectric having a lower reflective index.

In an embodiment of the generic optical connectivity fabric, the waveguides are arranged in a Manhattan pattern in X- and Y directions while microdisk-type resonators are formed periodically arranged in a checkerboard pattern. Also, an array of VCSEL and photo detectors may be formed periodically in a checkerboard pattern. Alternatively, 2D photonic crystals where periodically arranged silica cylinders are fully in the XY plane may also form a generic optical connectivity fabric. Then, the layout of photonic crystals may be later tailored on demand.

A common architecture is to have the optical waveguides as part of the 'backend' interconnection layer and the photon generator (LED, Laser) and photo detector in the substrate. The waveguide could be a transparent material (silicon oxide, silicon nitride, etc.) surrounded by reflective material such as metal or material with higher reflective index to keep the light beam inside the waveguide. The wave guide could be designed so it could be used by spatially separated multiple inputs and multiple outputs allowing its flexible use. FIG. 4 of U.S. Pat. No. 8,428,401 illustrates a one input with multiple output waveguide structure. Additional work was presented by Shen, Po-Kuan, et al. "Multiple-input multiple-output enabled large bandwidth density on-chip optical interconnect." Journal of Lightwave Technology 34.12 (2016): 2969-2974; by Heck, Martijn J R and John E. Bowers. "Energy efficient and energy proportional optical interconnects for multi-core processors: Driving the need for on-chip sources." IEEE Journal of Selected Topics in Quantum Electronics 20.4 (2014): 332-343; and by Dai, Daoxin, and John E. Bowers. "Silicon-based on-chip multiplexing technologies and devices for Peta-bit optical interconnects." Nanophotonics 3.4-5 (2014): 283-311, all are incorporated herein by reference.

The optical interconnect could be custom made for the specific 3D system or pre-built being generic and thus servicing multiple 3D systems. It could also be semi-custom, by customizing the generic structure to a specific application. An option for such a semi-custom alternative could be a customization of a generic waveguide by introducing one or more 'cut' into it customizing one long waveguide to a two segment waveguide, and/or a three segment waveguide, and so forth.

Figure 36A:
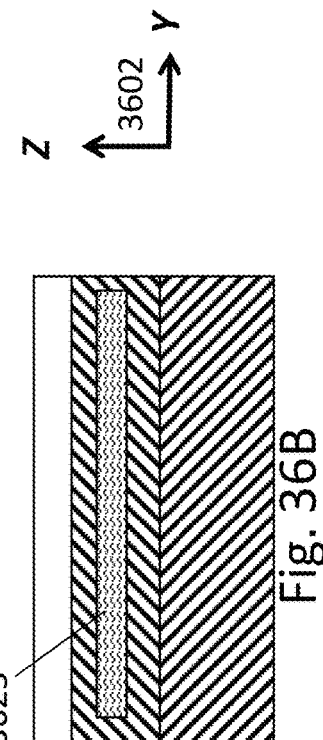
Figure 36B:
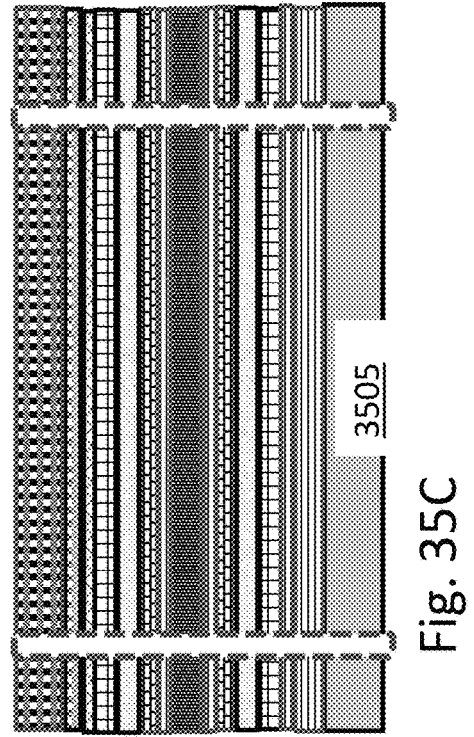

FIG. 36A is copy of FIG. 3 of U.S. Pat. No. 7,389,029, showing a side view cut X-Z 3601 of a waveguide 125. FIG. 36B illustrates a cut view Y-Z 3601 along the waveguide 3625. The customization of such a wave guide could be achieved by etching at specific points and filling with an optical blocking/reflecting material or just similar material used for the waveguide 3625 side walls. FIG. 36C illustrates, Y-Z 3602 cut view, the structure after the etching step opening access 3612. FIG. 36D illustrates the segmentation of the waveguide 3625 into two segments. Such semi-customization of a waveguide generic structure could extend the use of generic optical interconnects structures. The customization process could be done before the transfer or after the transfer over to the 3D system. Such customization may use a wafer fabrication process under clean room or it may leverage laser processing, or micro-machining.

FIG. 36E illustrates a top view X-Y 3603 of a region of a 3D wafer having cross die (reticle) optical wave guides. The illustration shows for dies 3635 with designated dice lines 3634, with crossing waveguides in X direction 3633 and crossing waveguides in Y direction 3632

FIG. 37A illustrates an X-Z 3701 cut view of a region of an optical interconnect structure prepared for transfer over to a 3D IC device. Over a transfer substrate 3714 electro-optic and/or opto-electric devices 3720 are fabricated including the control electronics, the laser or LED, the photo diode and other support devices. A cut layer 3716 is positioned under the electro-optics devices to support the layer transfer process. Waveguides 3708 are formed at the back-end, for example, similar to the illustration of FIG. 36A. The electro-optics devices are connected (not shown) to the waveguides to facilitate the signal light in and signal light out of the waveguides. The structure includes vias 3706 and pads 3704 to support connection to the 3D system. These could include pass-through connections 3712 and connection to following layer after transfer prepared vias 3718. The top layer 3710 is a protective isolation layer which could be used for bonding at the following step.

The layer transfer techniques presented herein enable a thin layer transfer and accordingly allow for a very high density of vertical interconnect between the various levels in the 3D system. This also applies to the layer transfer associated with the optical interconnect. Accordingly the vias such as prepared vias 3718 or the feed through 3712 could have a small circumscribing diameter, for example, such as, about 100 nm, about 200 nm, or even about 400 nm, which is much smaller than the state of the art TSV, which is about 5 microns (R&D) or larger (10+ microns in pilot production).

FIG. 37B illustrates a 3D system 3724 which could be similar to one such as in FIG. 32B, with optical interconnect 3726 such as is illustrated in FIG. 37A, flipped and bonded on top, having the transfer substrate 3714 substantially cut off. The bonding could be hybrid bonding to form direct conductive connections between the optical interconnect level and the underlying 3D IC system in addition to the oxide-oxide bonding.

In some applications is might be useful to have one set of waveguides 3708 traveling in parallel along the Y-axis directions layer 3732, and then transfer over an additional structure of waveguides traveling in parallel along the X-axis directions X direction layer 3734. For example, the pre-prepared connections prepared vias 3718 could be used to connect the control and the electro-optics devices for the transferred waveguides X direction layer 3734. These waveguides could be generic, custom, or customized either before or after being transferred over to the 3D system. In such, a 3D system it might be desired to keep the I/O layer (3236 of FIG. 32B) and the sensor layer (3270 of FIG. 32B) as the top most layers (Z direction). This is illustrated in FIG. 37B by having the structure of I/O and sensors 3736 as an optional add-on level, positioned as the top most level of the 3D System on a wafer. This wafer could then be diced to the desired size of the end product 3D System device. If compression wire-bonding is utilized, an optical waveguide keep out zone (opt KOZ) underneath the bonding pads may be necessary.

In dissertation works by Donguk Nam titled "STRAINED GERMANIUM TECHNOLOGY FOR ON-CHIP OPTICAL INTERCONNECTS", December 2013; by Devanand Suresh Sukhdeo, titled "BAND-ENGINEERED GERMANIUM FOR CMOS-COMPATIBLE LIGHT EMISSION", June 2015; and by Ju Hyung Nam, titled "MONOLITHIC INTEGRATION OF GERMANIUM-ON-INSULATOR PLATFORM ON SILICON SUBSTRATE AND ITS APPLICATIONS TO DEVICES", March 2016, additional work has been published by Abedin, Ahmad, et al. "GOI fabrication for monolithic 3D integration." SOI-3D-Subthreshold Microelectronics Technology Unified Conference (S3S), 2017 IEEE. IEEE, 2017; by Chaisakul, Papichaya, et al. "Integrated germanium optical interconnects on silicon substrates." Nature Photonics 8.6 (2014): 482; and by Lee, Kwang Hong, et al. "Integration of Si-CMOS and III-V materials through multi-wafer stacking." SOI-3D-Subthreshold Microelectronics Technology Unified Conference (S3S), 2017 IEEE. IEEE, 2017, all incorporated herein by reference, layer transfer and strain technology has been utilized to form optical light source (LASER) to support OCOI. Such techniques could be a good fit to the structures presented herein. Use of Germanium for the electro-optic devices could be a good fit with the use of SiGe for a Cut-Layer. These could include use of the buffer layers concept suggested in respect to FIG. 1B.

In one embodiment for the generic optical connectivity fabric, the n-n link may be desirable for reconfigurable networks, which uses optical switch boxes to dynamically define a communication route between arbitrary two functional blocks. The often called 'network on chip' (NoC) has been proposed in Benini, L. and De Micheli, G., Networks on Chip: A New SoC Paradigm, IEEE Computer, 35, 70, 2002; Guerrier, P. and Greiner, A., A generic architecture for on-chip packet-switched interconnections, in Proc. Design, Automation and Test in Europe 2000, 250, 2000; and Dally, W. J. and Towles, B., Route packets, not wires: On-chip interconnection networks, in Proc. 38th Design Automation Conference, 2001; Yang, Peng, et al. "Unified Inter- and Intra-chip Optical Interconnect Networks." *Photonic Interconnects for Computing Systems: Understanding and Pushing Design Challenges* (2017): 11. Nikdast, Mahdi, ed. *Photonic Interconnects for Computing Systems: Understanding and Pushing Design Challenges*. River Publishers, 2017, by Werner, Sebastian, Javier Navaridas, and Mikel Luján. "A Survey on Optical Network-on-Chip Architectures." *ACM Computing Surveys* (*CSUR*) 50.6 (2017): 89; by Morris, Randy, Avinash Karanth Kodi, and Ahmed Louri. "Dynamic reconfiguration of 3D photonic networks-on-chip for maximizing performance and improving fault tolerance." *Proceedings of the 2012 45th Annual IEEE/ACM International Symposium on Microarchitecture.* IEEE Computer Society, 2012; by Beg, Christopher. *A System Level FMCW RADAR Optimization For Automotive Powertrain Control Application Requirements.* MS thesis. University of Waterloo, 2013; by Achballah, Ahmed Ben, Slim Ben Othman, and Slim Ben Saoud. "An Extensive Review of Emerging Technology Networks-On-Chip Proposals." *Global Journal of Research In Engineering* (2017); and by Abellán, José L., Chao Chen, and Ajay Joshi. "Electro-photonic noc designs for kilocore systems." *ACM Journal on Emerging Technologies in Computing Systems* (*JETC*) 13.2 (2017): 24, all are incorporated herein by reference. Additionally the following U.S. Pat. Nos. 9,620,489, 9,322,901, and applications 2018/0246286, 2016/0178861, incorporated herein by reference, teach similar concepts of using optical interconnects to support horizontal connectivity for a 3D IC system.

One of the known challenges in reticle size or wafer level integration is yield. In 3D integration, there are multiple redundancy and repair techniques which have been detailed in the incorporated by reference patents herein. These could be used for the optical interconnected 3D system such as is referenced in respect to FIG. 35A-35C. Another alternative is to leverage the special attributes of the optical interconnect fabric presented herein. As illustrated in FIG. 36 the optical interconnect fabric uses waveguides to transit across die or reticles, thus crossing the designated dice lines. These waveguides are relatively large passive structures constructed with passive materials such as oxide and nitride. The width of the typical waveguide is about a micron compared to the tens of nanometer width of interconnect metal lines within advanced ICs. Current processing technology could produce these waveguides to go across a wafer of even 300 mm diameter at a very high yield. Accordingly, optical interconnect could allow integration of many independent dies with very low added yield loss. Such multi-die integration could allow production of a high level integration of many dies operating as one system even if son of these dies are faulty and need to be disabled. For example a 3D system could be diced to have a size of 60 mm by 60 mm, which may include 100 independent dies each about 6×6 mm. The system could be designed to function even if 10 of the dies are defective and accordingly disabled. The optical waveguide could be designed to transfer data across the defective die. The waveguide and especially those that are designed for multi-input multi-outputs could transfer data across a defective die without being affected by the disabled die. The disabling of defective dies could be achieved by self-test techniques or even by external techniques such as been used for memory repair, for example, such as on-chip repair such as fuse, antifuse, or off-chip repair such as laser or ion milling to disconnect the power to the defective dies.

Additional aspect of a multi reticle 3D system is added redundancy for the system elements that could be sensitive to yield loss, aspects such as the connections from the optical interconnect to the rest of the system such as the logic level. A simple approach to reduce such yield loss is double modular redundancy or even triple modular redundancy. So these sensitive elements which could include also the electro optics elements such as the laser, and the photo diodes, etc. Having a whole structure being dedicated to the optical interconnect leaves room for doubling or an even higher level of modular redundancy to overcome any reasonable random defect Additionally, the pre-testing could help reduce any yield losses caused by the optical interconnect structure. Such could allow an efficient multi-reticle 3D system construction. Double redundancy could be designed for parallel connections such as common in double vias for interconnect. Alternatively, it could be designed to be activated by self-testing circuits and support redundancy activation as is well-known in the art and could be engineered by an artisan in the field of fault tolerant systems.

Techniques to use optical lithography to pattern large areas greater than the full reticle field by 'stitching' multiple reticle patterns that had been projected independently are known in the art, and are used for Interposer lithography and other applications. Alternatively some lithography tools are designed to support large area projections. Such are presented in a paper by Flack, Warren, et al. "Large area interposer lithography." *Electronic Components and Technology Conference (ECTC)*, 2014 IEEE 64th. IEEE, 2014; by Lu, Hao, et al. "Demonstration of 3-5 µm RDL line lithography on panel-based glass interposers." *Electronic Components and Technology Conference (ECTC)*, 2014 IEEE 64th. IEEE, 2014; by Furuya, Ryuta, et al. "Demonstration of 2 µm RDL wiring using dry film photoresists and 5 µm RDL via by projection lithography for low-cost 2.5 D panel-based glass and organic interposers." *Electronic Components and Technology Conference (ECTC)*, 2015 IEEE 65th. IEEE, 2015; by Sundaram, Venky, et al. "Demonstration of Embedded Cu Trench RDL using Panel Scale Lithography and Photosensitive Dry Film Polymer Dielectrics." *International Synposium on Microelectronics*. Vol. 2017. No. 1. International Microelectronics Assembly and Packaging Society, 2017; by Zihir, Samet, et al. "60-GHz 64- and 256-elements wafer-scale phased-array transmitters using full-reticle and subreticle stitching techniques." IEEE Transactions on Microwave Theory and Techniques 64.12 (2016): 4701-4719; and by T Braun, M Topper, R Aschenbrenner, K Lang, *White paper on Panel Level Packaging Consortium*, all are incorporated herein by reference.

Additionally, some prior works suggest integrating systems using an interposer with optical waveguides such as presented by Arakawa, Yasuhiko, et al. "Silicon photonics for next generation system integration platform." *IEEE Communications Magazine* 51.3 (2013): 72-77; by Urino, Yutaka, et al. "High-density and wide-bandwidth optical interconnects with silicon optical interposers." *Photonics Research* 2.3 (2014): A1-A7; and by Urino, Yutaka, et al. "Demonstration of 12.5-Gbps optical interconnects integrated with lasers, optical splitters, optical modulators and photo-detectors on a single silicon substrate." *Optics express* 20.26 (2012): B256-B263, all are incorporated herein by reference An additional alternative is to pre-test the optical interconnect components allowing the use of the concept of Known-Good-Die to wafer level die-to-wafer 3D integration by pretesting the optical interconnect fabric before transfer over to the 3D system. These could be easier with the use of a generic optical interconnect which could be produced in volume and pretested before use for the specific application.

Such pretesting could be performed with an external test fixture by measuring light coming at the edge of the wafer. Alternatively, for an optical interconnects structure which includes both the waveguides and the opto-electronics circuit, built-in self-test could be used. Such self-test could be designed in the fabric which could include a photovoltaic region to generate the power for self-test and reduce the need for probing. And reporting the result could also be achieved contactless by use of an optical or wireless signal from the wafer to the test control system.

Such could also be used for the semi-custom optical interconnect fabric as the customization process presented in reference to FIG. 36C-36D is relatively simple and should not affect the fabric yield.

The optical inter-die interconnect fabric discussed is one alternative for effective X-Y interconnecting fabric. At least five other alternatives could be used in similar way using electrical signals with metal conducting material: 1) Differential signaling such as was discussed herein in reference to FIG. 33A-33B, 2) SerDes, 3) RF (Radio Frequency) transmission lines ("TL"), 4) RF Zenneck Surface Wave Interconnect ("SWI"), and 5) free space RF communication without transmission lines. Or any mix and match of these communication technologies. SerDes interconnects are presented in U.S. Pat. No. 9,369,318, incorporated herein by reference. In addition, the SerDes may be further integrated together with any types of RF interconnect or the optical interconnects.

The RF type interconnects fit well with the presented use (optical interconnect), for 3D system by layer transfer. The common technologies for RF circuits are on RF-SOI substrates supported by multiple vendors these days. Those substrates could be used for layer transfer as discussed herein and in the related application such as by etching the backside handling substrate using the buried oxide as an etch stop. Accordingly FIG. 37A-37B could be used to illustrate use of RF for adding X-Y interconnection fabric to 3D IC system. FIG. 37A could be viewed as illustrating an RF-SOI wafer in which 3716 could be the 'Buried Oxide' (BOX) 3720 could be the RF circuits associated with forming the electromagnetic RF waves, the modulation circuits to add in the data to be transferred, and the down converting circuits to convert back the modulated data at the receiver side to logic voltage level. The Y direction RF connections—the transmission lines, the wave guides or the SWI are illustrated by 3708. The interconnection fabric 3732 could than been flipped over a 3D target system 3724 as is illustrated in FIG. 37B. The RF-SOI substrate 3714 could be then ground down and selectively etched off. And additional level 3734 of X direction RF connections 3735 could be added on top. As is illustrated, through vias could be used to vertically connect the various levels including connection to overlaying Input Output ("I/O") level 3736 (which could also be underlying, depending on engineering and design tradeoff and considerations).

These alternative technologies may challenge the dicing over generic fabric as they do use metal as the interconnecting material. So in such case etch and deposition prior to dicing could be used for proper set up of the dicing lanes as presented in reference to FIG. 38B.

These technologies could be engineered as an effective alternative to the optical fabric including the use of generic interconnecting fabric with simple customization option by segmentation (cutting) of wave guides. Most fitting alternative to optic could be the TL and SWI. Use of multiple frequencies as a carrier wave could be engineered for n-n connectivity which make the use of a generic interconnection structure easier, as the programming for specific applications could be achieved by control of frequency allocation rather than by switches and conventional programmable interconnects. These techniques are detailed in the papers incorporated herein by reference. Alternatively, multiple-input and multiple-output or MIMO methods may be used for on-chip wireless communication. The layer-to-layer wireless communication within 3D system and intra-layer wireless communication may be enabled via integrated on-chip antennas and can allow arbitrary X-Y-Z interconnect Techniques for such wireless interconnect has been presented by Russer, Johannes A., et al., "Si and SiGe based monolithic integrated antennas for electromagnetic sensors and for wireless communications." Silicon Monolithic Integrated Circuits in RF Systems (SiRF), 2011 IEEE 11th Topical Meeting on. IEEE, 2011, by Hsu, Heng-Ming, Tai-Hsin Lee, and Chan-Jung Hsu, "Millimeter-wave transmission line in 90-nm cmos technology." *IEEE Journal on Emerging and Selected Topics in Circuits and Systems* 2.2 (2012): 194-199, by Abadal Cavallé, Sergi. "Broadcast-oriented wireless network-on-chip: fundamentals and feasibility." (2016), and by Nossek, Josef A., et al., "Chip-to-chip and on-chip communications." *Ultra-Wideband Radio Technologies for Communications, Localization ad Sensor Applications*. InTech, 2013, all are incorporated herein by reference.

The details of utilizing such interconnect technologies for Network on Chip (NoC) or other on silicon devices integration is known in the art and presented in publication such as by Karkar, Ammar Jallawi Mahnood, "Interconnects architectures for many-core era using surface-wave communication." (2016); by Karkar, Ammar, et al., "Surface wave communication system for on-chip and off-chip interconnects." *Proceedings of the Fifth International Workshop on Network on Chip Architectures*. ACM, 2012; by Ong, S. N., et al., "A 22 nm FDSOI Technology Optimized for RF/mm-Wave Applications." 2018 *IEEE Radio Frequency Integrated Circuits Symposium (RFIC)*. IEEE, 2018; by Liang, Yuan, et al., "On-chip sub-terahertz surface plasmon polariton transmission lines with mode converter in CMOS." *Scientific reports* 6 (2016): 30063; by Kazior, Thomas E. "More than Moore: III-V devices and Si CMOS get it together." *Electron Devices Meeting (IEDM)*, 2013 *IEEE International*. IEEE, 2013; by Kazior, T. E., et al., "High performance mixed signal and RF circuits enabled by the direct monolithic heterogeneous integration of GaN HEMTs and Si CMOS on a silicon substrate." *Compound Semiconductor Integrated Circuit Synposium (CSICS)*, 2011 *IEEE*. IEEE, 2011; by Kazior, Thomas E., et al. "More than Moore-Wafer Scale Integration of Dissimilar Materials on a Si Platform." *Compound Semiconductor Integrated Circuit Symposium (CSICS)*, 2015 *IEEE*. IEEE, 2015; by Bertozzi, Davide, et al., "The fast evolving landscape of on-chip communication." *Design Automation for Embedded Systems* 19.1-2 (2015): 59-76; by Karkar, Ammar, et al., "Mixed wire and surface-wave communication fabrics for decentralized on-chip multicasting." *Design, Automation & Test in Europe Conference & Exhibition (DATE)*, 2015. IEEE, 2015; by Karkar, Ammar, et al., "Hybrid wire-surface wave architecture for one-to-many communication in networks-on-chip." *Design, Automation and Test in Europe Conference and Exhibition (DATE)*, 2014. IEEE, 2014; by Karkar, Ammar, et al., "A survey of emerging interconnects for on-chip efficient multicast and broadcast in many-cores." *IEEE Circuits and Systems Magazine* 16.1 (2016): 58-72; by Karkar, Ammar, et al. "Network-on-chip multicast architectures using hybrid wire and surface-wave interconnects." *IEEE Transactions on Emerging Topics in Computing* 6.3 (2018): 357-369; by Tiemeijer, Luuk F., et al. "Low-loss patterned ground shield interconnect transmission lines in advanced IC processes." *IEEE transactions on microwave theory and techniques* 55.3 (2007): 561-570; by Kim, Jae-won, et al. "Novel CMOS low-loss transmission line structure." *Radio and Wireless Conference*, 2004 *IEEE*. IEEE, 200; by Turner, Walker J., et al., "Ground-referenced signaling for intra-chip and short-reach chip-to-chip interconnects." *Custom Integrated Circuits Conference (CICC)*, 2018 *IEEE*. IEEE, 2018; by Hamieh, Mohamad, et al., "Sizing of the physical layer of a rf intra-chip communications." *Electronics, Circuits and Systems (ICECS)*, 2014 *21st IEEE International Conference on*. IEEE, 2014; by Agyeman, Michael Opoku, et al. "On the design of reliable hybrid wired-wireless network-on-chip architectures." *Embedded Multicore/Many-core Systems-on-Chip (MCSoC)*, 2015 *IEEE 9th International Symposium on*. IEEE, 2015; by Fesharaki, Faezeh, et al. "Guided-wave properties of mode-selective transmission line." *IEEE Access* 6 (2018): 5379-5392; and in U.S. Pat. Nos. 8,889,548 and 9,405,064, all of the forgoing are incorporated hemin by reference.

Accordingly, the interconnect fabric 3504, 3506 of FIG. 35A-35C, could constructed with RF electronics and transmission line or SWI instead of optical waveguides. The customization technique of FIG. 36C-36D could be engineered to customize RF transmission line or SWI, and so could be applied to FIG. 36E with respect to 3632 and 3633. Similarly the techniques presented in respect to FIG. 37A-37B could be engineered and adapted to RF electronics to form RF transmitters and receivers, allowing data transfer by transmission line or SWI instead of optical waveguides 3708. In most cases optical waveguides are constructed from materials that are good for transmitting optical waves such as, for example, silicon oxide, while RF waveguides are transmission lines are constructed from materials which are good for transmitting RF waves, for example, such as copper, and other conducting metals. The support elements to generate these waves and to modulate these waves are different and in so many cases are the materials which are used for their constructions. These are known in the art and are detailed in some of the papers incorporated herein by reference.

The use of RF could include use of differential signaling. Use of differential transmission lines could help reduce the cross talk effect and interference effect; allow lower voltages, and other advantages. The previous concepts for interconnection fabric could be adapted to use differential transmission line using techniques such as has been presented by Sai-Wang, et al. "A simultaneous tri-band on-chip RF-interconnect for future network-on-chip." *VLSI Circuits*, 2009 *Symposium on*. IEEE, 2009, by Sawyer, Brett, et al. "Modeling, design, and demonstration of 2.5 D glass interposers for 16-channel 28 Gbps signaling applications." *Electronic Components and Technology Conference (ECTC)*, 2015 *IEEE 65th*. IEEE, 2015, by Sawyer, Brett, et al. "Design and demonstration of 2.5 D glass interposers as a superior alternative to silicon interposers for 28 Gbps signal transmission." *Electronic Components and Technology Conference (ECTC)*, 2016 *IEEE 66th*. IEEE, 2016, by Wary, Nijwm, and Pradip Mandal. "Current-Mode Triline Transceiver for Coded Differential Signaling Across On-Chip Global Interconnects." *IEEE Transactions on Very Large Scale Integration (VLSI) Systems* 25.9 (2017): 2575-2587, by Holloway, Jack W., et al. "A fully integrated broadband sub-mmwave chip-to-chip interconnect." *IEEE Transactions on Microwave Theory and Techniques* 65.7 (2017): 2373-2386, by Alzahmi, Ahmed, et al. "High-performance RF-interconnect for 3D stacked memory." *SoC Design Conference (ISOCC)*, 2017 *International*. IEEE, 2017, and by Akahoshi, Tomoyuki, et al. "Configuration for High-speed Transmission between Flip-chip Packages Using Low Loss and Flexible Substrate." *Transactions of The Japan Institute of Electronics Packaging* 11 (2018): E17-016, all are incorporated herein by reference. And in U.S. Pat. Nos. 9,240,619, 9,071,476, and US patent applications 2016/0197761

Some of the incorporated by reference art, in here suggest the use of interposer, often reference as 2.5D, for chip to chip interconnect. The technology suggested herein is teaching a more effective technique, by adapting these interposer techniques to wafer level for layer transfer over the wafer with the chips to be interconnected. Wafer scale 3D integration of processing chips or cores or units could have as presented a full system 3D structure with good vertical connectivity. Adding the horizontal connectivity (X-Y) by layer transfer of RF circuits fabricated on a wafer such as RF-SOI with a connectivity fabric using layer transfer allows an effective wafer level processing of a fully connected 3D system. Such approaches need to accommodate non-perfect yield, mostly at the processor chip-core-unit level. The presented of techniques herein allow for overcoming such defects by: redundancy, repair, or skipping of such defective elements.

FIGS. 35A to 37B illustrate a 3D system in which the X-Y horizontal interconnection fabrics 3504, 3726, 3734 are relatively at the upper level of the structure. In general the horizontal interconnection fabric could be engineered by artisan skilled in the art in the middle level of the 3D system or at any other level. Placing it in the center could be advantageous in some systems by having a compute structure on both sides (under it and overlying it) thus allowing shorter vertical paths from the computing structures to the X-Y horizontal interconnection fabric.

Similar to the concept of pre-testing the optical waveguide structure, so pretesting of the RF transmission line fabric can be engineered. In general these waveguides, whether optical or RF (transmission line), are far larger than advanced semiconductor features. They are hundreds of nanometers wide rather than tens of nanometers wide. The lithography process costs of RF transmission line fabrics can be far lower and the yield could be far higher than optical waveguide structures. Yet defects could still accrue and pretesting could allow avoiding use of defective fabrics. The pretesting could be assisted by dedicated test equipment or by on fabric self-test structures. Those could be engineered by artisans skilled in the art. The test infrastructure could be designed to use contacting probes or be wireless. Combining wireless testing to RF base interconnection fabric could leverage wireless charging, wireless test patterns in and wireless test patterns out using technologies well-known in the art. Pretesting could include special substrates with dedicated test utilities such as transmitters (Laser or RF) at the one end of the waveguides and receivers at the other ends. The connection for providing power and initiating self-test and receiving self-test results could use probes with physical contact to the tested wafer or wireless transmissions. The test elements could be embedded as part of the electromagnetic waves control electronic level, or a dedicated level dedicated for the testing. As a dedicated level it could be part of the substrate on which the wave guides are fabricated on with 'cut-layer' in between or brought over such as wafer bonding and de-bonding techniques. These choices could be engineered by artisan skilled in the art.

Wafer level 3D system as presented herm could highly benefit with the ability to be configurable. Such flexibility could be used to support the continuous array concept such as has been presented in U.S. Pat. No. 8,395,191, incorporated by reference, in reference to FIG. 11A-11F in respect to array of programmable logic, and in respect to FIG. 84A-84G in respect to an array of memory cells. In such concepts, the production is of a continuous fabric which could be "cut" to fit specific needs (Just is common with carpets). Another benefit of such configurability is the ability to accommodate some defects and to configure the system to function while the defect region is configured out of the system. The system could be designed to have controller design to configure the system the X-Y connectivity and/or the on chip network (NoC). The controlling program could be built in or loaded in at the system initialization process. Such concepts have been presented in a programmable generic continuous array fabric in U.S. Pat. No. 8,115,511, incorporated herein by reference, as related to its FIG. 37-38. Other set-up techniques could be used including leveraging the RF circuits which could include communication links to set-up equipment, and use of wireless to communicate with the system various nodes, and using known techniques, configure the system and its network connectivity.

The 3D system could include in X-Y waveguides or transmission lines a configurable connectivity such as: Single Write Multiple Read (SWMR), Multiple Write Single Read (MWSR), or even Multiple Write Multiple Read (MWMR). Connectivity fabric wherein its waveguide/transmission lines are designed for MWMR, simplify the configuration of its resources by adapting who gets to 'write' into a specific waveguide and who gets to read based on considerations such as yield and sizing (customization). Such has been presented by Brière, Alexandre, et al. "A dynamically reconfigurable rf noc for many-core." *Proceedings of the 25th edition on Great Lakes Synposium on VLSI*. ACM, 2015; and by Agyeman, Michael Opoku, et al. "A resilient 2-d waveguide communication fabric for hybrid wired-wireless noc design." *IEEE* Transactions on Parallel and Distributed Systems 28.2 (2017): 359-373, which suggest use of both wire and wireless RF base interconnect, Chang, M. Frank, et al. "CMP network-on-chip overlaid with multi-band RF-interconnect." *High Performance Computer Architecture*, 2008. *HPCA* 2008. *IEEE* 14*th International Symposium on*. Ieee, 2008; Vivet, Pascal, et al. "Interconnect challenges for 3D multi-cores: From 3D network-on-chip to cache interconnects." *VLSI (ISVLSI)*, 2015 *IEEE Computer Society Annual Symposium on*. IEEE, 2015; and in U.S. Pat. Nos. 8,885,689, 9,160,627, and 9,515,367, all are incorporated herein by reference.

As an alternative, the configuring of the interconnect fabric during the setup process as discussed above could allow use of such waveguides resources for X-Y connectivity even in the simple mode of single input single output.

These options could be engineered by artisan skilled in the art for the specific application for which the 3D system is being designed for.

The concept of wafer scale integration ("WSI") has been considered and at times explored over many years. It was never adopted due to the challenge of defects and due to the success of scaling. There is more interest these days as conventional scaling has slowed. And with the growing interest with Artificial Intelligence (AI) and brain inspired architectures. Such concepts have been presented by Kumar, Arvind, et al. "Toward Human-Scale Brain Computing Using 3D Wafer Scale Integration." *ACM Journal on Emerging Technologies in Computing Systems (JETC)* 13.3 (2017): 45; by Kumar, Arvind. "Nanotechnology requirements and challenges for large-scale brain computing." *Nanotechnology (IEEE-NANO)*, 2016 IEEE 16th International Conference on. IEEE, 2016, by Wan, Zhe. *Three-Dimensional Wafer Scale Integration for Ultra-Large-Scale Neuromorphic Systems*. Diss. UCLA, 2017; by Wan, Zhe, and Subramanian S. Iyer. "Three-dimensional wafer scale integration for ultra-large-scale cognitive systems." *SOI-3D-Subthreshold Microelectronics Technology Unified Conference (S3S)*, 2017 IEEE. IEEE, 2017; by Uddin, Ashfaque, et al. "Wafer scale integration of CMOS chips for biomedical applications via self-aligned masking." *IEEE Transactions on Components, Packaging and Manufacturing Technology* 1.12 (2011): 1996-2004; and by Schmitt, Sebastian, et al. "Neuromorphic hardware in the loop: Training a deep spiking network on the brainscales wafer-scale system." Neural Networks (IjCNN), 2017 International Joint Conference on. IEEE, 2017; and U.S. Pat. Nos. 8,698,295 and 9,568,960, all are incorporated herein by reference. Herein the reference to wafer scale integration ("WSI") could be considered as a general term to ultra-scale integration in which more than a reticle size device is constructed. It could be a rectangular device having size of more than 40×40 mm$^2$, 80×80 mm$^2$, 160×160 mm$^2$ or full wafer size. Other shapes of devices are also possible, especially in the 3D context.

Some of the recent work suggests the use of optical waveguides in 3D architecture for WSI such as by Settaluri, Krishna T., et al. "Demonstration of an optical chip-to-chip link in a 3D integrated electronic-photonic platform." *European Solid-State Circuits Conference (ESSCIRC), ESSCIRC 2015-41st*. IEEE, 2015; and by Stojanović, V., et al. "High-density 3D electronic-photonic integration." *Energy Efficient Electronic Systems (E3S)*, 2015 Fourth Berkeley Symposium on. IEEE, 2015, both are incorporated herein by reference. The concepts presented herein are advancing these ideas further supports low cost and effective integration with the current industry infrastructure.

The concepts presented herein in respect to the X-Y connectivity fabric were initially developed and presented with respect to 3D IC through many of the patents assigned to MonolithIC 3D Inc. and incorporated by reference herein. As an example in U.S. Pat. No. 8,395,191, incorporated by reference, the concept of programmable interconnects structure is presented in respect to its FIG. 4A-4B and FIG. 2. The concept of continuous array which could be 'cut' to size for specific application is presented in reference to FIG. 11A-11F in respect to array of programmable logic, and in respect to FIG. 84A-84G in respect to array of memory cells. The concept of leveraging 3D integration for wafer scale integration, or for multi reticles or multi die integration was presented in conjunction with defect repair with respect to programmable array in FIG. 41 and with respect to logic circuits in FIG. 86A-86B and FIG. 114-FIG. 119. These concepts could be adapted to a 3D system leveraging the X-Y connectivity fabric presented here such as using waveguides transmitting optical signals, or waveguides or transmission lines transferring RF signals. These concepts are a good fit here leveraging the attributes of electromagnetic wave (light or RF) signal transmission at about the speed of light, which is about 1 ns across 300 mm wafer. These interconnect technologies provide connectivity across the wafer, in which the signal delays are not dominated by the length of the interconnects, but rather by the delays associate in conversion from voltage levels to electromagnetic waves and back. Accordingly the concept of redundancy could be applied not just with functions implemented directly above (or above/below and to the sides) at tens of nanometer physical and/or connection distance but also with functions that are at tens of millimeters apart. Additional useful attributes is the larger size and the relatively simple structure of these waveguides (transmission lines) which could enable high yield across large device sizes (many tens of mm). And also very fitting are the types of 3D system for which such X-Y interconnection fabric could be used for. The growing popularity of logic systems that use an array of processors such as GPUs and multi-cores allow the use of a similar concept that was used in the past for arrays of memories and arrays of programmable logic.

These above concepts could be illustrated in reference to FIG. 38A-38C, which illustrates an X-Z 3800 cut view of a region of the 3D system of multi-coms continuous wafer fabric.

FIG. 38A illustrates multi-levels of memory, logic and support circuits 3804 with interconnection fabric 3806 over silicon wafer substrate 3802. The substrate thickness (Z direction) could be a conventional 700 microns or could be thinned down. The thickness of the structure on top, including multi-levels of memory, logic and support circuits 3804 and interconnection fabric 3806 could be of a few microns, tens of micron or even thicker.

FIG. 38B illustrates the structure of FIG. 38A after being processed in preparation for dicing ("cut") by forming dice lines 3810 around all of the sensitive structure and protecting the exposed edges by protection layers 3812, such as metal strips and side walls scaling. The structure of FIG. 38A could include designated potential dice lanes such as rows and columns in between cores. The locations of the etch trench 3810 could be along the selected dice lanes. FIG. 38C illustrates a 'cut' structure having 4 cores with selected dice line 3820 and unselected potential dice line 3821.

FIG. 38C illustrates such a cut cross section (with reference to 3800) having processors 3822, 3824, 3826, 3828 with memory included in the structure. Interconnection control and wave forming level 3830, and waveguides/transmission lines (for the X directions) 3831, 3832, (Waveguides in Y direction are not shown) are on top of the processors 3822, 3824, 3826, 3828. The waveguides could be shared resources having programmable ports 3834, 3836, 3838. If during the set-up process and self-test operation it is determined that, for example, processor 3824 or associated memory/support circuits is faulty then the ports associated with it 3834, 3836 are disabled. These ports could be engineered so they do not interfere with the waveguide functionality once disabled. The size of such element like 3824 could be small such as 200μ×200μ (unit), 7 mm×7 mm (die) or full reticle of about 25 mm×35 mm. Techniques for such configurable multi-in, multi-out using waveguide/transmission lines are known in the art and presented in papers such as by Hu, Jianyun, et al., "A 25-Gbps 8-ps/mm transmission line based interconnect for on-chip communications in multi-core chips." *Microwave Symposium Digest*

(*IMS*), 2013 *IEEE MTT-S International.* IEEE, 2013; and by Unlu, Emn, et al., "An OFDMA based RF interconnect for massive multi-core processors." *Networks-on-Chip (NoCS),* 2014 *Eighth IEEE/ACM International Symposium on.* IEEE, 2014; all are incorporated herein by reference. Connecting techniques for such ports could be direct contact, inductive coupling, capacitive coupling or transistor controlled. Such is discussed in a paper by Carpenter, Aaron, et al. "Using Transmission Lines for Global On-Chip Communication." *IEEEJ. Emerg. Sel. Topics Circuits Syst.* 2.2 (2012): 183-193; by Wu, Hao, et al. "A 60 GHz on-chip RF-interconnect with λ/4 coupler for 5 Gbps bi-directional communication and multi-drop arbitration." *Custom Integrated Circuits Conference (CICC),* 2012 *IEEE.* IEEE, 2012; by Drillet, Frédéric, et al. "Flexible radio interface for NOC RF-interconnect." *Digital System Design (DSD),* 2014 *17th Euromicro Conference on.* IEEE, 2014; and publication by Unlu, Eren. *Dynamic Bandwidth Allocation for an OFDMA based RF Network-on-Chip.* Diss. CentraleSupélec, 2016; all are incorporated herein by reference, such as in reference to FIG. 3.12 indicating advantages to access via transistor control.

FIG. 36E illustrates an X-Y interconnect fabric over small array of 2×2 cores. The number of cores and the shape of a specific device could be customized as appropriate for a specific application. FIG. 39 is a top view X-Y 3903 illustrating an interconnect fabric in what is called the X architecture. Accordingly the interconnect fabric could include waveguides (transmission lines) arranged in a diagonal orientation. These could be on top of a conventional Cartesian X-Y connectivity fabric. Such could help connecting circuits across the die, wafer, etc. not just along rows or columns but also diagonally. Many other variations could be engineered by an artisan skilled in the art. Many other connectivity structures could be used including forms of 'U' shape and 'S' shape transmission lines such as illustrated in FIGS. 0.3, 2.6, 2.8, 2.9, 2.10, 3.2, 3.11, 7.30, and 7.38 of Unlu, Eren. *Dynamic Bandwidth Allocation for an OFDMA based RFNetwork-on-Chip.* Diss. CentraleSupélec, 2016.

This concept could be used in a similar way to the concept utilized in the memory business in which some memory cells (rows) are designated as redundancy to repair faulty memory cells, or as in agile design which can adapt to the number of functionally-yielding cores. These concepts could be engineered by an artisan skilled in the art to fit the choice of manufacturing and the required system characteristics.

Herein and in the related patents and applications fabrication process are presented using layer transfer. The electronics elements associated with the layer been transfer could be connected to the underline structure either by using hybrid bonding, having the appropriate connecting pads/pins, or by post process, etching via and forming conductive connection lines. In general hybrid bonding is a shorter and simpler process, while etch and deposition could support higher precision and more connections. The choice between these connecting technologies and the related techniques to overcome bonding misalignments could be engineered by an artisan skilled in the art to fit the specific application.

Herein and in the related patents and applications many 3D semiconductor devices and structures are presented. The reference to a device as 3D device indicates that the transistors included in the device are positioned at least on two overlaying planes (X-Y). In general, these devices are fabricated on round disk wafers in an X-Y plane with a disk diameter of about 100, 150, 200, 300 mm or even larger as future plans are for 400 mm. These wafers are relatively thin at about 0.7-0.9 mm in Z direction. Herein the term horizontal is in X-Y direction while vertical is in Z direction. Accordingly overlay, overlaying, underlying and so forth are in respect to the vertical direction –Z. In 3D devices, the transistors are in most cases being processed first on a wafer substrate that in most cases is a single crystal wafer, usually single crystal silicon. The term layer is used in most cases for such X-Y plane of a material with a functional structure such as isolation, connectivity strips, transistors and so forth. If such layer is combined with additional layers to form a plane of connected transistors it could be still called a layer but often it is called stratum, or tier, or layer, or level. Multiple stratuns (strata) could be considered a 3D structure or a multilevel structure. The 3D structure could still be called a wafer but it also could be called a device. The wafer in most cases will be diced to many devices mostly with a rectangular shape which than could be packaged and integrated with other devices to form a system. Yet 3D devices could also be considered in many cases as 3D systems on their own. These terms and names are common in the art and in combination with other terms which could have similar meaning and could have been used herein too. The descriptions herein are to teach technologies and various innovations to an artisan skilled in the art. It is expected to teach the technological concept to engineers, who with the help of the accompanying drawings could make use of them to engineer the improved end products. The 3D system presented herein and the technologies suggested for the processing support the use of single crystal layer(s) and accordingly may include single crystal channel transistors. Such could be applied to the various levels of the 3D IC device starting from the base substrate. The use of single crystal materials are commonly and predominantly silicon; however, the use of single crystal materials described herein is not limited to silicon. As such, the use of poly crystalline or other form of materials, or types of material such as Germanium or alloys, for example, such as SiGe, could be integrated in the 3D system as presented herein or in the incorporated art. The concept of large scale integration such as multi dies, multi reticle, or wafer levels could leverage the presented 3D technologies but could be also implemented in conventional 2D devices.

3D Systems, for example, such as those presented herein commonly generate heat while in operation, which should be managed to protect the system from heating up and affecting the 3D system operation. The incorporated art herein suggests multiple techniques to provide heat removal for such a 3D system. These techniques include use of the through layers vias, the power grid, incorporating a heat spreader, absorbing and reflective layers, and so forth. In some systems additional techniques such as use of liquids combined with micro channel could be required. Such liquid based 3D device cooling are known in the art and have been presented such as in U.S. Pat. No. 7,928,653, and as presented in the paper Bakir, Muhannad S., et al. "3D integrated circuits: liquid cooling and power delivery." *IETE Technical review* 26.6 (2009): 407-416, both are incorporated herein by reference. These cooling techniques could be incorporated in the silicon substrate of the 3D IC device or in the interposer used to carry the device or in the package of the device. Recently a DARPA program named ICECool has been established to develop such cooling technologies as been reported in publications such as by Bar-Cohen[1], Avram, Joseph J. Maurer, and Jonathan G. Felbinger. "DARPA's Intra/Interchip Embedded Cooling (ICECool) Program"; and Bar-Cohen, A., J. J. Maurer, and D. H. Altman. "Gen3 embedded cooling for high power RF components." *Microwaves, Antennas, Communications and Electronic*

Systems (COMCAS), 2017 IEEE International Conference on. IEEE, 2017. Other work was presented by Kandlikar, Satish G. "Review and projections of integrated cooling systems for three-dimensional integrated circuits." *Journal of Electronic Packaging* 136.2 (2014): 024001; by Chen, Gengjie, et al. "Minimizing thermal gradient and pumping power in 3D IC liquid cooling network design." *Proceedings of the 54th Annual Design Automation Conference* 2017. ACM, 2017; by Serafy, Caleb M. *Architectural-physical co-design of 3D CPUs with micro-fluidic cooling.* Diss. 2016; by Drumnmond, Kevin P., et al. "A hierarchical manifold microchannel heat sink array for high-heat-flux two-phase cooling of electronics." *International Journal of Heat and Mass Transfer* 117 (2018): 319-330; by Green, Craig, et al. "A review of two-phase forced cooling in three-dimensional stacked electronics: technology integration." *Journal of Electronic Packaging* 137.4 (2015): 040802; by Zhang, Xuchen, et al. "3D IC with embedded microfluidic cooling: technology, thermal performance, and electrical implications." *ASME* 2015 *International Technical Conference and Exhibition on Packaging and Integration of Electronic and Photonic Microsystems collocated with the ASME* 2015 13*th International Conference on Nanochannels, Microchannels, and Minichannels*. American Society of Mechanical Engineers, 2015; and by Green, Craig, et al. "A review of two-phase forced cooling in three-dimensional stacked electronics: technology integration." *Journal of Electronic Packaging* 137.4 (2015): 040802, all of the forgoing in this paragraph are incorporated herein by reference. These fluid cooling technologies could be a good fit to the large scale integration technologies presented herein, for example, with reference to FIGS. 35A-FIG. 39, both due to the large scale of active device being integrated, and for the cost effectiveness of sharing the cost over a high level of device integration.

FIG. 40A illustrates an X-Z 4000 cut view of such high scale 3D device integration with a substrate constructed to support fluid cooling, cooled 3D device 4001. The top portion 4004 illustrates the large scale 3D integration structure of FIG. 38C. Cooled 3D device 4001 may include channeled silicon substrate 4002, top portion 4004 (processors 3822, 3824, 3826, 3828; wave forming level 3830, waveguides/transmission lines (for the X directions) 3831 & 3832; programmable ports 3834, 3836, 3838, selected dice line 3820, unselected potential dice line 3821), bonding interface 4010, fluid in-take 4012, fluid out-take 4014, micro-channels 4016 and micro-channel structure 4018. The channeled silicon substrate 4002 could include micro-channel 4016 designed with fluid in-take 4012 and out-take 4014. The substrate could be preprocessed to include the micro-channels at the wafer level, or bonded afterward to micro-channel structure 4018 with, for example, such as with silicon to silicon bonding 4010.

FIG. 40B is an X-Y 4030 cut of the cooled 3D device 4001 thru micro-channel structure 4018 through the micro-channels 4016. The micro-channels 4016 could be formed by etching trenches using conventional semiconductor processes into the micro-channel structure 4018 and then bonded to the wafer substrate 4002. Micro-channels 4016, micro-channel structure 4018, and a thinned wafer substrate 4002 could be slightly oxidized to enable a silicon dioxide to silicon dioxide bond if required by engineering and production constraints. Alternatively, the inner surface of the micro-channel 4016 may be further protected by silicon nitride or other desired film in order to protect the device from the cooling fluid. The fluid in-take 4012 and out-take 4014 (there may be more than one on each system/device) may then be added in to fully prepare the device for fluid cooling. The wafer substrate could be thinned down by conventional techniques such as grinding and etch prior to the bonding. Thinning substrate post device processing down to 50 µm is common in the industry. Alternatively the base in which the micro-channels 4016 are formed in micro-channel structure 4018 could be made from other materials such as glass, and the interface between the micro-channel structure 4018 and the silicon wafer could be made of other materials which could have good adhesion to these substrates and good from being bond together. Use of materials that are good heat conductors, such as isotopically pure silicon for example, is an advantage but even poor heat conductors if they are thin enough could be engineered to support such fluid based micro-channel wafer level integration. The dicing could be done after the bonding of the micro-channel structure 4018. If the choice of material for the micro-channel structure 4018 is not a good fit for the common saw dicing than other dicing technologies could be used such as plasma etch or laser based dicing. Alternatively a silicon wafer could be used as a starting material for the base element of the wafer substrate 4002 and micro-channel structure 4018, and another material could be deposited over the etched trenches for the micro-channel and the bonding interface 4010. Such deposition could be a conformal deposition such as ALD. The choice of the material could be made to support both the bonding and the micro-channel functionality. The microchannel cooling structures could be placed on top, underneath (illustrated in FIGS. 40A and 40B) or in some cases in-between the active device layers. As well, the microchannel cooling structures could be placed on top and underneath, or underneath ad in-between, or any combination of the three regions of placement. The creation of a system with the capabilities attainable with this set of inventions may require a large cooling capacity and thus multiple layers of a cooling structure, such as, for example, the microchannel cooling presented just above.

While FIGS. 40A-40B illustrate a technique to form micro-channels for fluid cooling, many other techniques could be engineered by an artisan skilled in the art, including forming the micro-channel in interposer or in the package as presented in the incorporated by reference art.

An alternative for the use of waveguides or transmission lines for ultra-scale (wafer scale) integration is to use wireless interconnects at the core to core level. Accordingly each core could have its own RF transmitter receiver and the data between cores could be exchanged using wireless communication without the need for physical connections between dies/reticle-step regions. Such ultra-scale integration could be established without the need for reticle 'stitching'. Dicing the device edge could be achieved without the need of physical configuration to etch the waveguides or the transmission lines crossing the dicing lanes. The system customization could be performed by software network configuration. The device could be covered with an electromagnetic shield to keep such wireless connectivity confined within the device and protect against interference or 'tampering' or 'spying'. It could be desired that each unit of these multi-core systems is powered independently to further support yield recovery, for example, by disabling faulty units. The use of wireless connectivity for Network on Chip ("NOC") has been covered in many publications and could be adapted for such an ultra-scale integrated system. Such as in review papers by Xiao, Chunhua, Zhangqin Huang, and Da Li. "A tutorial for key problems in the design of hybrid hierarchical nDc architectures with wireless/rf." *SmartCR* 3.6 (2013): 425-436; by Deb, Sujay, et al. "Wireless NoC as interconnection backbone for multicore chips: Promises and challenges." *IEEE Journal on Emerging and Selected Topics in Circuits and Systems* 2.2 (2012): 228-239; by Opoku Agyeman, Michael, et al. "Towards the practical design of performance-aware resilient wireless NoC architectures." (2016); by Agyeman, Michael Opoku, Kenneth Tong, and Terrence Mak. "An Improved Wireless Communication Fabric for Performance Aware Network-on-Chip Architectures." *Int. J. Com. Dig. Sys* 5.2 (2016); and by Achballah, Ahmed Ben, Slim Ben Othman, and Slim Ben Saoud. "An Extensive Review of Emerging Technology Networks-On-Chip Proposals." *Global Journal of Research In Engineering* (2017); all of the forgoing in this paragraph are incorporated herein by reference.

Hybrid systems which combine wired and wireless could be constructed so to achieve a better mix between these technologies. Such a hybrid system has been covered by published work such as by Agyeman, Michael Opoku, et al. "Towards the practical design of performance-aware resilient wireless NoC architectures." *Cloud Computing, Data Science & Engineering—Confluence, 2017 7th International Conference on*. IEEE, 2017; by Agyeman, Michael Opoku, et al. "On the design of reliable hybrid wired-wireless network-on-chip architectures." *Embedded Multicore/Many-core Systems-on-Chip (MCSoC)*, 2015 IEEE 9th International Symposium on. IEEE, 2015; and by Agyeman, Michael Opoku, et al. "A resilient 2-d waveguide communication fabric for hybrid wired-wireless noc design." *IEEE Transactions on Parallel and Distributed Systems* 28.2 (2017): 359-373; all of the forgoing in this paragraph are incorporated herein by reference.

In such ultra-scale integration, power needs to be delivered to each unit. Metal interconnection could be used so wide metal lines could be used to form the primary power distribution network, distributing power provided through pads or balls from external sources to all units in the system. Alternatively each unit in the system could have its own pad or ball connected to the external power source. FIGS. 41A-41B illustrates device with wire bonding stitching unit's pads with wide wire (300 μm) to be connected. FIGS. 41C-41F illustrates balls for connecting die(s) to an external source. Such balls could be used to directly provide power to each unit. Such direct power to each unit supports the use of generic fabrics that could be diced without the need for a special etched dice lanes etching step.

The presented concept of Ultra Scale Integration herein is not limited to an array of computing cores and is not limited to an array in which all elements are of the same size, those could have been presented to illustrate the concept. Accordingly the elements 3822, 3824, 3826, 3828 of FIG. 38C do not need to have the same size or the same functionality. An important concept herein is that an interconnection fabric using waveguides, transmission lines, wireless, or even conventional thick metal lines could provide high-yield-&-agile connectivity integrating large areas of semi-independent elements. The agile connectivity could be designed to function even if one or more of the elements being connected do not perform properly. The Ultra Scale Integration allows disabling the faulty elements so they do not interfere with the device operation. The device operation is structured so it could accommodate some level of un-yielding elements by either activating built-in redundancy or by being fault tolerant thus allowing some devices with a reduced functionality but ultimately still useable.

The ultra-scale integration for wired as well as wireless on-chip interconnects could be extended further by utilizing, for example, a passive panel. The industry has been developing large panel manufacturing technology for applications such as flat panel displays and solar panels. These large panel technologies could be adapted to produce a large panel with waveguides or transmission lines. Array(s) of active device structures could be bonded onto such large panels. Such active device structures could be of a rectangular shape of more than 40×40 mm$^2$, 80×80 mm$^2$, 160×160 mm$^2$ or even larger. The bonding could be hybrid bonding forming the connection from the active device to the waveguides or transmission lines. The alignment of the active device structure to the panel could be provided by the bonding equipment and could be assisted by adapting the electronic alignment techniques presented in PCT/US2018/52332 in reference to at least its FIG. 1C-FIG. 3B and related specification portions. An example for use of panels for integrating multiple ICs is presented in a paper by Lau, John et al. (2018). Design, Materials, Process, Fabrication, and Reliability of Fan-Out Wafer-Level Packaging. IEEE Transactions on Components, Packaging and Manufacturing Technology. PP. 1-12. 10.1109/TCPMT.2018.2814595, incorporated herein by reference.

The large panels could be processed to also support liquid cooling. The liquid cooling concept presented herein in reference to FIG. 40A-40B could be adapted for the large panels.

FIG. 41E illustrates prior-art 3D heterogeneous integration in which an end device is constructed by connecting multiple dies of different sizes using 3D integration techniques. This concept could be extended in respect to the ultra-scale fabrics presented in here. So an array of cores such as is presented in respect to FIG. 38A-40B herein, could be used as a generic fabric which on top of it additional functional units could be added. These additional functions could include overlaying up to full wafer size containing the desired additional functional units or be smaller sized and placed on top such as, for example, die #1, die #5 of FIG. 41F. These add-ons could be functional sub-devices performing logic dedicated logic functions such as, for example, specific acceleration units or programmable logic units, or other functions such as, for example, data acquisition, sensors, I/O and so forth. Such could be used to customize a generic ultra-scale fabric for a specific function. Techniques presented in U.S. Pat. No. 9,721,927, incorporated herein by reference, could be used for such integration.

The waveguides/transmission lines interconnect fabric could be arranged so to follow a hierarchy; for example, such as presented in reference to FIG. 33B herein. The connections for within reticle distance (less than about 30 mm long on wafer) could be done with narrower or thinner lines than those which span across a few reticles (about 20-60 mm long) which could be narrower or thinner than those designated for multiple reticles (about 100-300 mm long). This hierarchy could include more than one level and more than one process. The heterogeneous integration concept could be extended to the interconnection fabric. Such could be engineered to provide a better fit for the use as losses at shorter distance but higher connection could be tolerated in order to gain higher connection density. Many mix and match options exist for the system engineers to choose and fit the technology to the application objectives.

For electromagnetic waves at frequencies over about 100 GHz, sub-THz and THz region the preferred transmission lines becomes a dielectric interconnect channel. This could resemble the optical wave guides including the option to dice without pre-etching step. These type interconnect channel could be used in any of the techniques presented herein such as part of wafer transfer or device to panel level integration. Such sub-THz interconnection channel has been presented; for example, in papers by Yu, Bo, et al. "Sub-THz interconnect channel for planar chip-to-chip communication." *Electromagnetic Compatibility (EMC), 2016 IEEE International Symposium on.* IEEE, 2016; and Yu, Bo, et al. "Ortho-Mode Sub-THz Interconnect Channel for Planar Chip-to-Chip Communications." *IEEE Transactions on Microwave Theory and Techniques* 66.4 (2018): 1864-1873; and Yu, Bo, et al. "High-efficiency micromachined sub-THz channels for low-cost interconnect for planar integrated circuits." *IEEE Transactions on Microwave Theory and Techniques* 64.1 (2016): 96-105; by Myers, Joshua C., et al. "Investigation of modulation-capable silicon waveguides for efficient on-wafer terahertz interconnects." *Electronic Components and Technology Conference (ECTC), 2015 IEEE 65th.* IEEE, 2015; by Kaur, Amanpreet, et al. "Affordable terahertz components using 3D printing." *Electronic Components and Technology Conference (ECTC), 2015 IEEE 65th.* IEEE, 2015; by Yang, Xianbo, and Pemject Prem Chahal. "On-wafer terahertz ribbon waveguides using polymer-ceramic nanocomposites." *IEEE Transactions on Components, Packaging and Manufacturing Technology* 5.2 (2015): 245-255; by Yeh, Cavour, Fred Shimabukuro, and Peter H. Siegel. "Low-loss terahertz ribbon waveguides." *Applied optics* 44.28 (2005): 5937-5946; and by Banan, Behnam. *A Novel Electrical-Optical Interconnect.* Diss. McGill University, 2016, all of the forgoing in this paragraph are incorporated herein by reference, The design of the transmission line could take into account the losses of the line structure as the (target) transmission distance changes. It is common in the industry to use special substrates for RF applications, for example, such as RF-SOI. These substrates utilize high resistivity silicon to reduce the substrate related losses for better circuit performance. Recent work suggests further reduction of substrate related losses could be achieved by use of a carrier lifetime modulating process step, for example, such as an anodizing etch forming porous silicon to lower transmission losses, and then oxidizing the porous silicon to gain an even further reduction; such as presented in a paper by Sarafis, Panagiotis, and Androula G. Nassiopoulou. "Porous Si as a substrate for the monolithic integration of RF and millimeter-wave passive devices (transmission lines, inductors, filters, and antennas): Current state-of-art and perspectives." *Applied Physics Reviews* 4.3 (2017): 031102; by Issa, Hamza, et al. "On-chip high-performance millimeter-wave transmission lines on locally grown porous silicon areas." *IEEE Transactions on Electron Devices* 58.11 (2011): 3720-3724; and by Gautier, G., and P. Leduc. "Porous silicon for electrical isolation in radio frequency devices: A review." *Applied Physics Reviews* 1.1 (2014): 011101; all are incorporated herein by reference.

With 3D integration, such as, by using layer transfer, there are additional options to reduce the substrate effects on the transmission lines. FIG. 42A illustrates an X-Z side cut 4200 of a donor RF wafer. The substrate 4202 includes a "cut layer" 4204 (such as a porous layer, oxide layer, SiGe layer or other type of 'cut layer' presented herein or in the incorporated by reference work). Active elements such as transistors 4208 could be formed leaving some area of unused silicon 4206.

FIG. 42B illustrates an optional step of unused silicon removal and filling and covering with oxide layer 4210.

FIG. 42C illustrates the structure after adding vertical connections 4216, 4218 to the active elements adding layers of local circuits (not shown) and isolations 4212, and horizontal transmission lines 4214. If desired, those vertical connections and horizontal transmission lines may be multiple layers (not drawn).

FIG. 42D illustrates the structure after deposition of a thick high resistivity layer 4220 such as oxide and through vias 4219 to connect to other layers in the 3DIC device or system stack. The thick high resistivity layer 4220 thickness could be 2-6 µm, less than 10 µm or even more than 15 µm.

FIG. 42E illustrates the structure being flipped 4226 and bonded over 3D acceptor wafer, which may include substrate 4222 and multi-levels of logic memory and so forth 4224, as described herein and in the incorporated by reference specifications and drawings. As FIG. 42E illustrates, the high resistivity layer 4220 helps reduce the effect of the acceptor wafer active layers 4224 on the transmission lines 4214.

FIG. 42F illustrates the structure after removal of the donor wafer substrate 4202 using the cut layer 4204 and cleaning off any residue, thus making the structure 4228 ready for any following processing steps.

Additional alternative is to add level utilizing die to wafer bonding such as detailed in U.S. Pat. No. 9,721,927 incorporated herein by reference. Such could be utilized for incorporating a mix technology such as transferring a level from a 200 mm wafer on to 300 mm wafer. The transfer device could be a reticle size or other size or shape (5×5 mm$^2$, 10×10 mm$^2$, 20×20 mm$^2$ 40×40 mm$^2$, 100×100 mm$^2$ or not even rectangular shape, such as hexagon shapes). Additional motivation could be to use 'Known-Good-Die' in consideration for yield. The mixed wafer size could be useful for optic based X-Y interconnect as those could utilize non-silicon wafers known to be preferred for optical element such as laser and better available on smaller diameter wafer such as 200 mm (8") or 150 mm (6") wafer. FIG. 43A illustrates a top 4300 (X-Y) view of a target 3D fabric which could include logic levels memory level and even X-Y connectivity level (waveguides/transmission lines), as presented in reference to FIG. 37B. FIG. 43B illustrates the target 3D structure after a transfer of a unit such as die or reticle size 4304 transferred from a donor wafer. FIG. 43C illustrates the structure after tiling 6 transferred units. The tiling process could fill up to a full level or not.

Such mixed 3D integration could be done at the wafer level or even at the panel level wherein on a top section some of the sections transferred could be of different sizes. The process could include a step of filling with smoothing material such as oxide and CMP preparing the upper surface for the following level/layer transfer. Such could include a step to support the connectivity pins for the vertical connectivity. FIG. 43D illustrates a side cut-view 4310 (X-Z) of a 3D structure 4301, 4302 over which units 4314, 4316 have been transferred. The transferred units could be transferred over the 3D structure to tile it over or to have space in between or even being of different size and functionality, as could be engineered by an artisan in the art. Isolation 4312 could be deposited over and top level planarization using processes such as CMP, could be used to prepare the structure for following steps. Additional levels such as full X-Y interconnects 4318 could be transferred over. FIG. 43D illustrates a heterogeneous integration 3D system which could include various types of active material and interconnect sourced from multiple fab and process lines with levels of logic, memory, RF circuits and other types of semiconductors. These levels could be full wafer sized, sub-wafer size tiles, reticles size tiles, or even larger than wafer size such as interconnect panel, as could be engineered by artisan in the art.

FIG. 43E is an X-Z 4310 cut view of heterogynous 3D system such as in FIG. 43D with the additional fluid based heat removal discussed in reference to FIG. 40A-40B. The base silicon 4301 could have been first processed to form fluid pipes 4316 for system heat removal. These fluid pipes could be formed at any time later. And could include inlets and outlets 4312, 4314 for the external cooling apparatus. The 3D system 4302 could comprise many levels, such as logic memory, memory control circuits, analog circuits, power circuits, interconnect circuits such as RF or optics related, I/O such as wired or wireless, and sensors. These level could be made to be very thin such as about 5 nm, 10 nm, less than 50 nm, less than 100 nm, less than 400 nm, less than 1,000 nm, less than 2 micron, less than 6 micron, less than 10 micron, less than 20 micron or even thicker. The thinning of these level could use cut layer such as been presented in respect to FIG. 1A-FIG. 6D, FIG. 20A-21H, FIG. 30-FIG. 31, FIG. 36A-42F. These 'cut layers' could be based on SiGe, silicon oxide, porous layers, or other material as has been presented. The memory stacking architecture could utilize concept as presented in reference to FIG. 21A to FIG. 25J. The memory levels could include high speed memories such as SRAM, floating-body base memory (Zeno) Floating-body combined with non-volatile cell, Tristor base memory (T-RAM), DRAM, medium speed memory such as NOR flash, R-RAM, M-RAM, PCM, SCM, and high density memories such as 3D NAND and 3D NOR. The 3D system could include heat removal features to connect the internal heat generating circuits to the cooling elements such as the fuel cooling 4316, 2472 or air cooling such external heat-sink. It could also include heat isolating layer 1157, 2426, 3226. The 3D system could include X-Y connectivity structures as presented in reference to FIG. 33A-33B, FIG. 35A-FIG. 40B, and FIG. 42A-43E. The 3D system could also have a similar size to commercial semiconductors dies or a much larger area such as multi-reticle size (>40×40 mm$^2$), sub-wafer size (>100×100 mm$^2$), full wafer size, or even panel size (>300×300 mm$^2$).

It will also be appreciated by persons of ordinary skill in the art that the invention is not limited to what has been particularly shown and described hereinabove. For example, the use of SiGe as the designated sacrificial layer or etch stop layer could be replaced by compatible material or combination of other material including additive materials to SiGe like carbon or various doping materials such as boron or other variations. And for example, drawings or illustrations may not show n or p wells for clarity in illustration. Further, any transferred layer or donor substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus, the invention is to be limited only by appended claims.

We claim:

1. A 3D semiconductor device, the device comprising:
    a first level; and
    a second level,
        wherein said first level comprises single crystal silicon and a plurality of logic circuits,
        wherein said plurality of logic circuits each comprise first transistors,
        wherein said first transistors each comprise a transistor channel, said transistor channel comprises a portion of said single crystal silicon,
        wherein said second level is disposed above said first level and comprises a plurality of arrays of memory cells,
        wherein said single crystal silicon comprises an area, and
        wherein said area is greater than 1,000 mm$^2$; and
    a thermal isolation layer disposed between said first level and said second level,
        wherein said thermal isolation layer provides a greater than 20° C. differential temperature between said first level and said second level during nominal operation of said device.

2. The 3D device according to claim 1,
    wherein said single crystal silicon comprises channels adapted for fluid cooling.

3. The 3D device according to claim 1, further comprising:
    a third level,
        wherein said third level comprises a plurality of RF circuits.

4. The 3D device according to claim 1,
    wherein said first level is bonded to said second level with hybrid bonding.

5. The 3D device according to claim 1,
    wherein said memory cells comprise Dynamic Random Access Memory ("DRAM") cells.

6. The 3D device according to claim 1,
    wherein said memory cells comprise non-volatile memory cells.

7. The 3D device according to claim 1, wherein said device comprises a plurality of transmission lines.

8. A 3D semiconductor device, the device comprising:
    a first level; and
    a second level,
        wherein said first level comprises single crystal silicon and a plurality of logic circuits,
        wherein said plurality of logic circuits each comprise first transistors,
        wherein said first transistors each comprise a transistor channel, said transistor channel comprises a portion of said single crystal silicon,
        wherein said second level is disposed above said first level and comprises a plurality of RF circuits,
        wherein said single crystal silicon comprises an area, and
        wherein said area is greater than 1,000 mm$^2$; and
    a thermal isolation layer disposed between said first level and said second level,
        wherein said thermal isolation layer provides a greater than 20° C. differential temperature between said first level and said second level during nominal operation of said device.

9. The 3D device according to claim 8,
    wherein said single crystal silicon comprises channels adapted for fluid cooling.

10. The 3D device according to claim 8, further comprising:
    a third level,
        wherein said third level comprises at least one array of memory cells.

11. The 3D device according to claim 8,
    wherein said first level is bonded to said second level with hybrid bonding.

12. The 3D device according to claim 8, wherein said device comprises a plurality of transmission lines.

13. The 3D device according to claim 8, wherein said device comprises at least one antenna designed for wireless communication.

14. A 3D semiconductor device, the device comprising:

a first level; and a second level, wherein said first level comprises single crystal silicon and a plurality of logic circuits, wherein said plurality of logic circuits each comprise first transistors, wherein said first transistors each comprise a transistor channel, said transistor channel comprises a portion of said single crystal silicon, wherein said second level is disposed above said first level and comprises a plurality of transistors, wherein said single crystal silicon comprises channels adapted for fluid cooling, wherein said single crystal silicon comprises an area, and wherein said area is greater than 1,000 mm$^2$; and a thermal isolation layer disposed between said first level and said second level, wherein said thermal isolation layer provides a greater than 20° C. differential temperature between said first level and said second level during nominal operation of said device.

15. The 3D device according to claim 14, wherein said device comprises a plurality of RF circuits.

16. The 3D device according to claim 14, wherein said first level is bonded to said second level with hybrid bonding.

17. The 3D device according to claim 14, wherein said device comprises Dynamic Random Access Memory ("DRAM") cells.

18. The 3D device according to claim 14, wherein said device comprises non-volatile memory cells.

19. The 3D device according to claim 14, wherein said device comprises a plurality of transmission lines.

* * * * *